(12) United States Patent
Moe et al.

(10) Patent No.: US 11,856,858 B2
(45) Date of Patent: Dec. 26, 2023

(54) METHODS OF FORMING DOPED CRYSTALLINE PIEZOELECTRIC THIN FILMS VIA MOCVD AND RELATED DOPED CRYSTALLINE PIEZOELECTRIC THIN FILMS

(71) Applicant: Akoustis, Inc., Huntersville, NC (US)

(72) Inventors: Craig Moe, Penfield, NY (US); Jeffrey M. Leathersich, Rochester, NY (US); Arthur E. Geiss, Greensboro, NC (US)

(73) Assignee: Akoustis, Inc., Huntersville, NC (US)

(*) Notice: Subject to any disclaimer, the term of this patent is extended or adjusted under 35 U.S.C. 154(b) by 840 days.

(21) Appl. No.: 16/530,425

(22) Filed: Aug. 2, 2019

(65) Prior Publication Data

US 2020/0111949 A1 Apr. 9, 2020

Related U.S. Application Data

(63) Continuation-in-part of application No. 16/513,143, filed on Jul. 16, 2019, now Pat. No. 11,411,168, (Continued)

(51) Int. Cl.
*H10N 30/076* (2023.01)
*C23C 14/02* (2006.01)
(Continued)

(52) U.S. Cl.
CPC ........... *H10N 30/076* (2023.02); *C23C 14/02* (2013.01); *C23C 14/0617* (2013.01); (Continued)

(58) Field of Classification Search
CPC ..... C23C 14/02; C23C 14/0617; C23C 14/34; C23C 16/34; C23C 16/45523;
(Continued)

(56) References Cited

U.S. PATENT DOCUMENTS 5,231,327 A 7/1993 Ketcham
5,894,647 A 4/1999 Lakin
(Continued)

FOREIGN PATENT DOCUMENTS

JP 2009100197 A 5/2009
JP 2010068109 A 3/2010
(Continued)

OTHER PUBLICATIONS

Notification Concerning Transmittal of International Preliminary Report on Patentability for PCT/US2020/040648, dated Nov. 25, 2021, 12 pages.
(Continued)

*Primary Examiner* — Ahmed N Sefer
(74) *Attorney, Agent, or Firm* — Stanek Lemon Crouse & Meeks, P.A.

(57) ABSTRACT

A method of forming a piezoelectric film can include providing a wafer in a CVD reaction chamber and forming an aluminum nitride material on the wafer, the aluminum nitride material doped with a first element E1 selected from group IIA or from group IIB and doped with a second element E2 selected from group IVB to provide the aluminum nitride material comprising a crystallinity of less than about 1.5 degree at Full Width Half Maximum (FWHM) to about 10 arcseconds at FWHM measured using X-ray diffraction (XRD).

14 Claims, 65 Drawing Sheets

Related U.S. Application Data which is a continuation-in-part of application No. 15/784,919, filed on Oct. 16, 2017, now Pat. No. 10,355,659.

(60) Provisional application No. 62/846,558, filed on May 10, 2019.

(51) Int. Cl.
    *H03H 3/02*         (2006.01)
    *C23C 14/34*        (2006.01)
    *H01J 37/34*        (2006.01)
    *C23C 14/06*        (2006.01)
    *H10N 30/88*       (2023.01)
    *H10N 30/853*      (2023.01)
    *H03H 9/56*         (2006.01)
    *H03H 9/02*         (2006.01)

(52) U.S. Cl.
CPC .......... *C23C 14/34* (2013.01); *H01J 37/3426* (2013.01); *H03H 3/02* (2013.01); *H10N 30/853* (2023.02); *H10N 30/88* (2023.02); *H01J 2237/332* (2013.01); *H03H 9/02015* (2013.01); *H03H 9/562* (2013.01); *H03H 2003/023* (2013.01)

(58) Field of Classification Search
CPC ............ H01J 2237/332; H01J 37/3426; H01L 41/053; H01L 41/187; H01L 41/316; H03H 2003/023; H03H 3/02; H03H 9/02015; H03H 9/562
See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,583,690 B2 | 6/2003 | Lee et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,927,423 B2* | 8/2005 | Sawaki .................. | H01J 1/308 438/22 |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 8,440,259 B2 | 5/2013 | Chiang et al. | |
| 9,136,819 B2 | 9/2015 | Grannen et al. | |
| 10,110,190 B2* | 10/2018 | Vetury ............... | H03H 9/02118 |
| 10,187,036 B2 | 1/2019 | Yokoyama et al. | |
| 10,797,681 B1 | 10/2020 | Hurwitz et al. | |
| 2003/0039866 A1 | 2/2003 | Mitamura | |
| 2005/0057324 A1* | 3/2005 | Onishi ............... | H03H 9/02118 333/191 |
| 2005/0093397 A1 | 5/2005 | Yamada et al. | |
| 2005/0140246 A1 | 6/2005 | Wang et al. | |
| 2005/0255234 A1 | 11/2005 | Kanda et al. | |
| 2006/0214539 A1 | 9/2006 | Sato | |
| 2007/0080611 A1 | 4/2007 | Yamada | |
| 2008/0284541 A1 | 11/2008 | Chitnis | |
| 2009/0033177 A1 | 2/2009 | Itaya et al. | |
| 2009/0102319 A1 | 4/2009 | Nakatsuka | |
| 2009/0200471 A1* | 8/2009 | Kawakubo ................ | G01J 5/40 250/338.3 |
| 2009/0246385 A1* | 10/2009 | Felmetsger ......... | C23C 14/0617 204/192.18 |
| 2010/0148637 A1 | 6/2010 | Satou | |
| 2010/0301371 A1 | 12/2010 | Yokoyama et al. | |
| 2010/0301379 A1 | 12/2010 | Yokoyama et al. | |
| 2011/0114968 A1 | 5/2011 | Sheppard et al. | |
| 2011/0137184 A1 | 6/2011 | Ren et al. | |
| 2012/0287575 A1 | 11/2012 | Nelson | |
| 2013/0111719 A1 | 5/2013 | Deguet | |
| 2013/0140525 A1 | 6/2013 | Chen et al. | |
| 2013/0209685 A1 | 8/2013 | Ku et al. | |
| 2013/0241673 A1* | 9/2013 | Yokoyama ......... | H03H 9/02015 333/195 |
| 2014/0246305 A1 | 9/2014 | Larson, III | |
| 2014/0318443 A1 | 10/2014 | Fenwick et al. | |
| 2014/0327013 A1* | 11/2014 | Schenk ............. | H01L 21/02458 117/90 |
| 2015/0357555 A1* | 12/2015 | Umeda ................ | H10N 30/076 204/192.18 |
| 2015/0381144 A1 | 12/2015 | Bradley | |
| 2016/0028367 A1 | 1/2016 | Shealy | |
| 2016/0036580 A1 | 2/2016 | Shealy | |
| 2016/0064645 A1 | 3/2016 | Teshigahara | |
| 2016/0203972 A1 | 7/2016 | Sundaram et al. | |
| 2016/0218271 A1 | 7/2016 | Sakuma et al. | |
| 2017/0149405 A1 | 5/2017 | Kishimoto | |
| 2017/0288628 A1 | 10/2017 | Grannen | |
| 2017/0310299 A1 | 10/2017 | Bower et al. | |
| 2018/0026604 A1* | 1/2018 | Yokoyama ......... | H03H 9/02015 333/133 |
| 2018/0069168 A1 | 3/2018 | Ikeuchi et al. | |
| 2018/0123542 A1* | 5/2018 | Vetury .................. | H03H 9/564 |
| 2018/0323767 A1* | 11/2018 | Then ..................... | H03H 3/02 |
| 2018/0342999 A1 | 11/2018 | Gibb et al. | |
| 2019/0036511 A1 | 1/2019 | Choy et al. | |
| 2019/0199316 A1 | 6/2019 | Houlden et al. | |
| 2019/0214965 A1* | 7/2019 | Dasgupta ................ | H03H 3/02 |
| 2019/0305039 A1 | 10/2019 | Wang et al. | |
| 2019/0305753 A1* | 10/2019 | Shealy .................. | H03H 9/542 |

FOREIGN PATENT DOCUMENTS

| | | |
|---|---|---|
| WO | WO 2005034349 A1 | 4/2005 |
| WO | WO 2016122877 | 8/2016 |
| WO | WO 2017/095437 | 8/2017 |

OTHER PUBLICATIONS

International Search Report and Written Opinion, PCT/US2020/040648, dated Jul. 2, 2020; 13 pages.

Yokoyama et al; *Effect of Mg and Zr Co-Doping on Piezoelectric AlN Thin Films for bulk Acoustic Wave Resonaters*; IEEE Transactions on Ultrasonics, Ferroelectrics, and Frequency Control, vol. 61, No. 8; Aug. 2014; pp. 1322-1328.

Yokoyama et al; *Dopant Concentration Dependence of Electromechanical Coupling Coefficients of Co-doped AlN Thin Films for BAW Devices*; IEEE International Ultrasonics Symposium Proceedings; (2016); 4 pages.

Ligl, et al; *Metalorganic Chemical Vapor Phase Deposition of AlScN/GaN Heterostructures*; Journal of Applied Physics 127, 195704; May 18, 2020; pp. 1-12.

Leone et al. *Metal-Organic Chemical Vapor Deposition of Aluminum Scandium Nitride*; Physica Status Solidi (RRL)—Rapid Research Letters; vol. 14, Issue 1; Oct. 31, 2019; pp. 1-16.

Hardy et al; *Epitaxial ScAlN Grown by Molecular Beam Epitaxy on GaN and SiC Substrates*; Applied Physics Letter 110; 162104; (2017); 5 pages.

Hardy et al; *Epitaxial ScAlN Etch-Stop Layers Grown by Molecular Beam Epitaxy for Selective Etching of AlN and GaN*; IEEE Transactions on Semiconductor Manufacturing, vol. 30, No. 4; Nov. 2017; pp. 475-479.

(56) References Cited

OTHER PUBLICATIONS

International Search Report and Written Opinion, PCT/US2018/050521, dated Jan. 28, 2019.
International Search Report and Written Opinion, PCT/US2015/034560, dated Sep. 18, 2015.
Notification Concerning Transmittal of IPRP, PCT/US2020/045658, dated Feb. 24, 2022, 13 pgs.
International Search Report and Written Opinion, PCT/US2021/027678, dated Jul. 21, 2021, 11 pgs.
International Search Report and Written Opinion, PCT/US2020/040648, dated Sep. 25, 2020; 13 pages.
International Search Report and Written Opinion, PCT/US2020/045658, dated Oct. 6, 2020, 14 pgs.

* cited by examiner

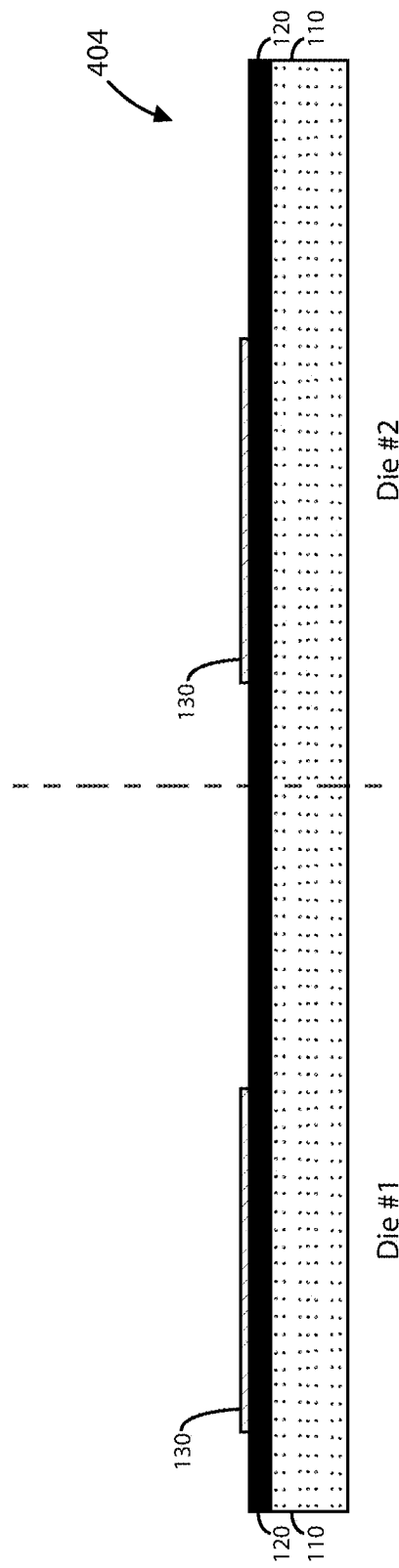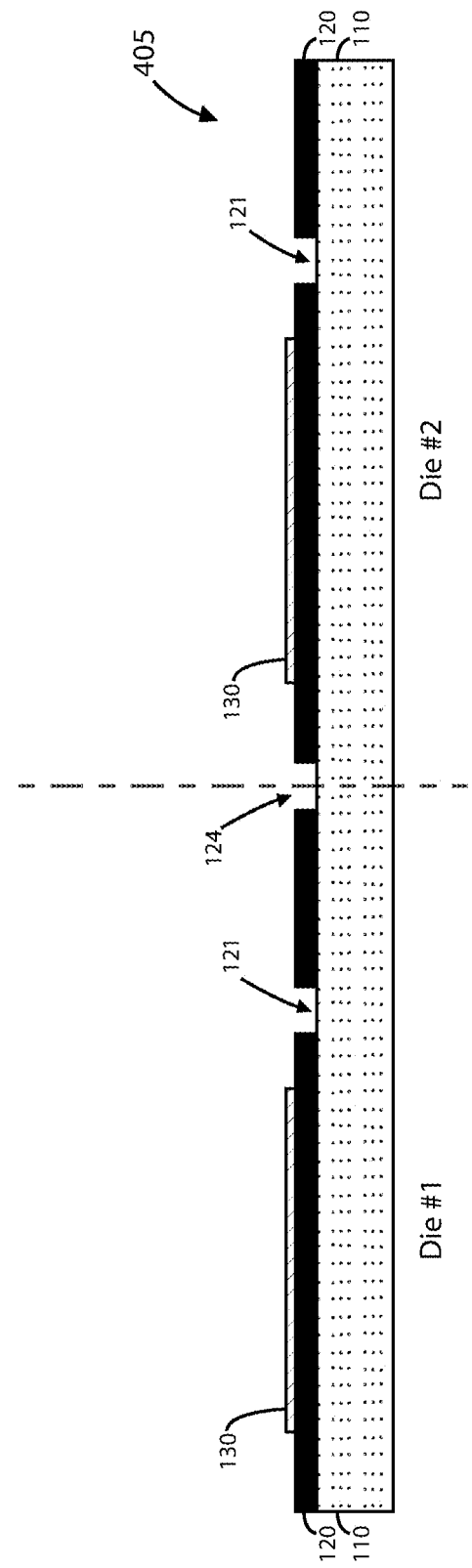

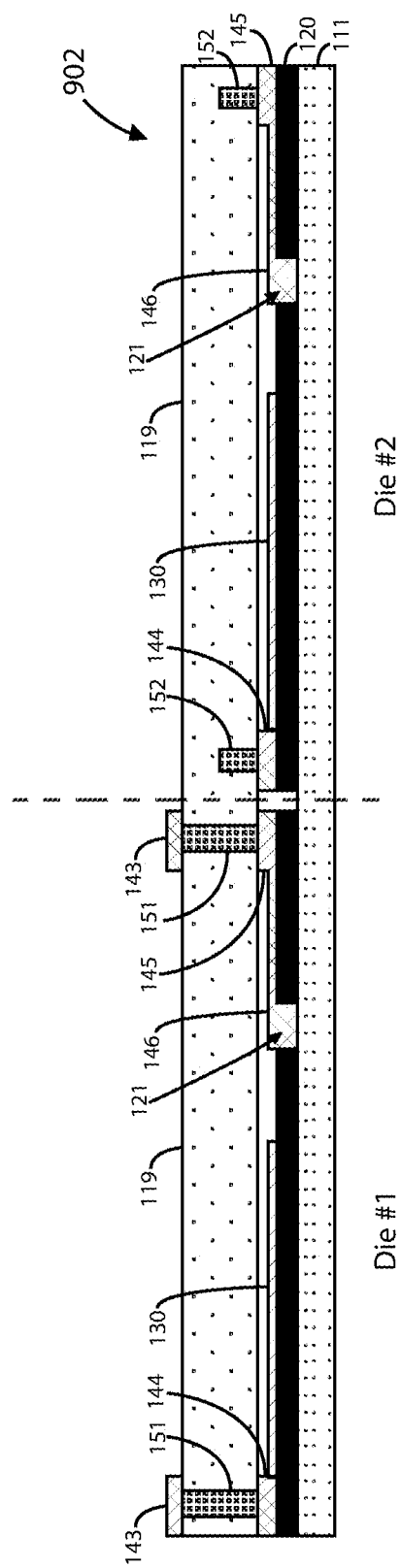
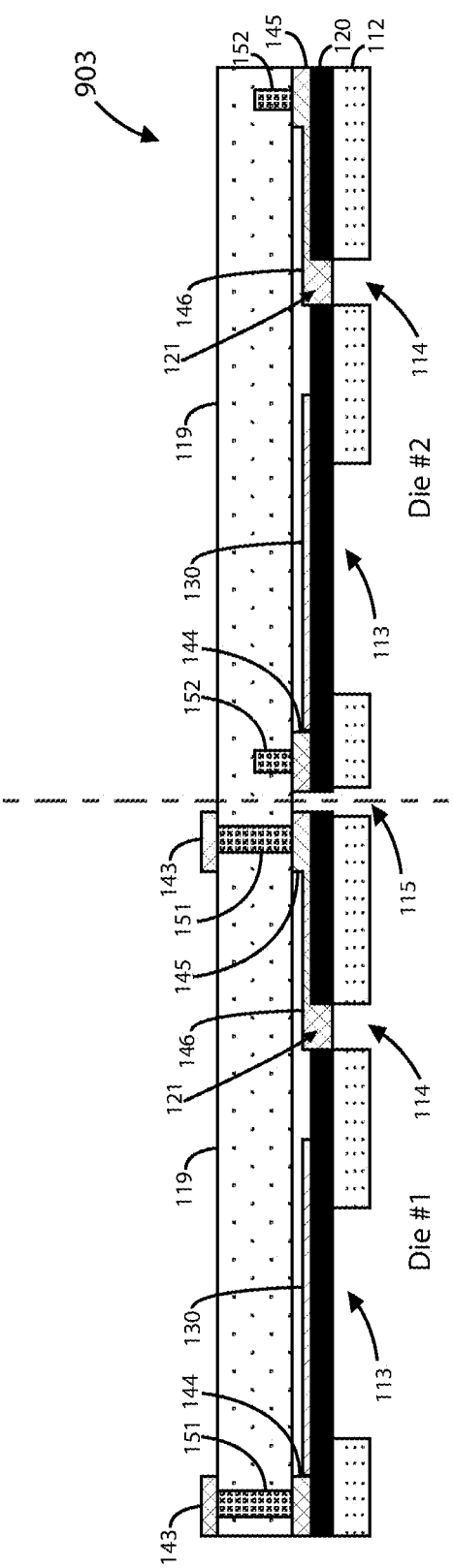
FIG. 9B
FIG. 9C

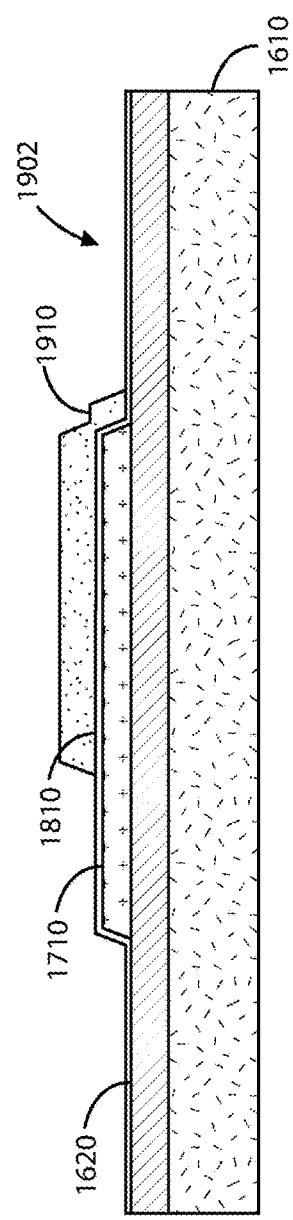
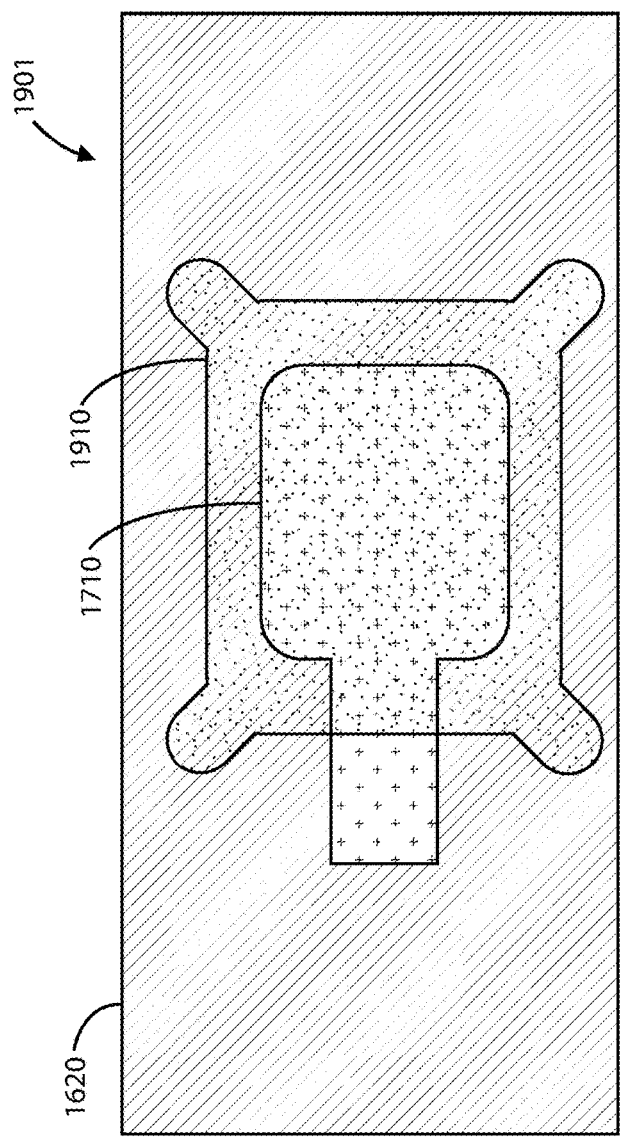
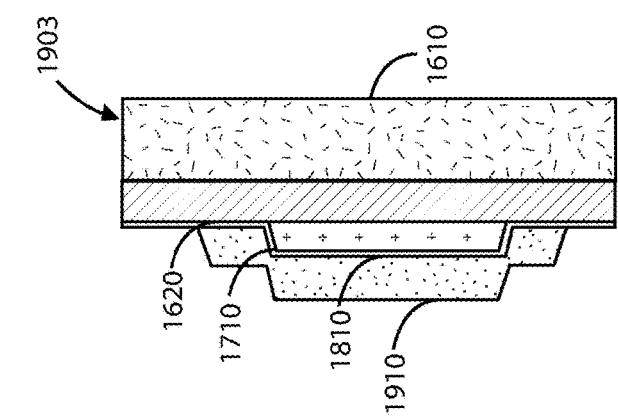
FIG. 19A
FIG. 19B
FIG. 19C

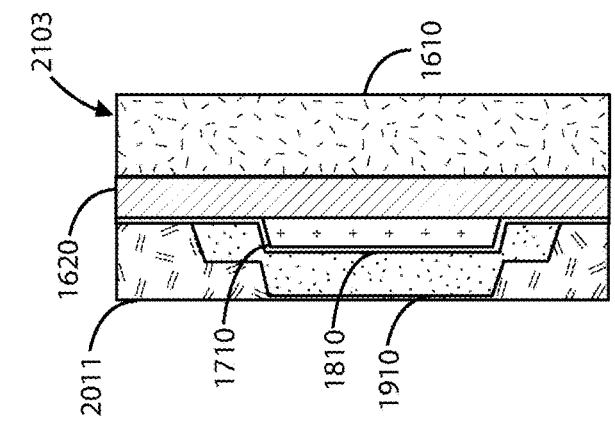
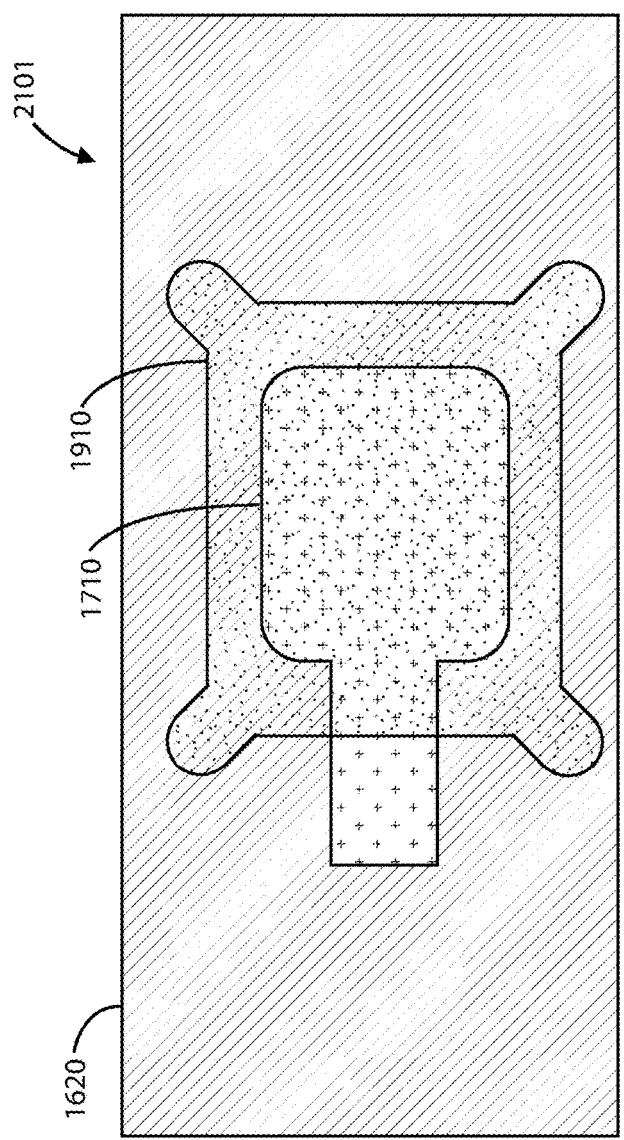
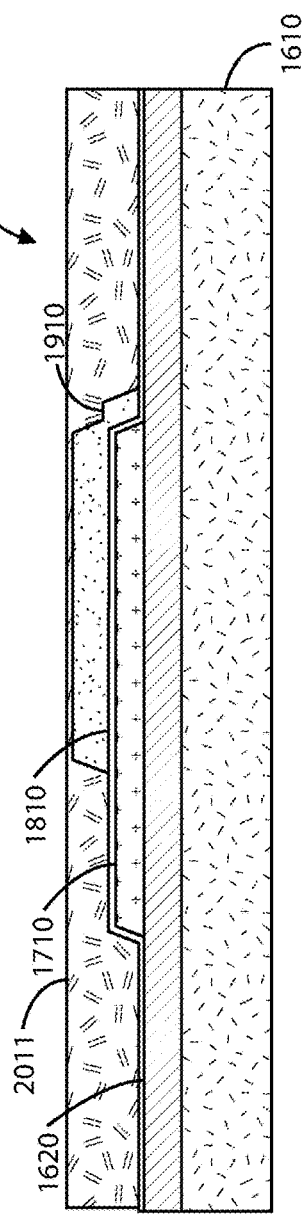
FIG. 21C
FIG. 21A
FIG. 21B

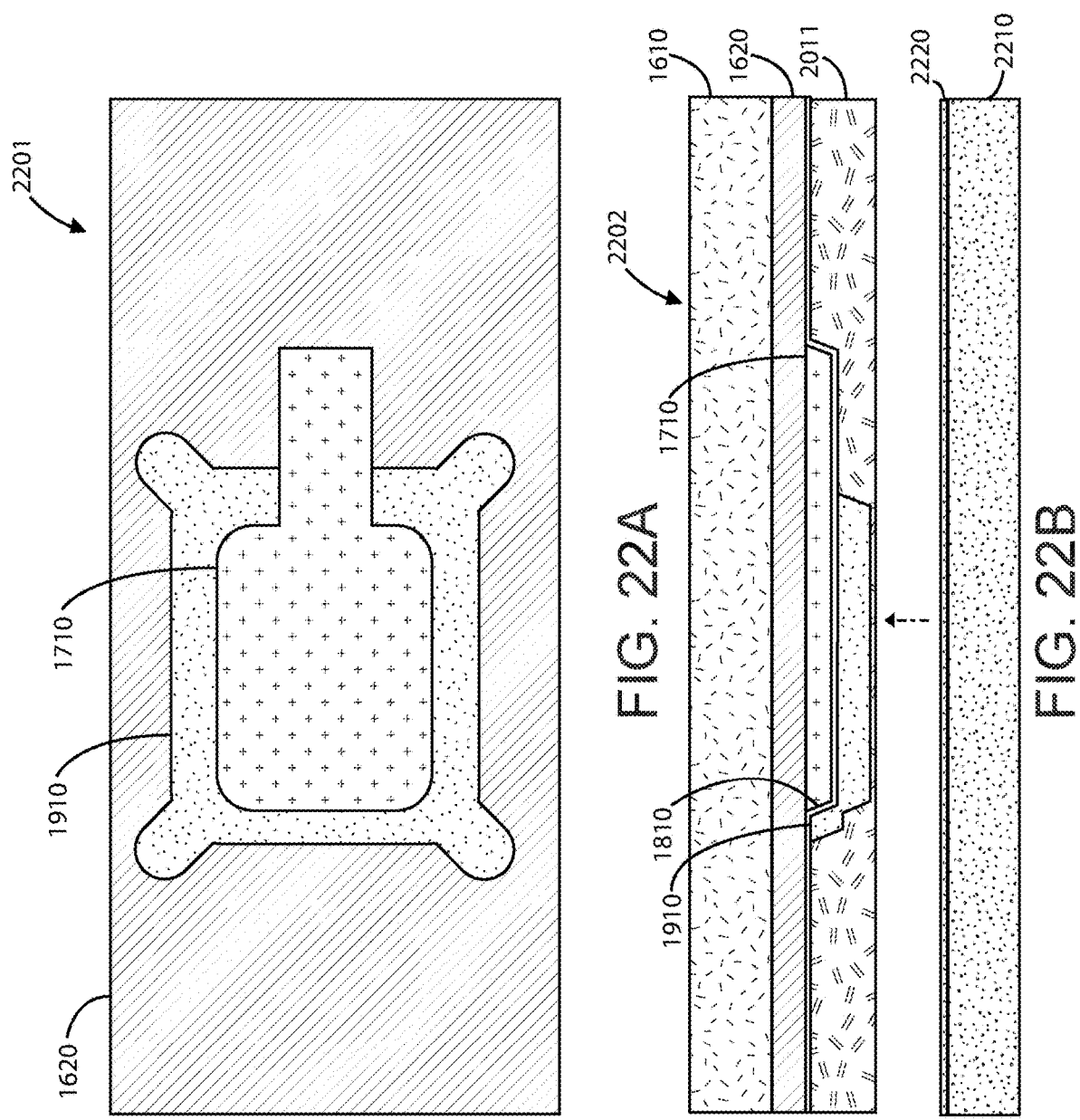

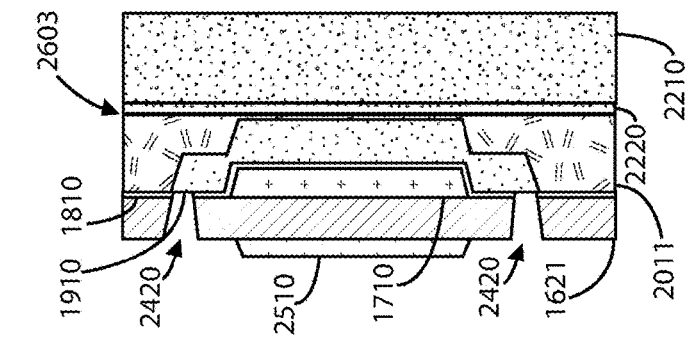
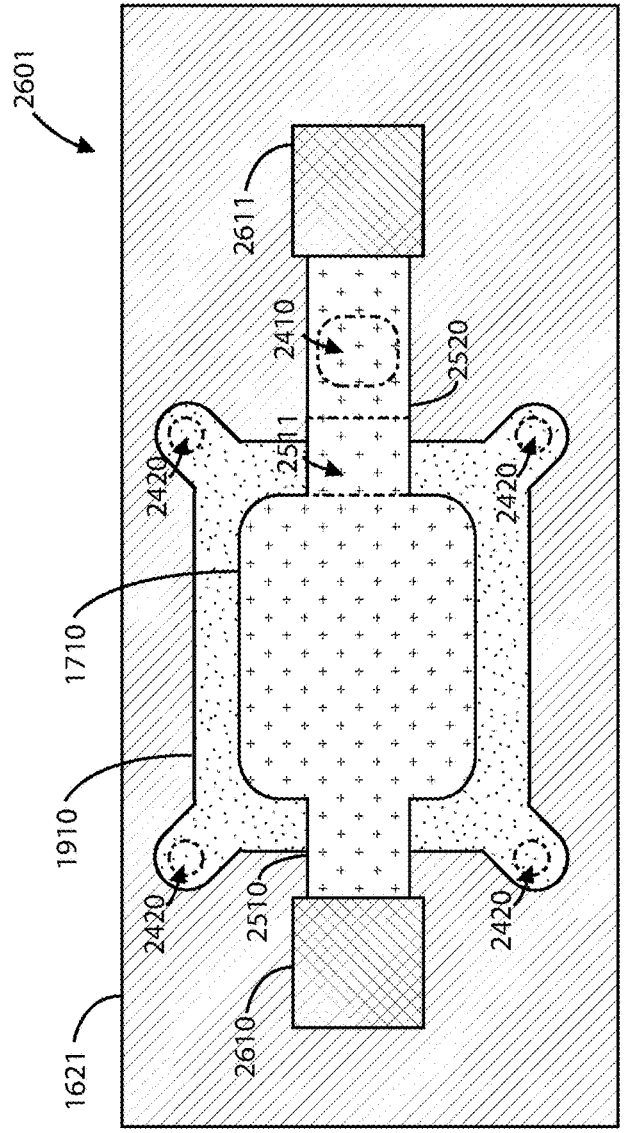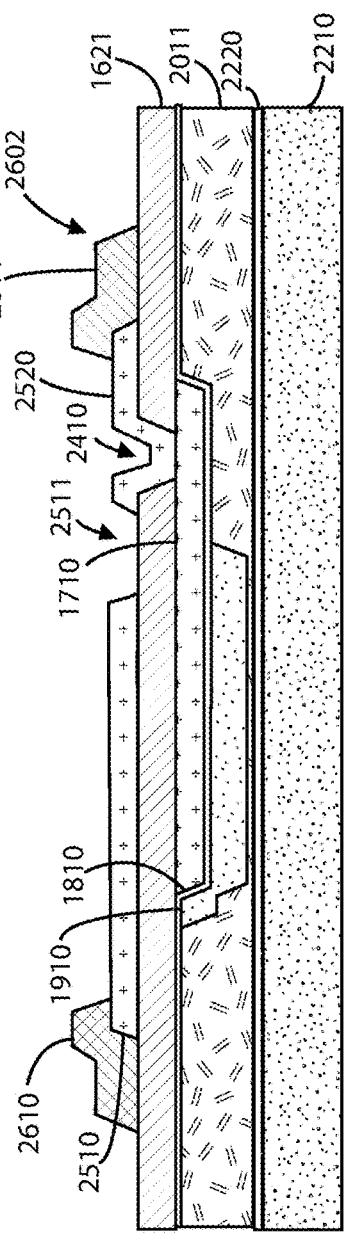

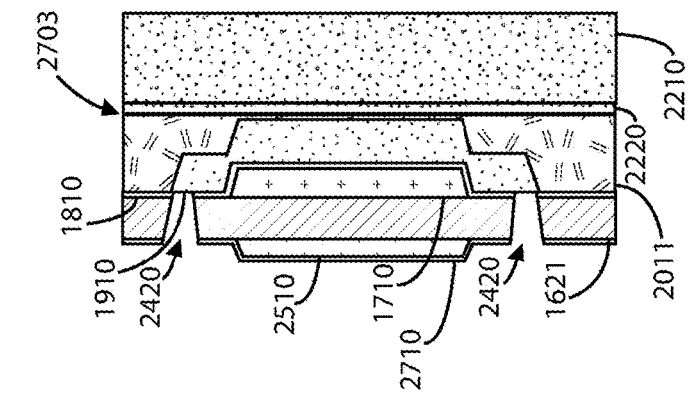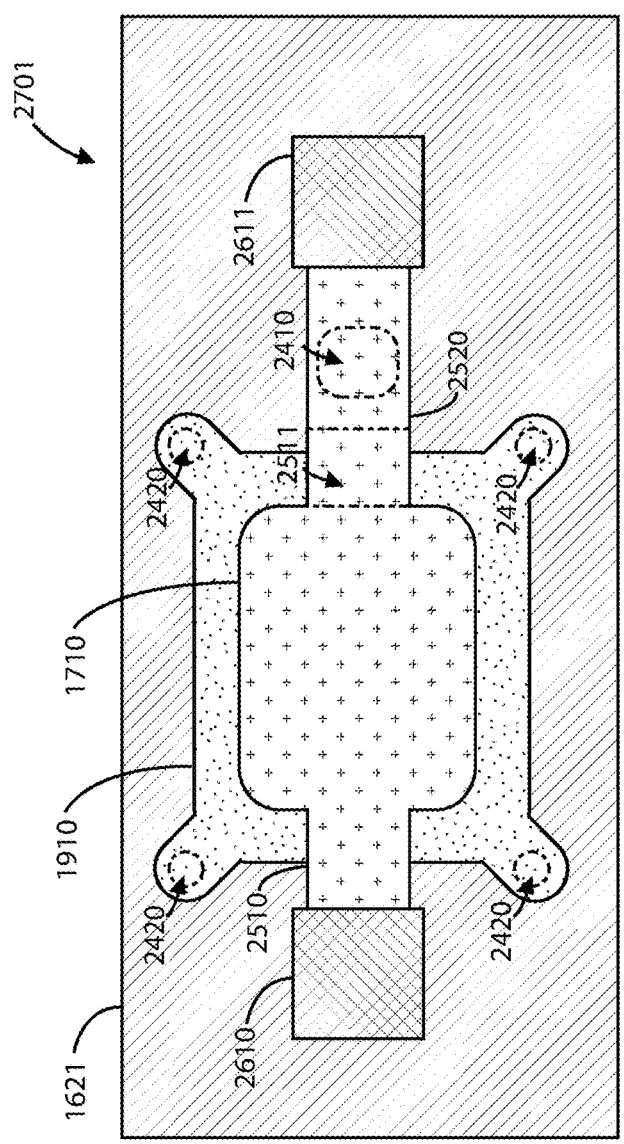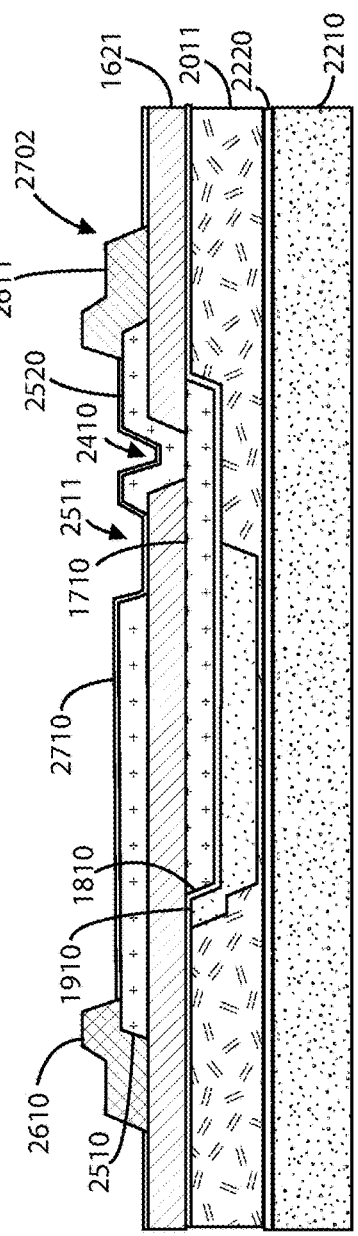

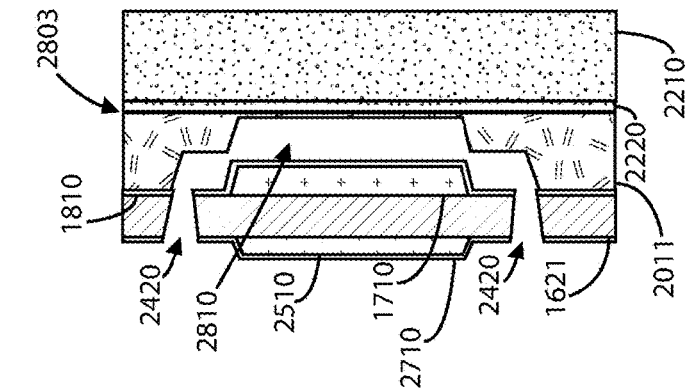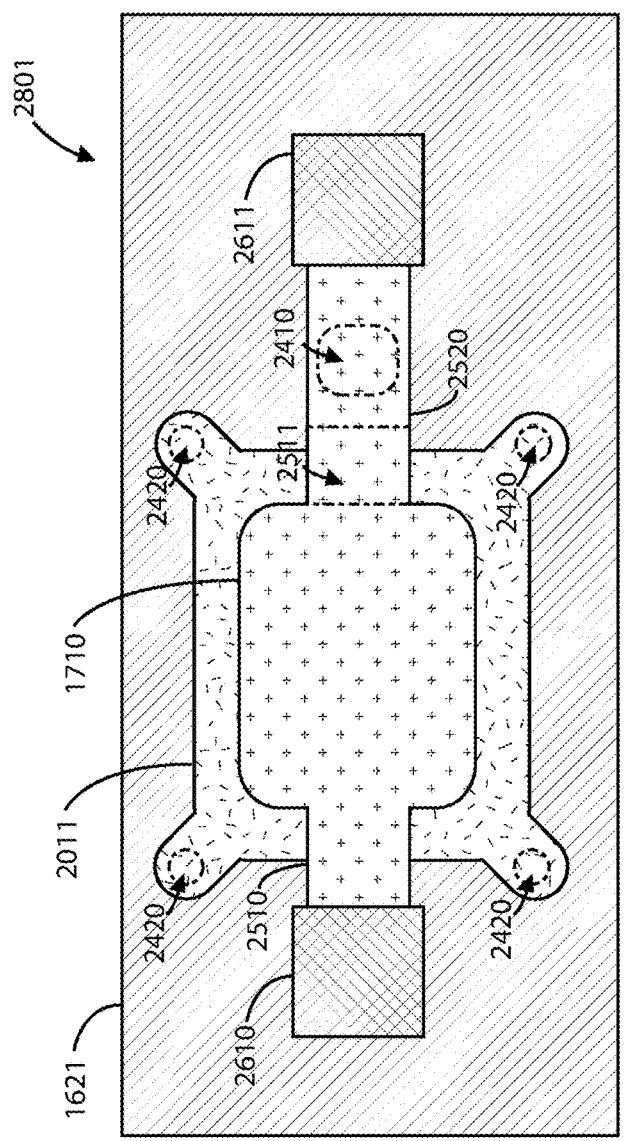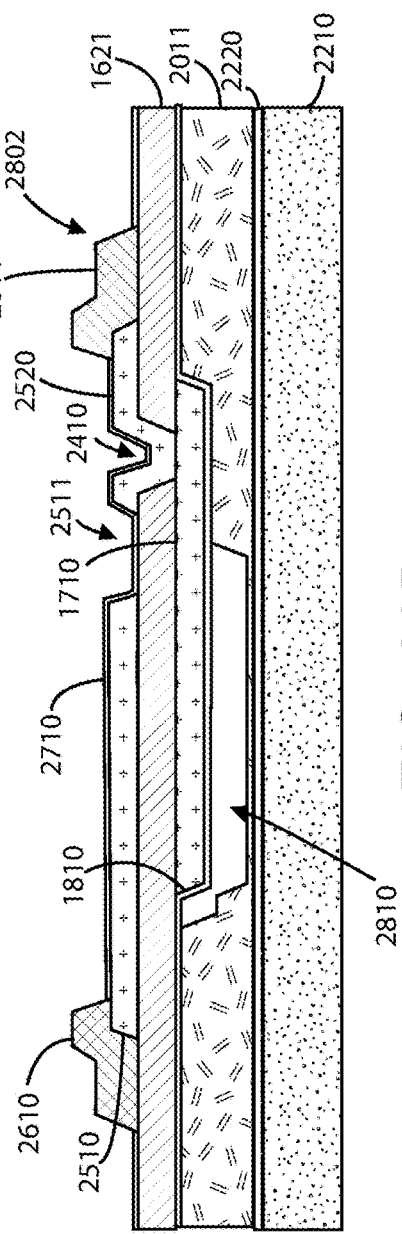

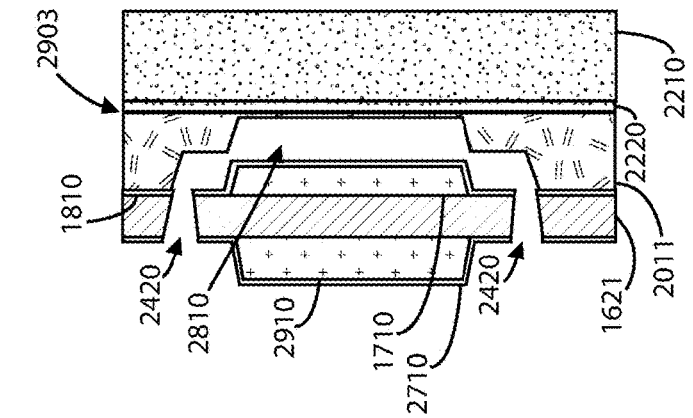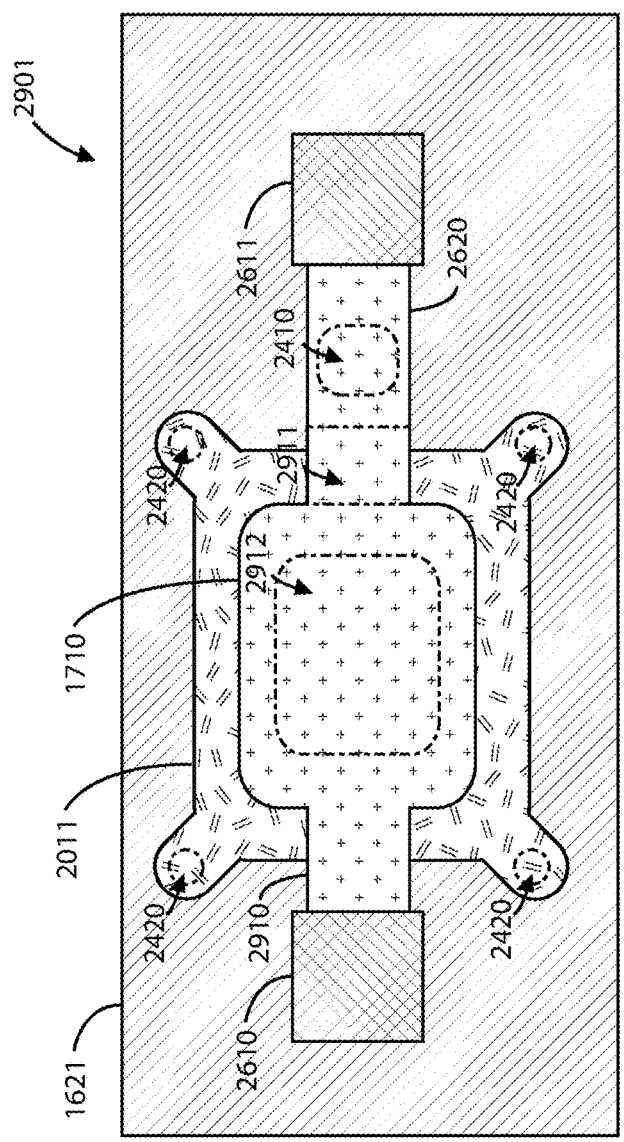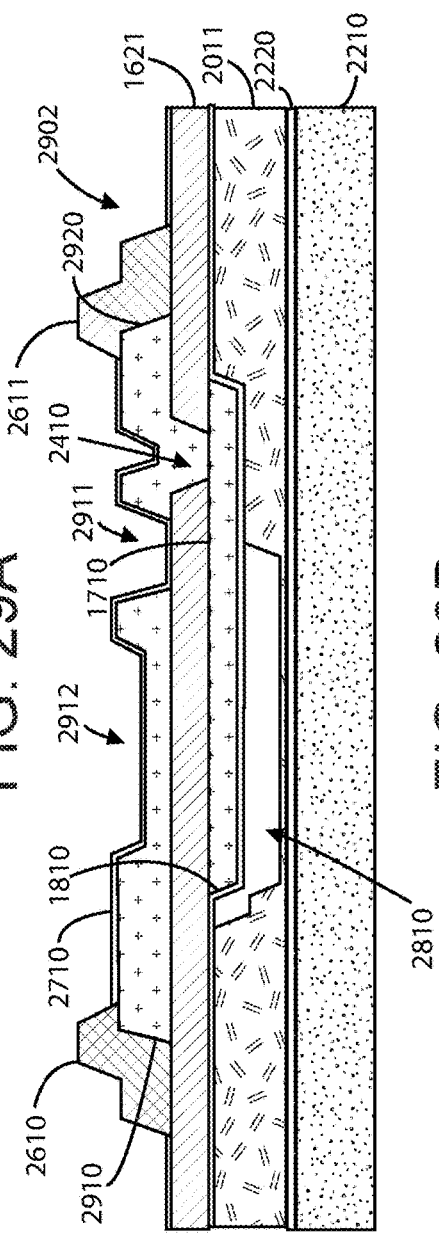

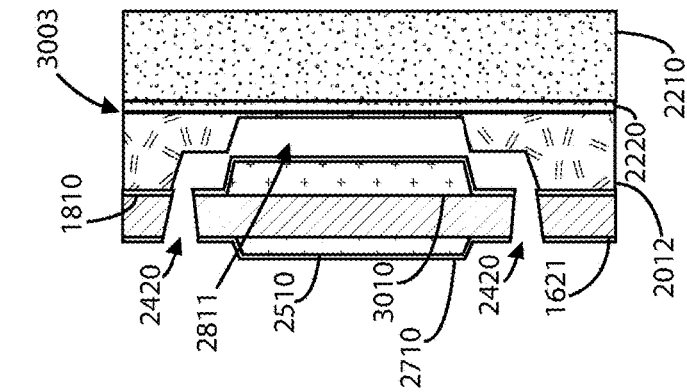
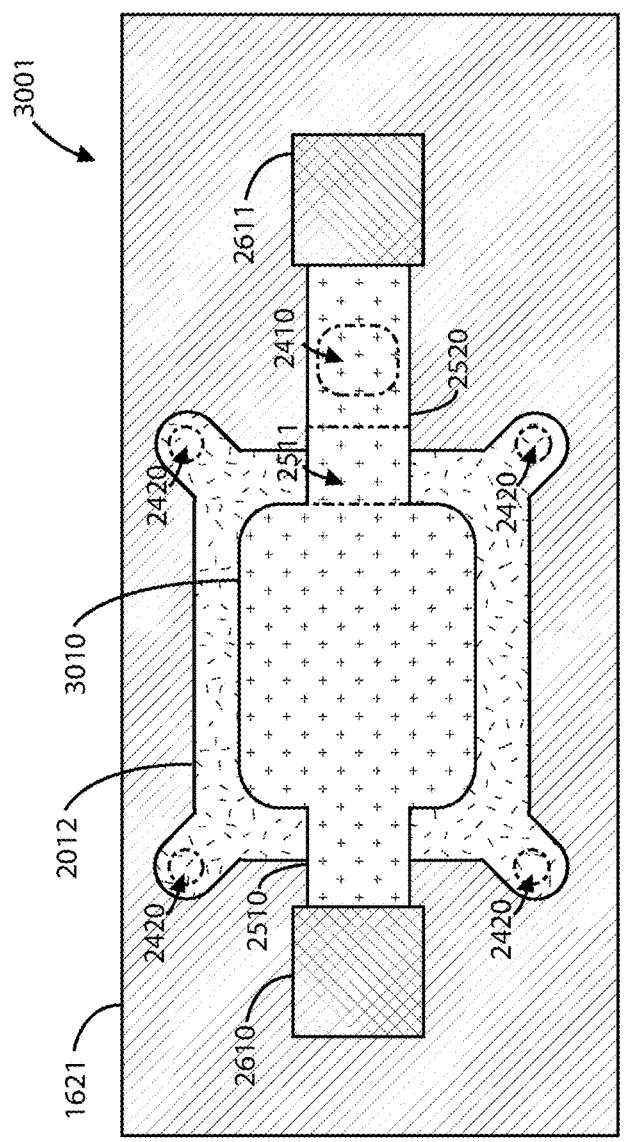
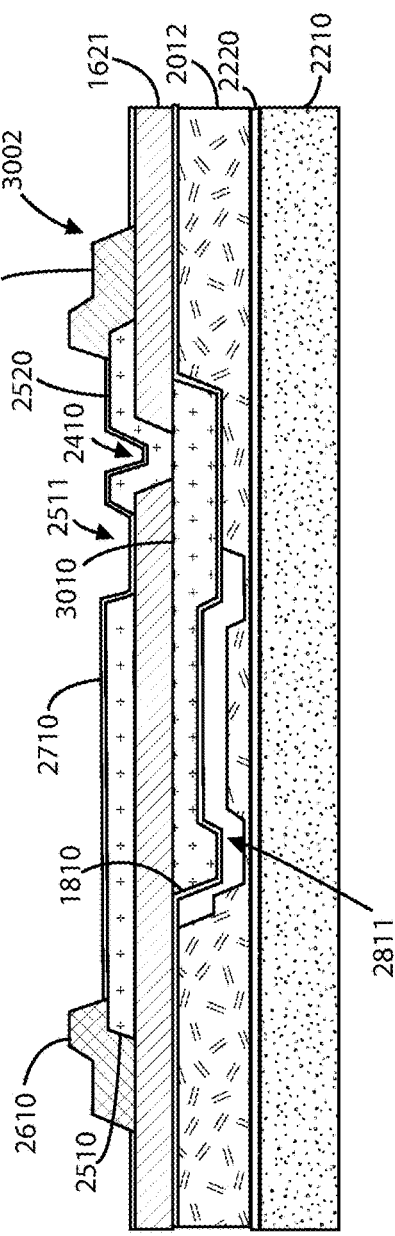

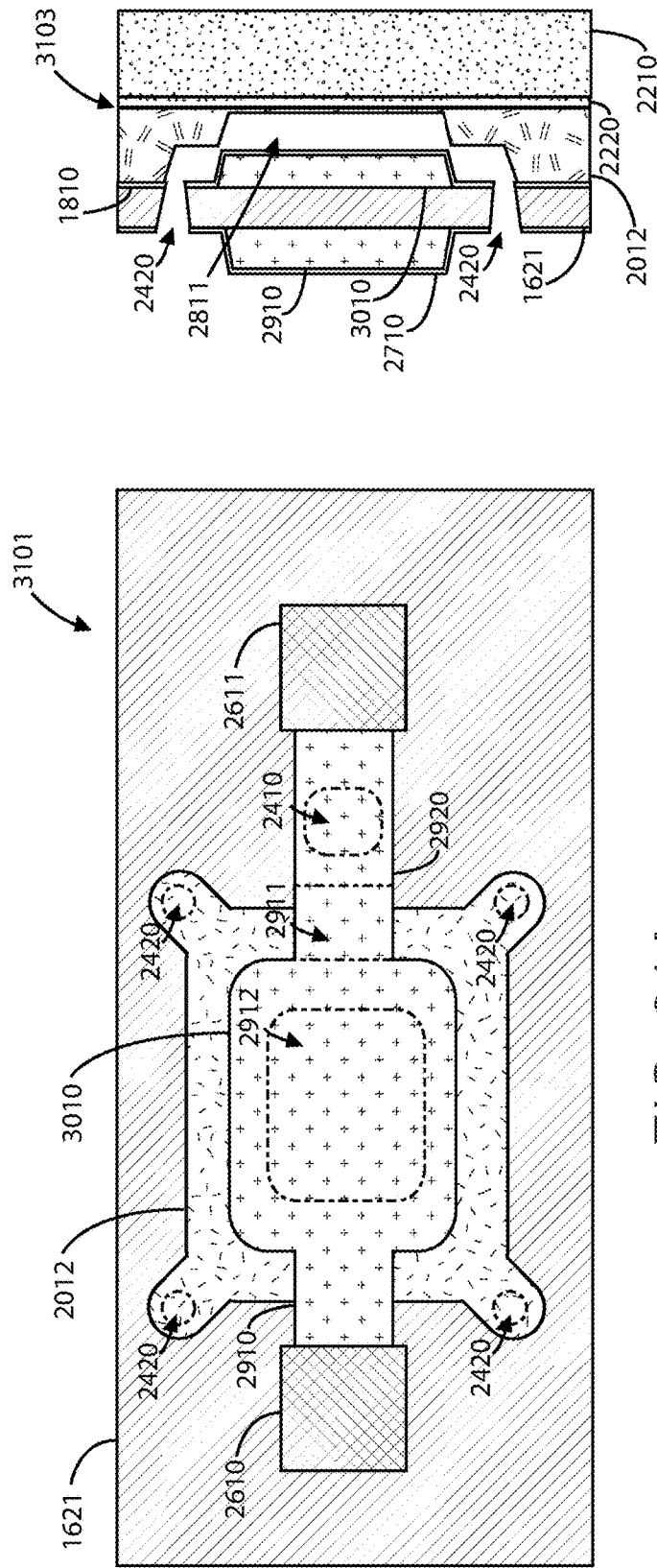
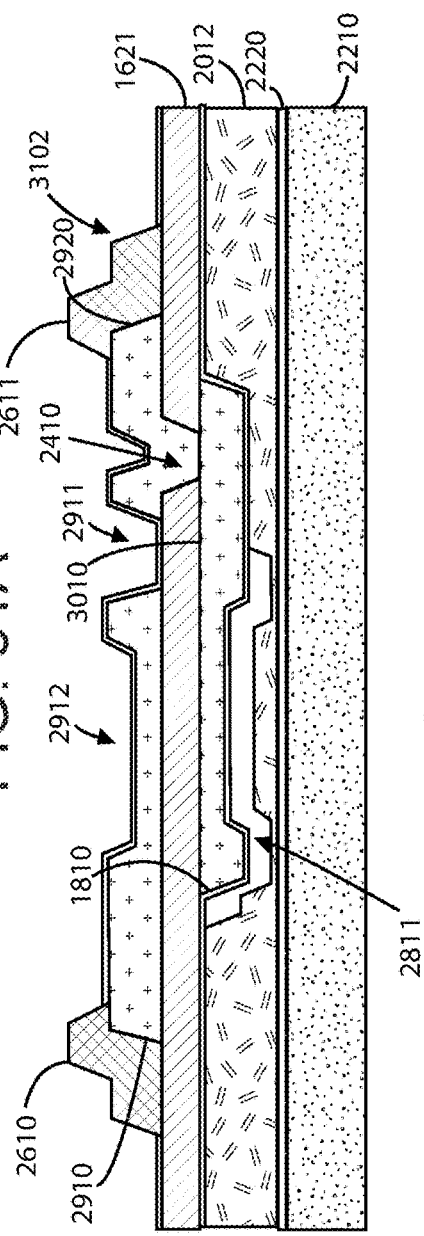
FIG. 31A
FIG. 31B
FIG. 31C

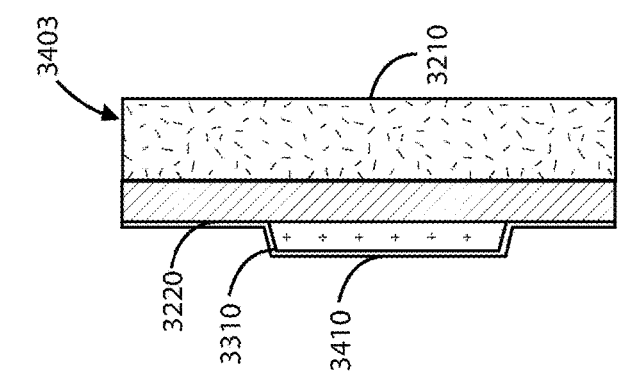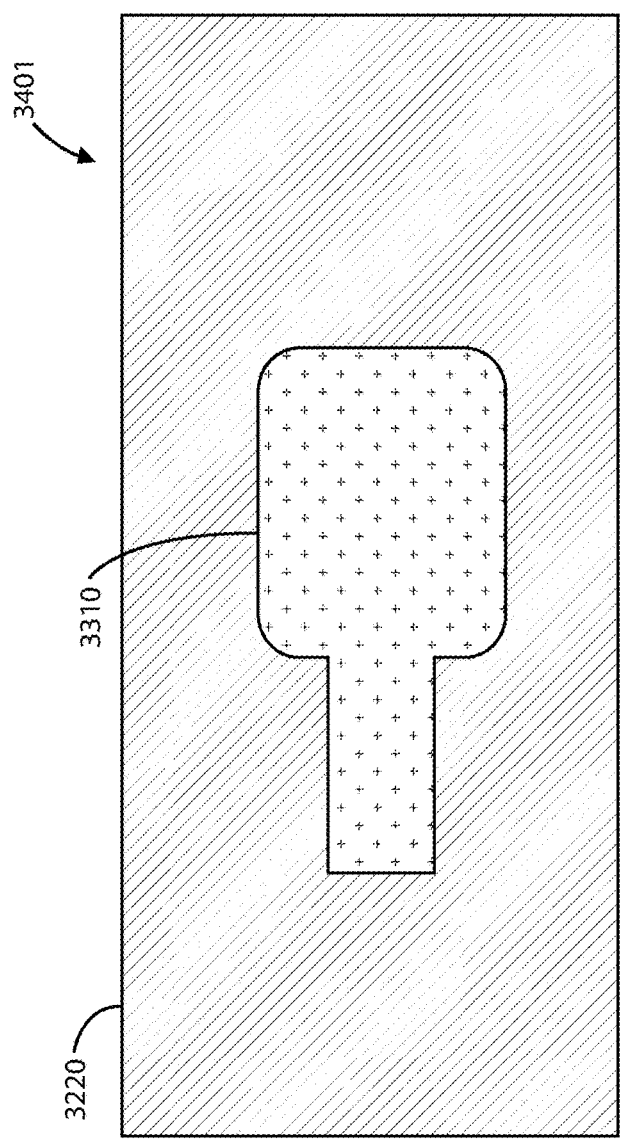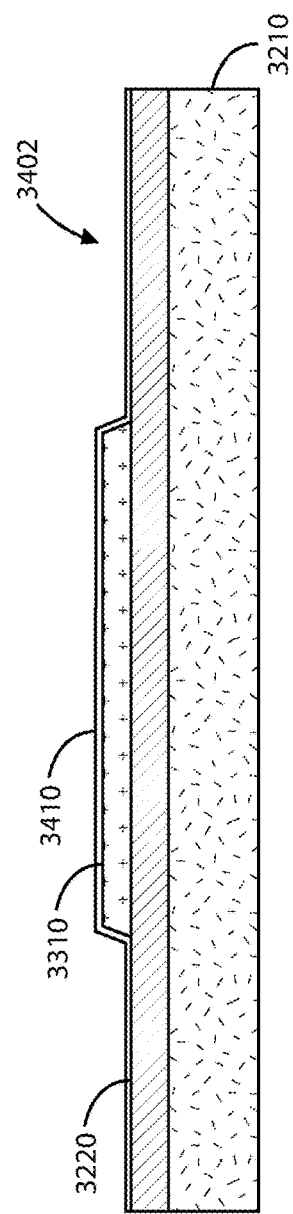

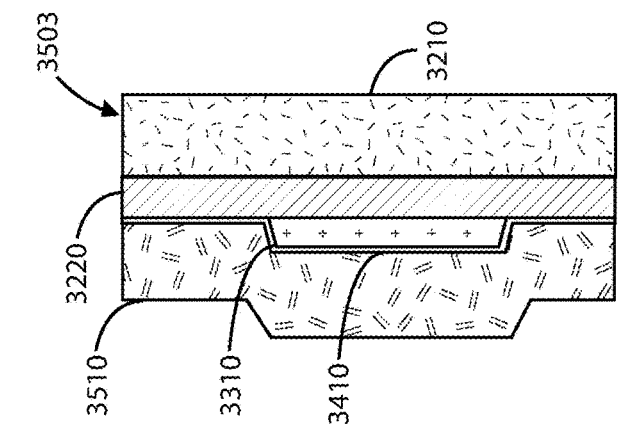
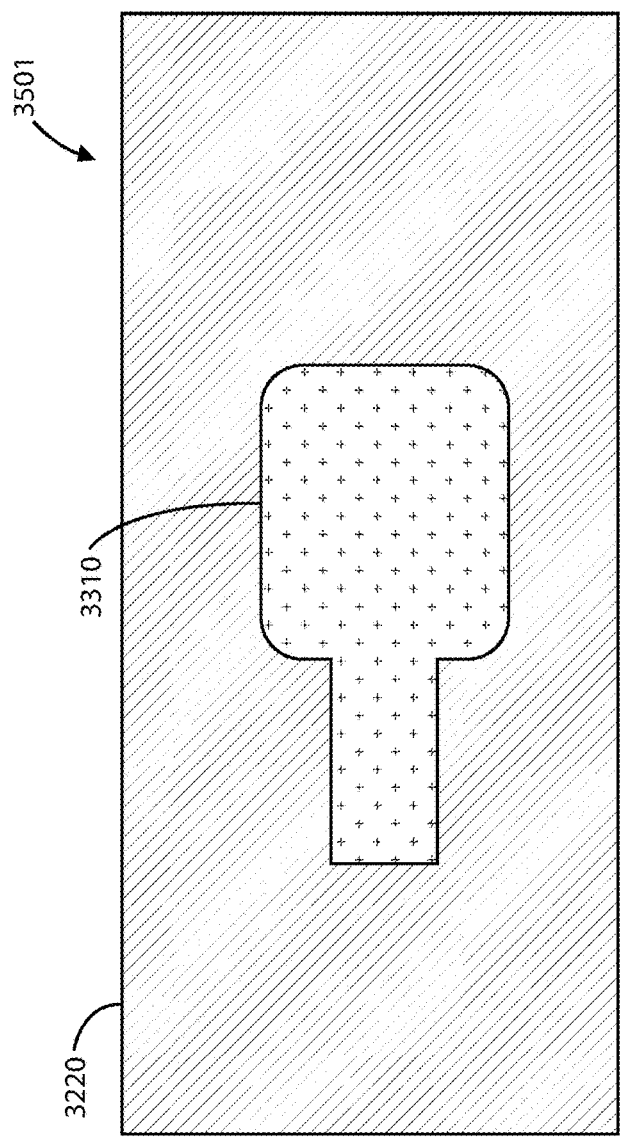
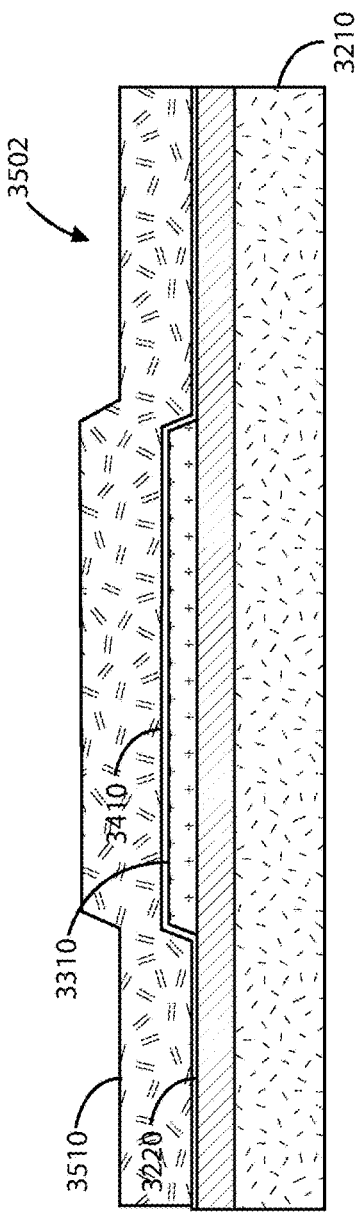
FIG. 35C
FIG. 35A
FIG. 35B

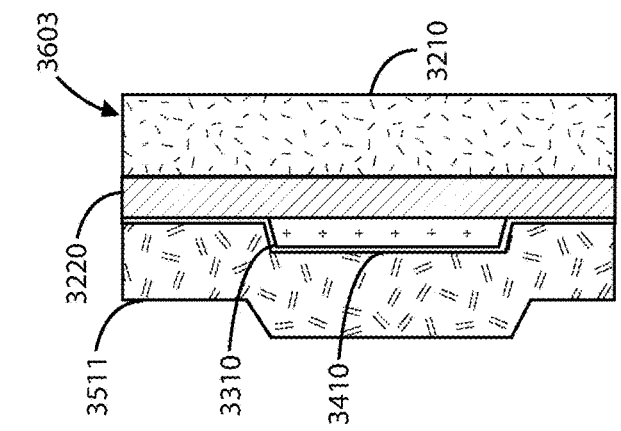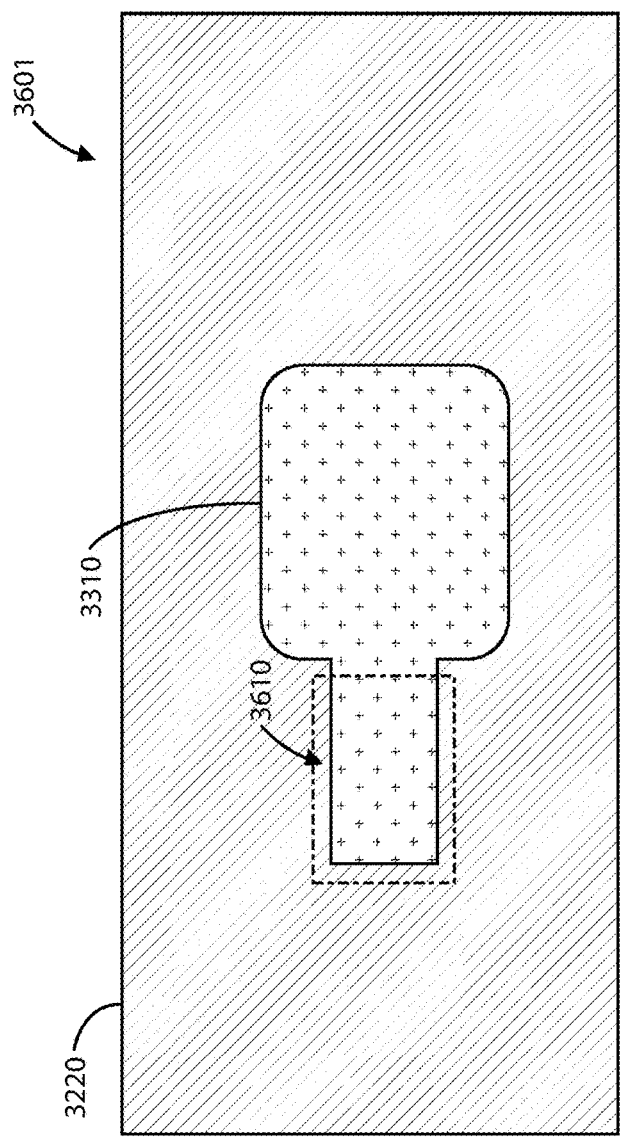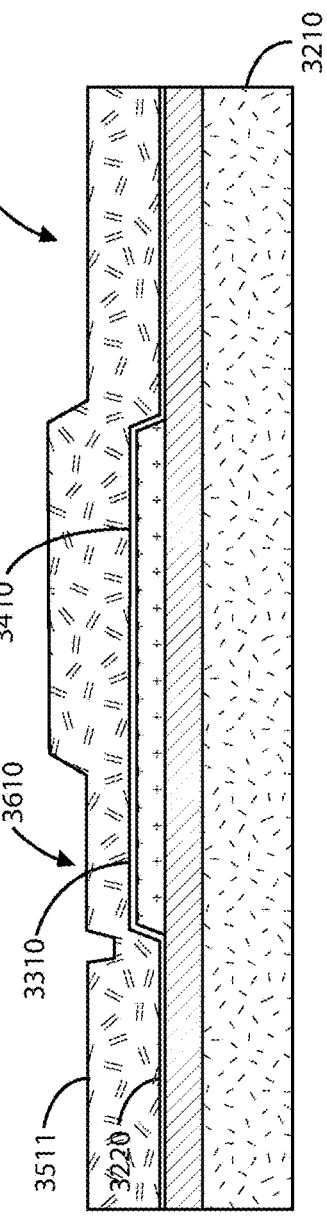

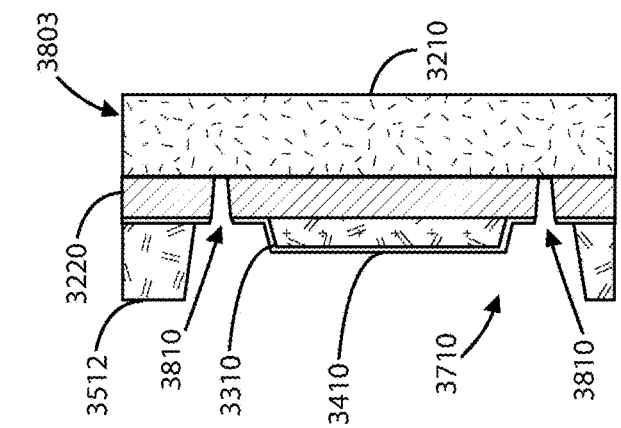
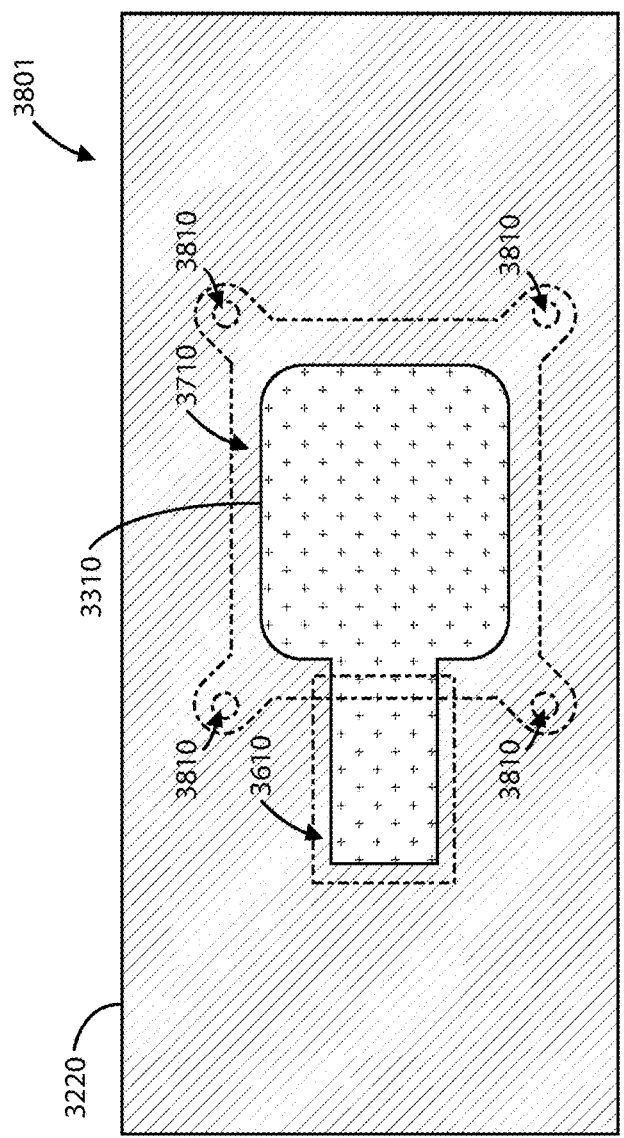
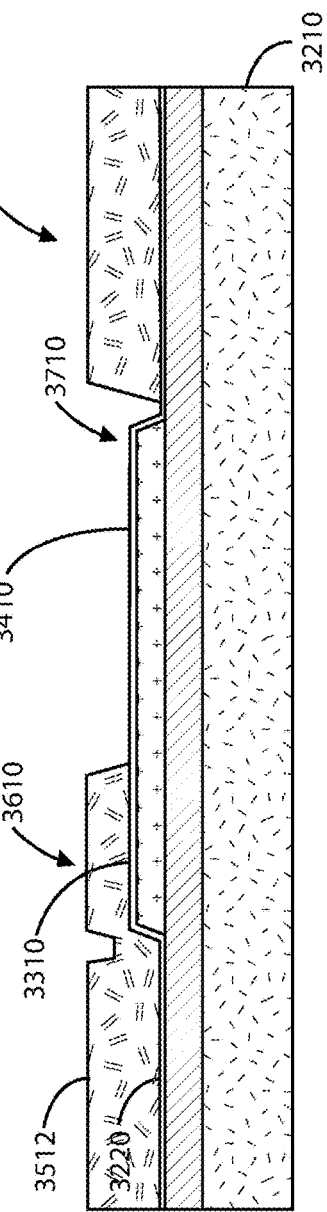
FIG. 38C
FIG. 38A
FIG. 38B

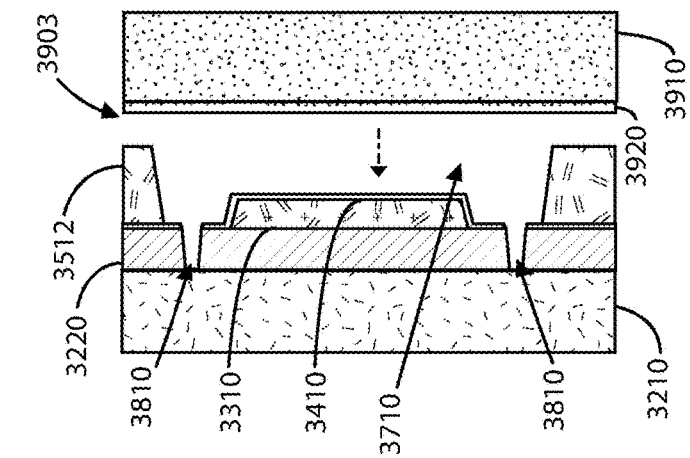
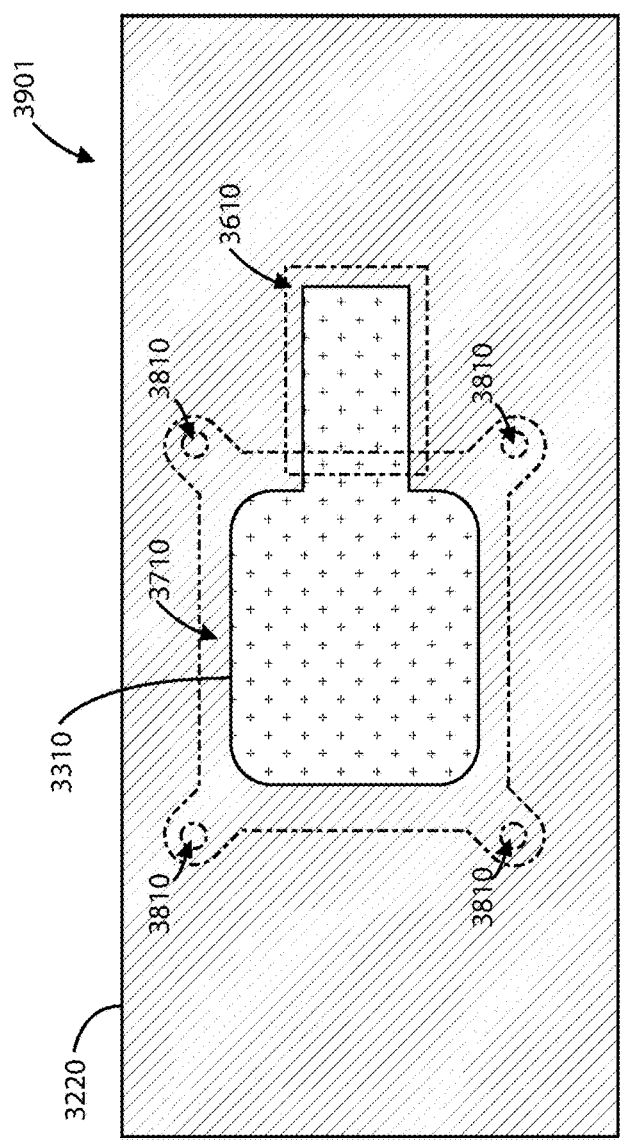
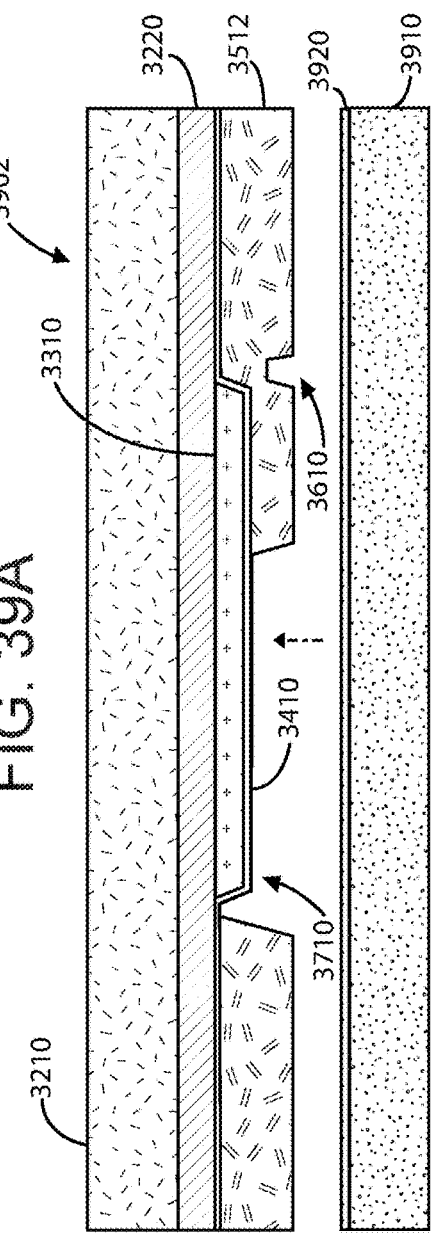
FIG. 39A
FIG. 39B
FIG. 39C

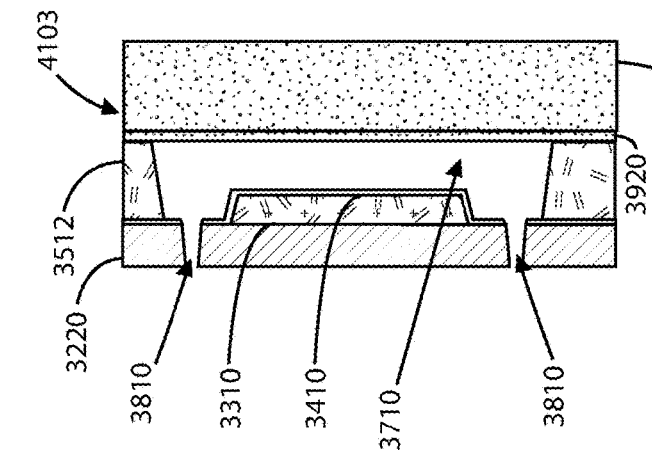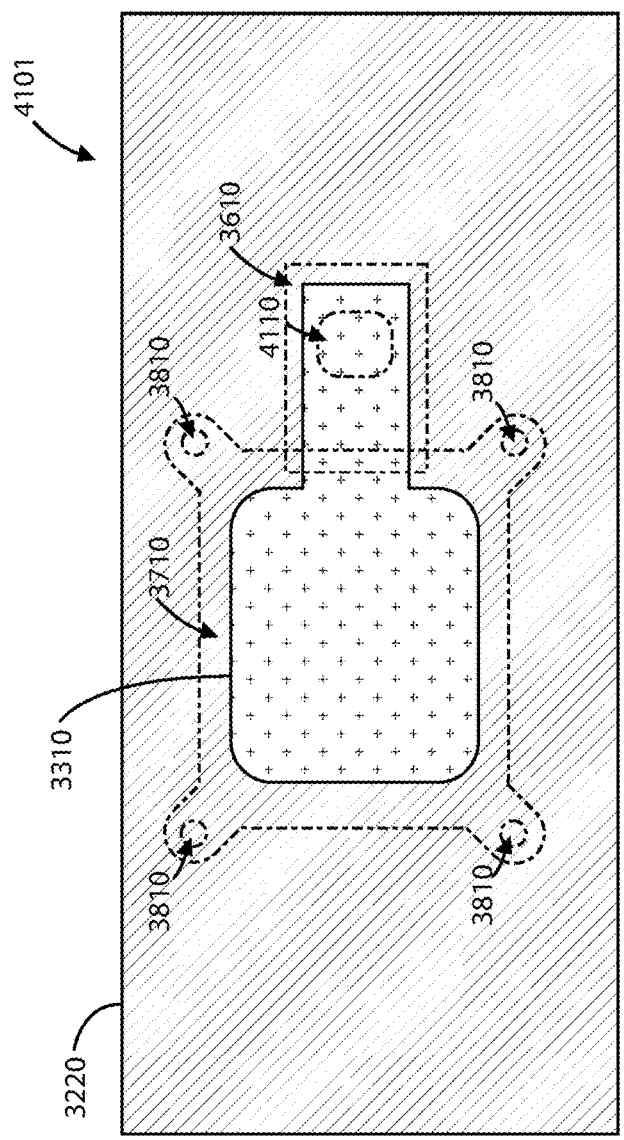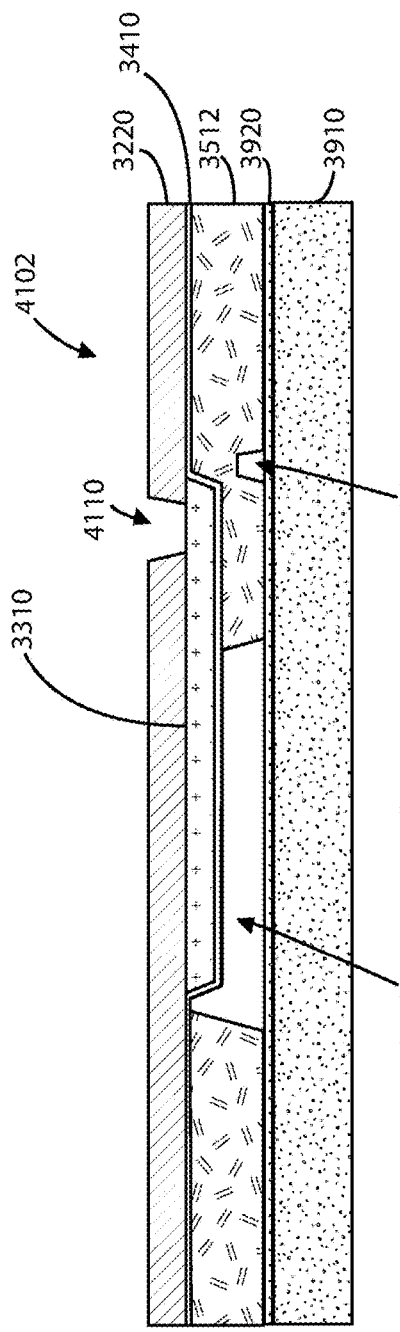

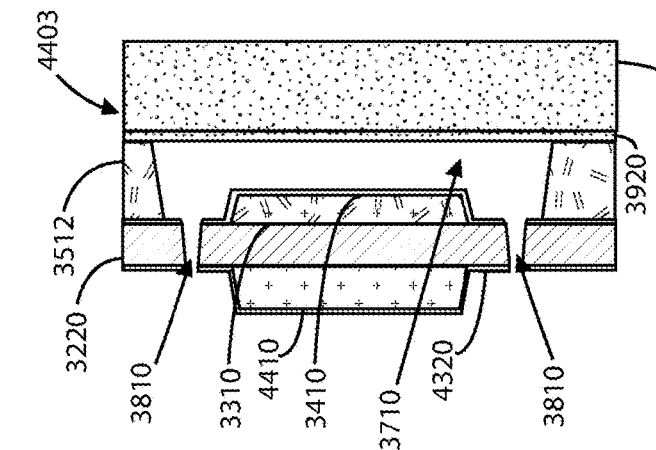
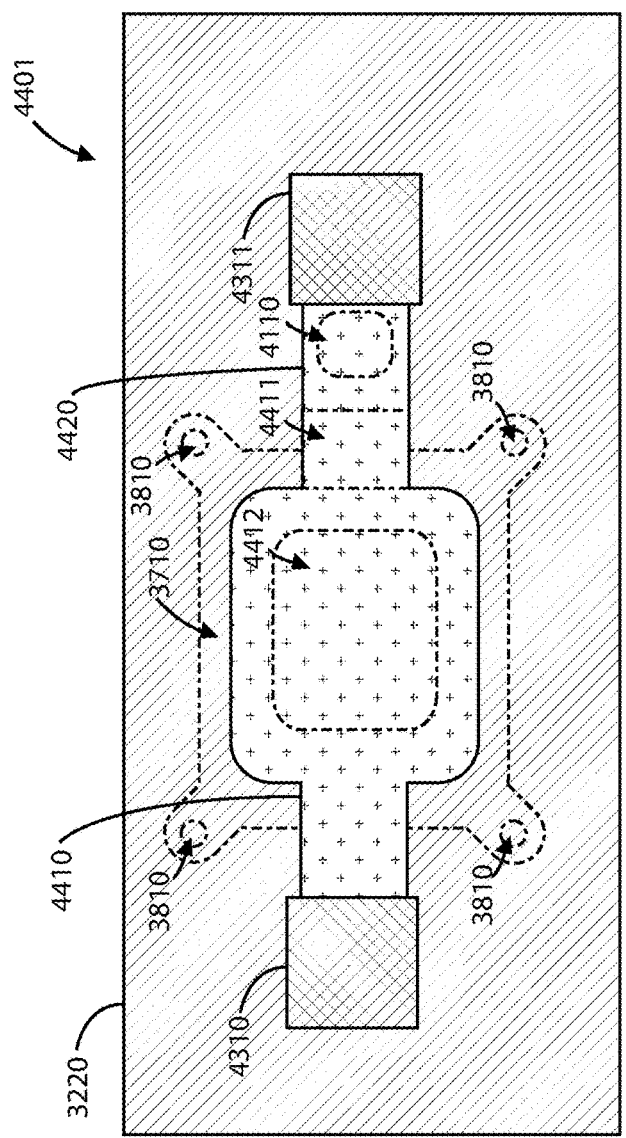
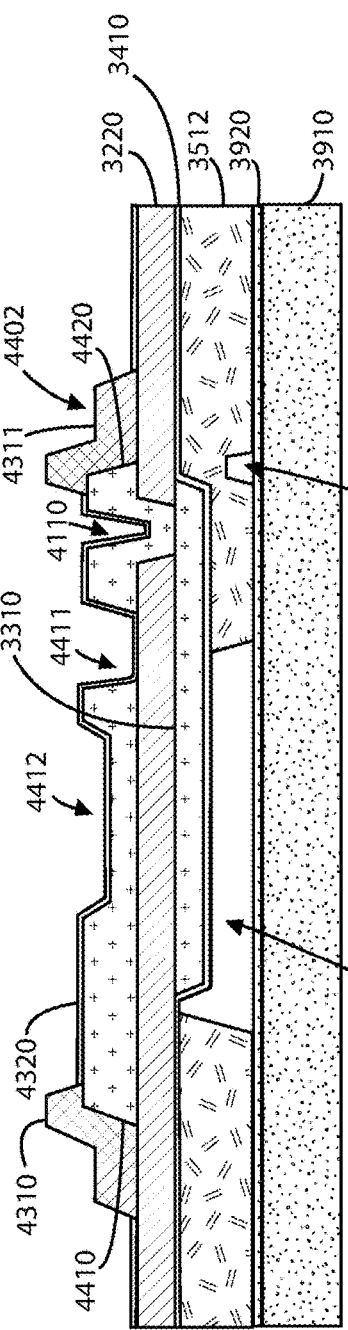
FIG. 44A
FIG. 44B
FIG. 44C

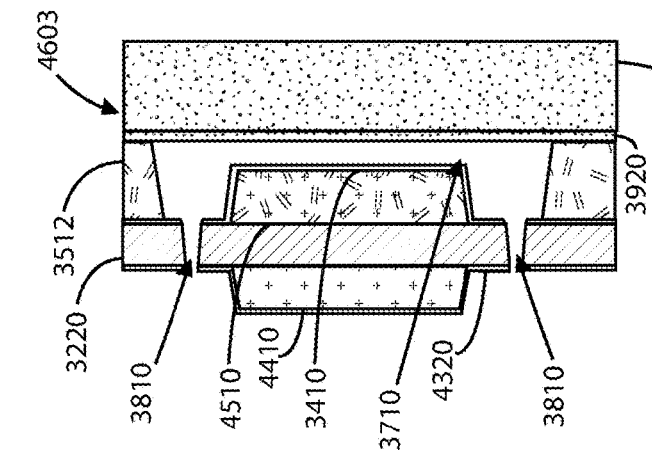
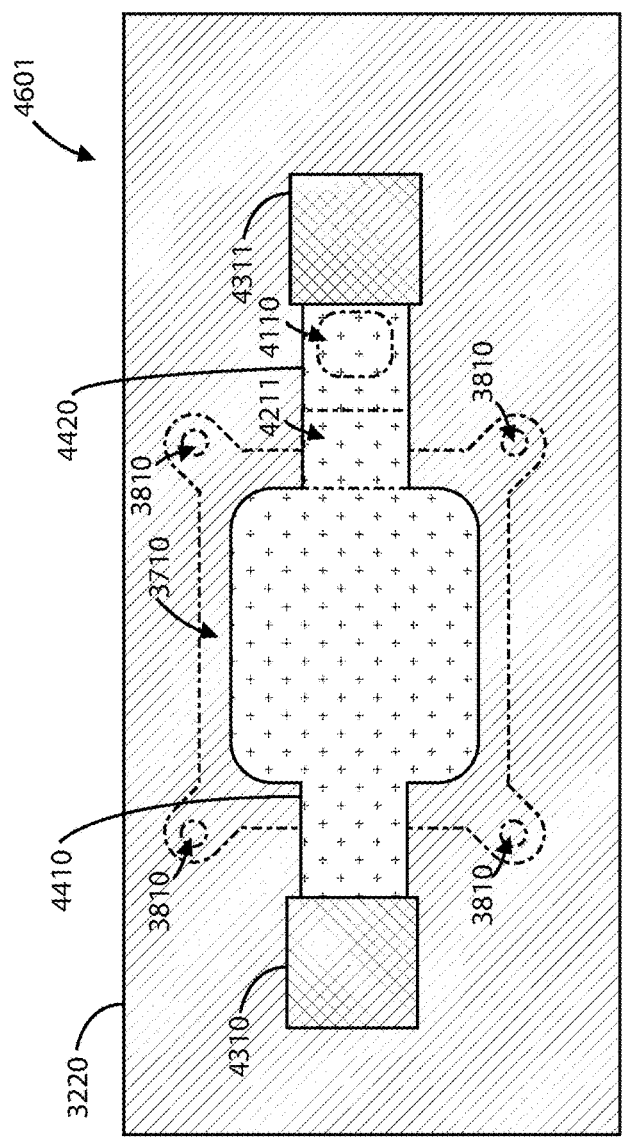
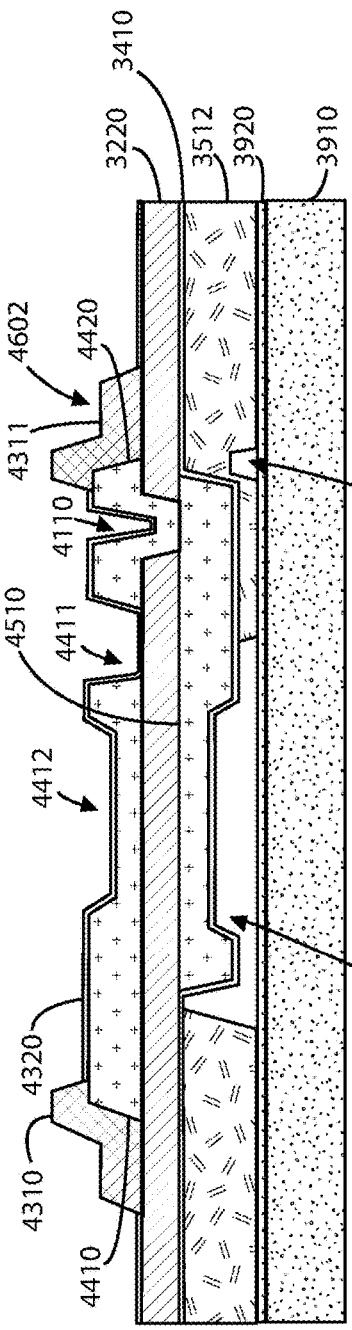

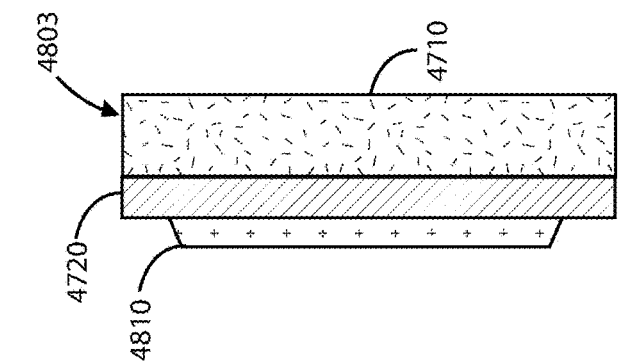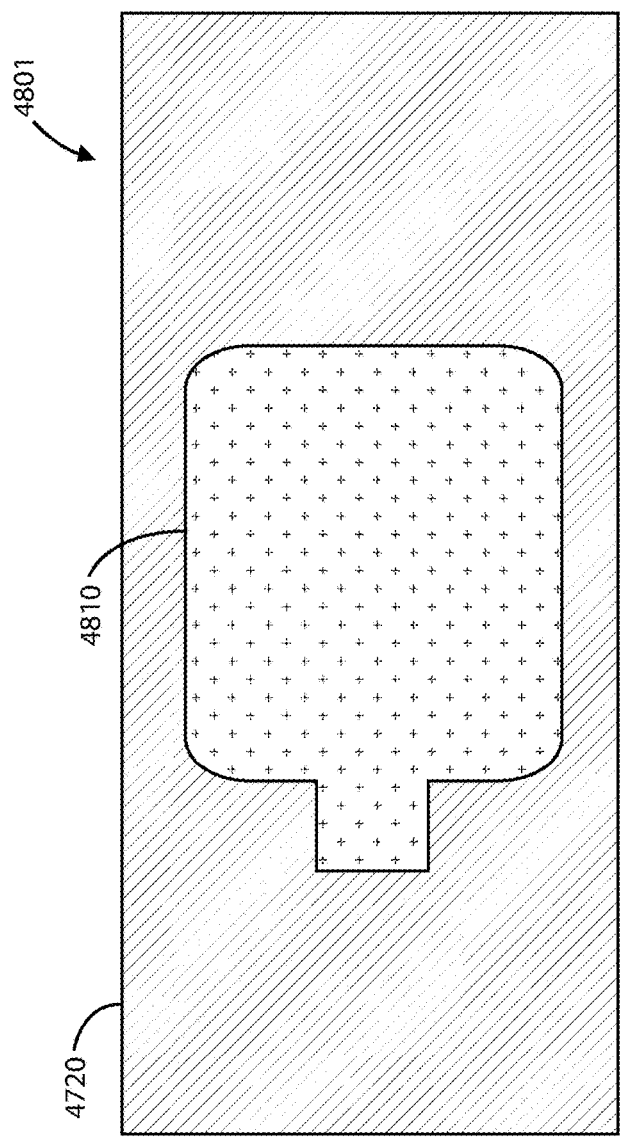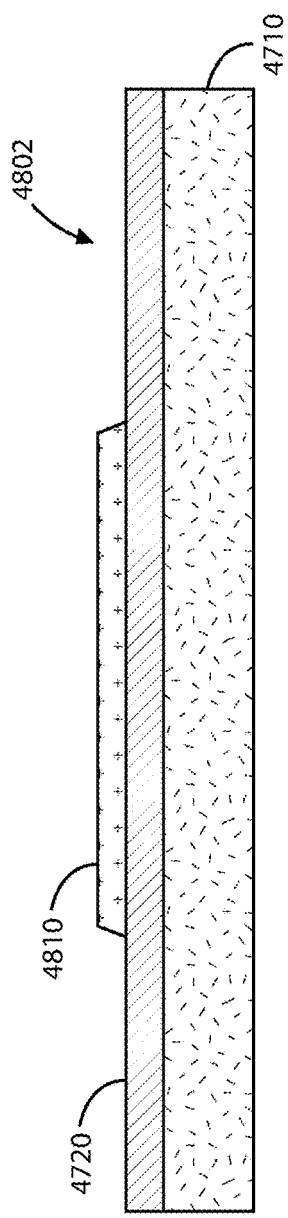
FIG. 48A
FIG. 48B
FIG. 48C

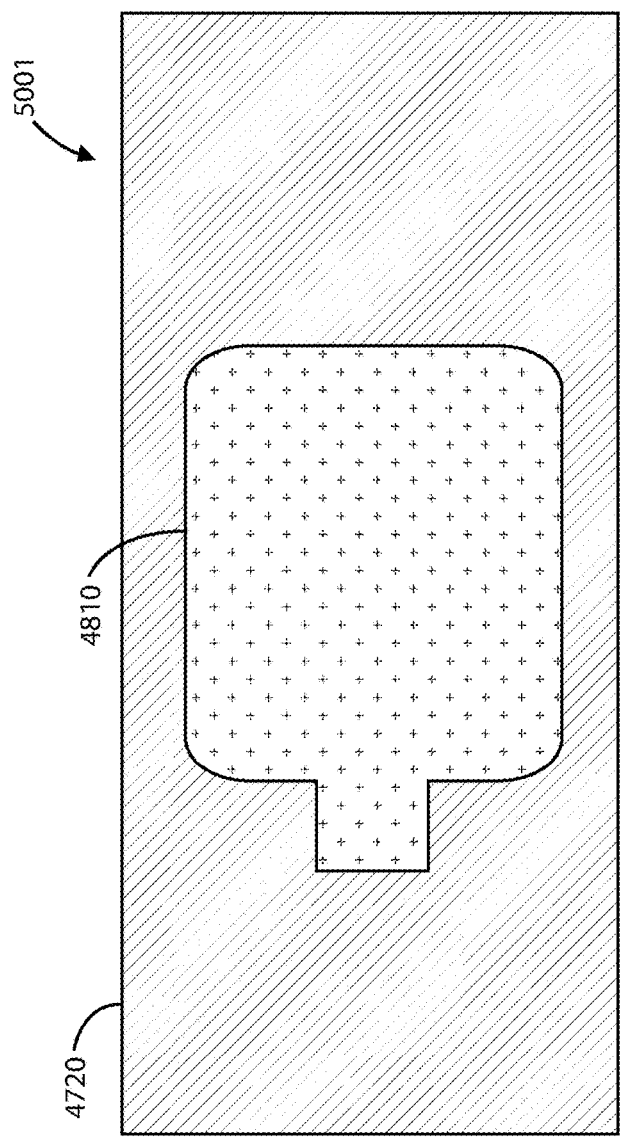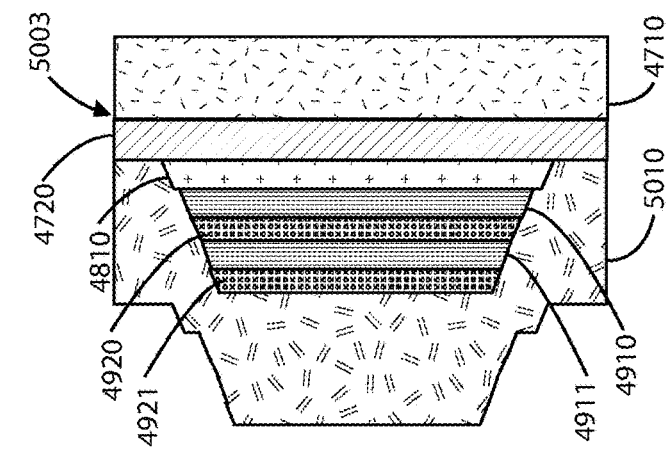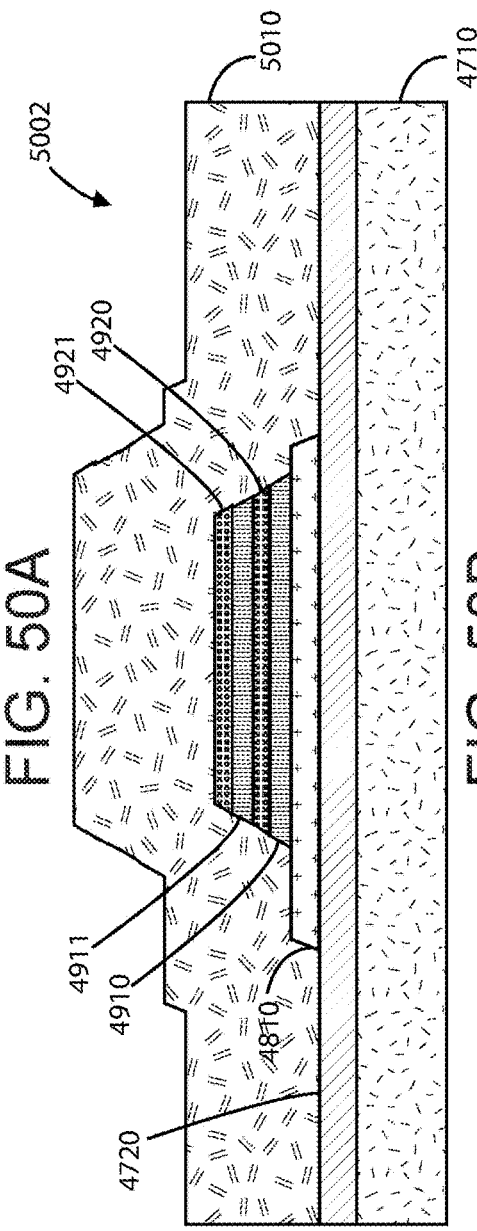

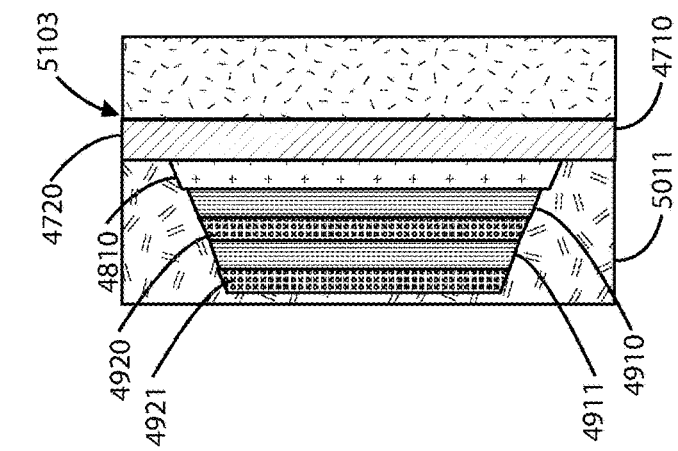
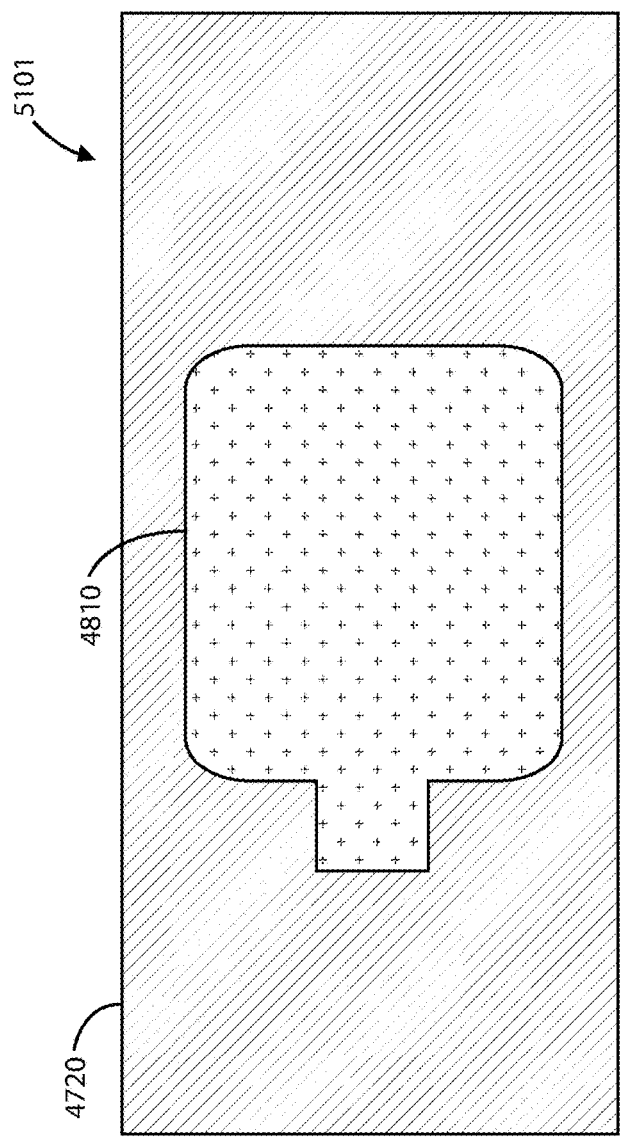
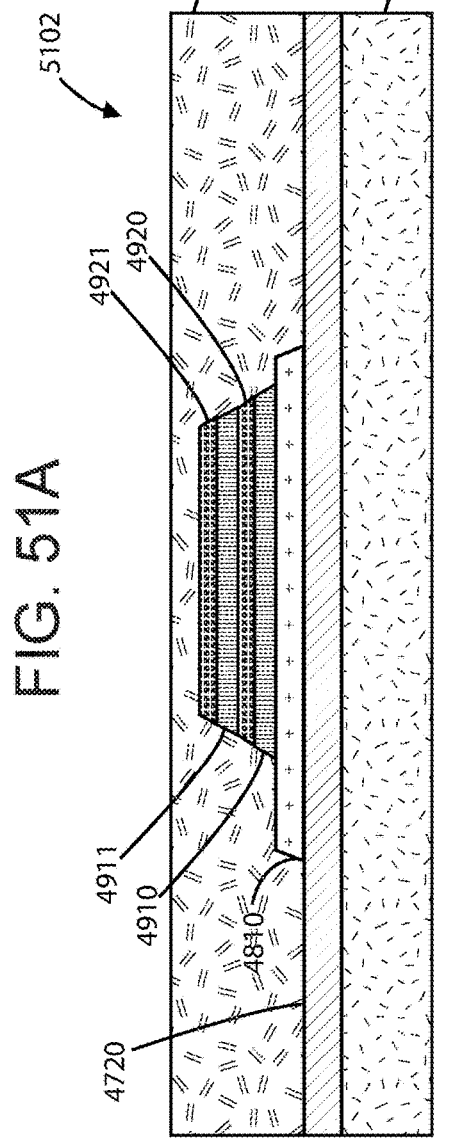
FIG. 51A
FIG. 51B
FIG. 51C

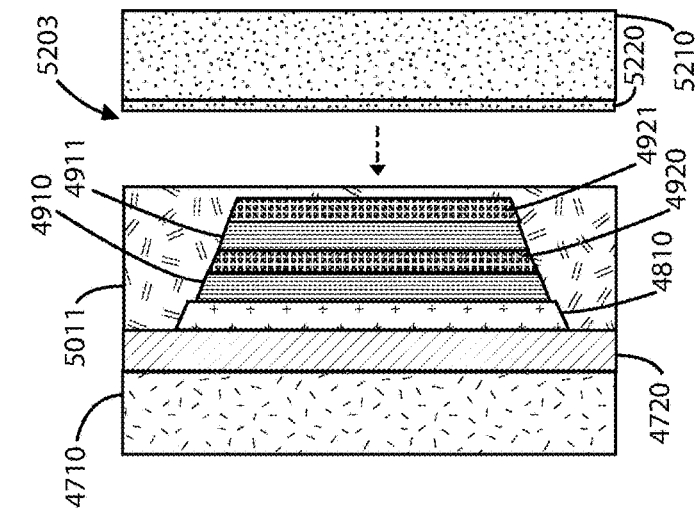
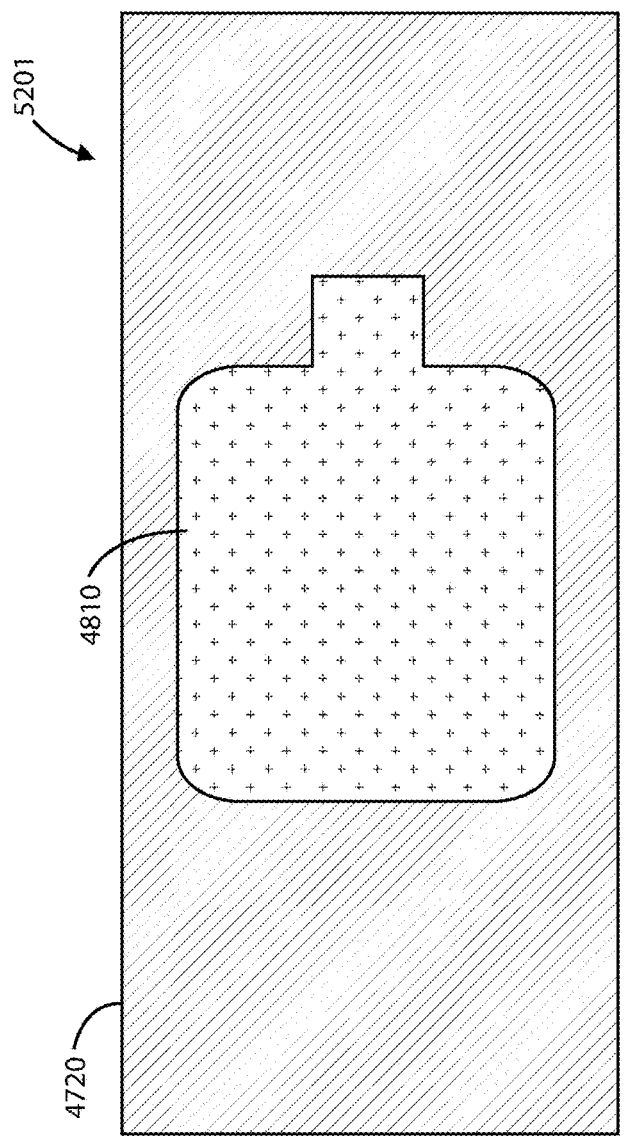
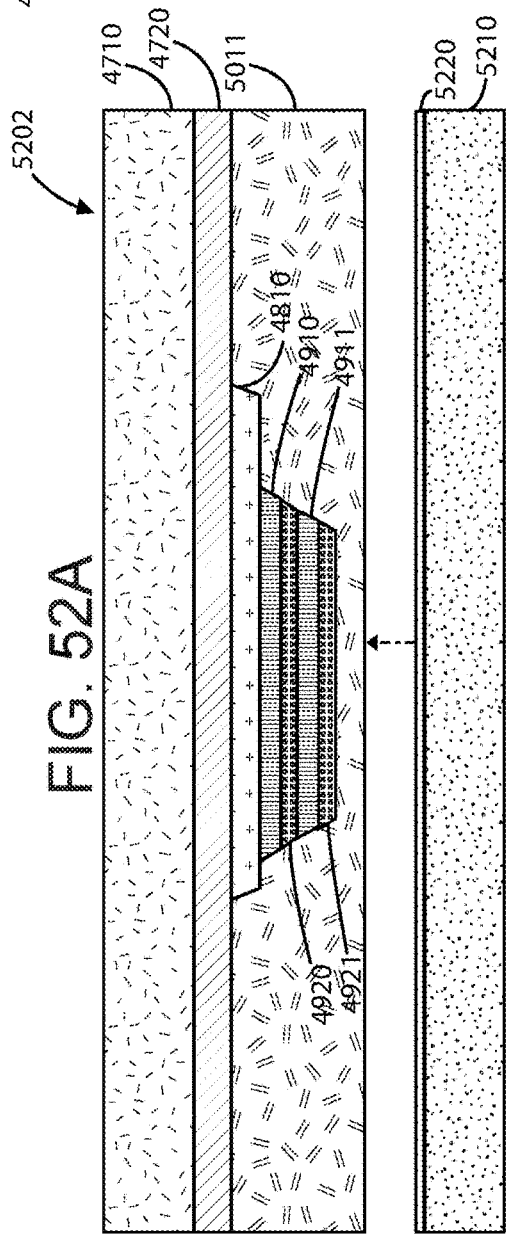

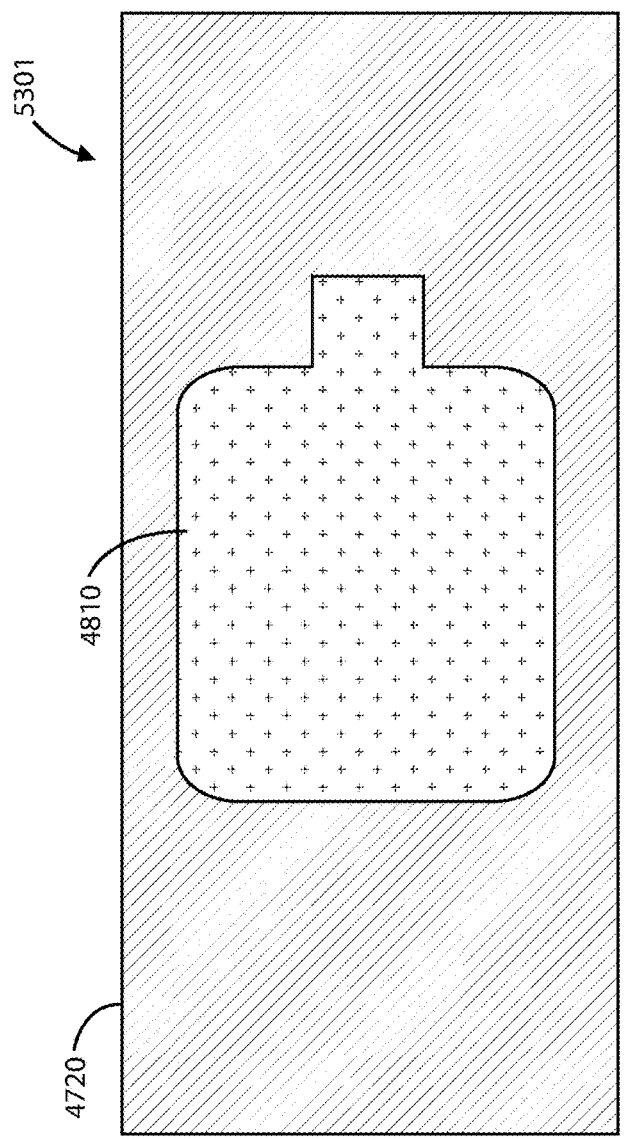
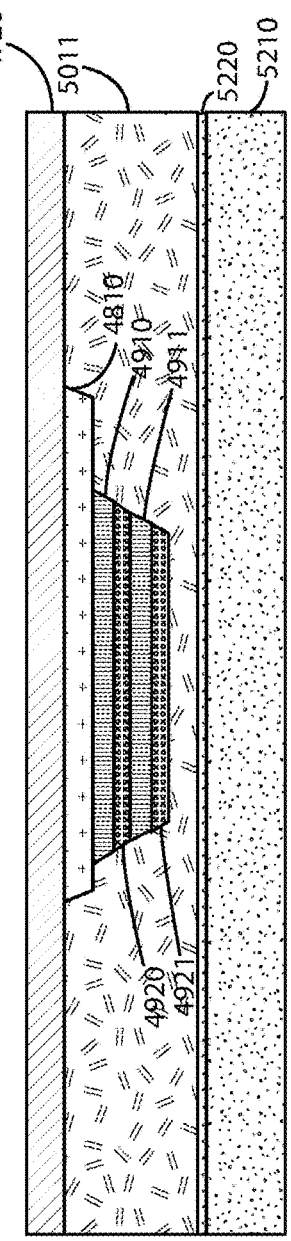
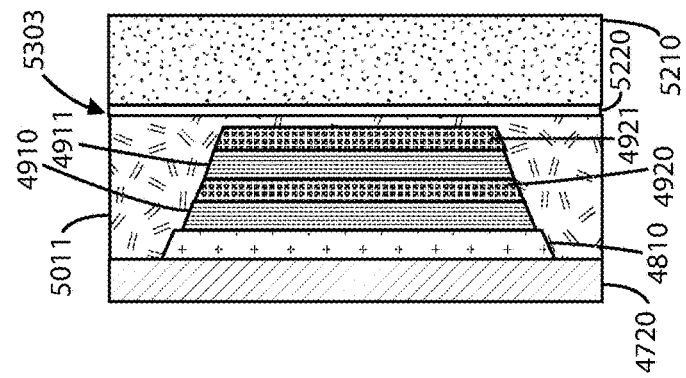
FIG. 53A
FIG. 53B
FIG. 53C

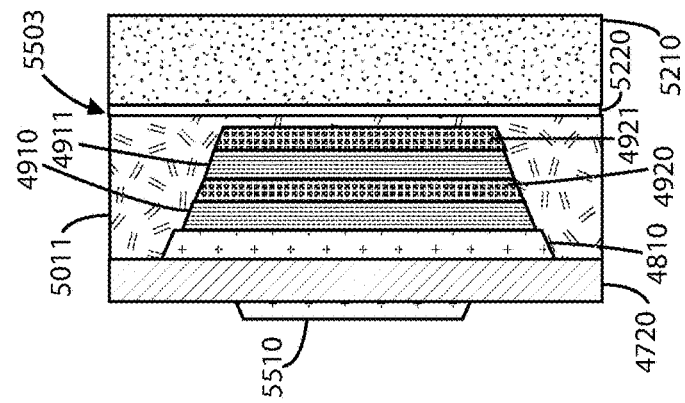
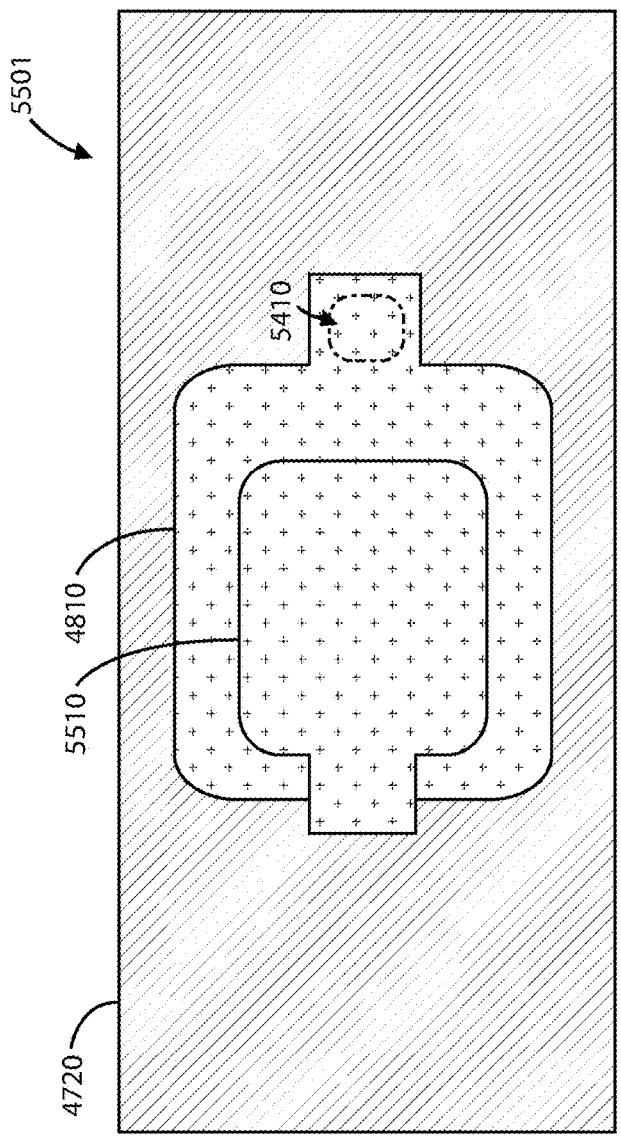
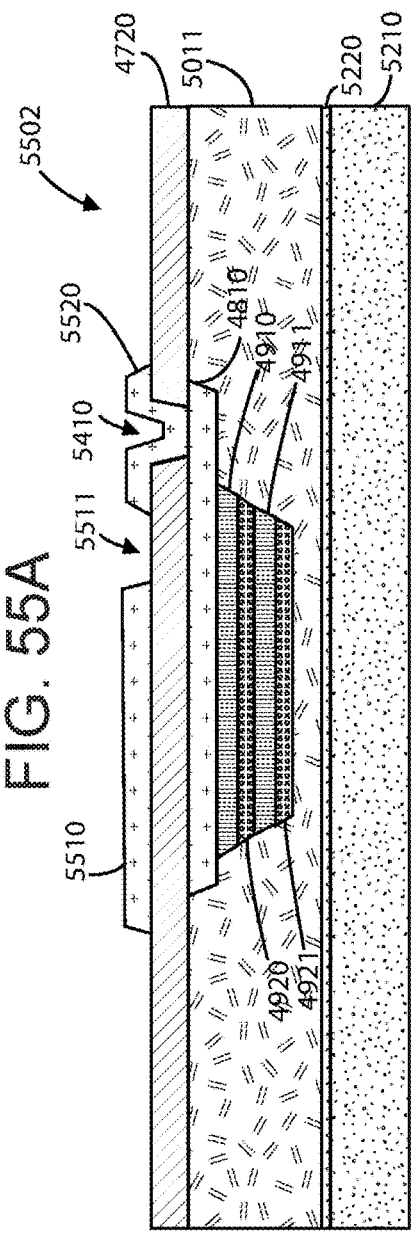
FIG. 55A
FIG. 55B
FIG. 55C

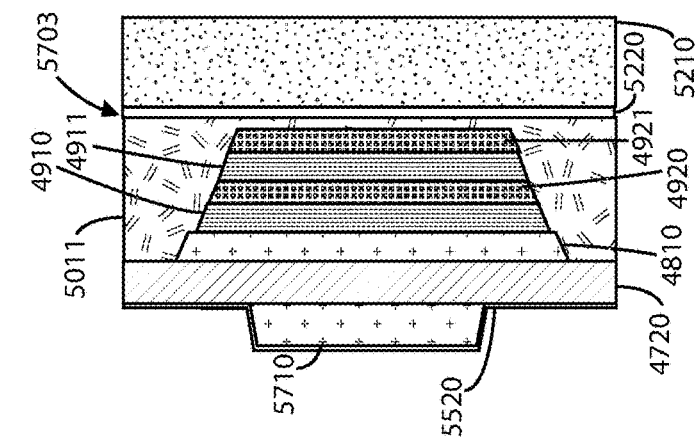
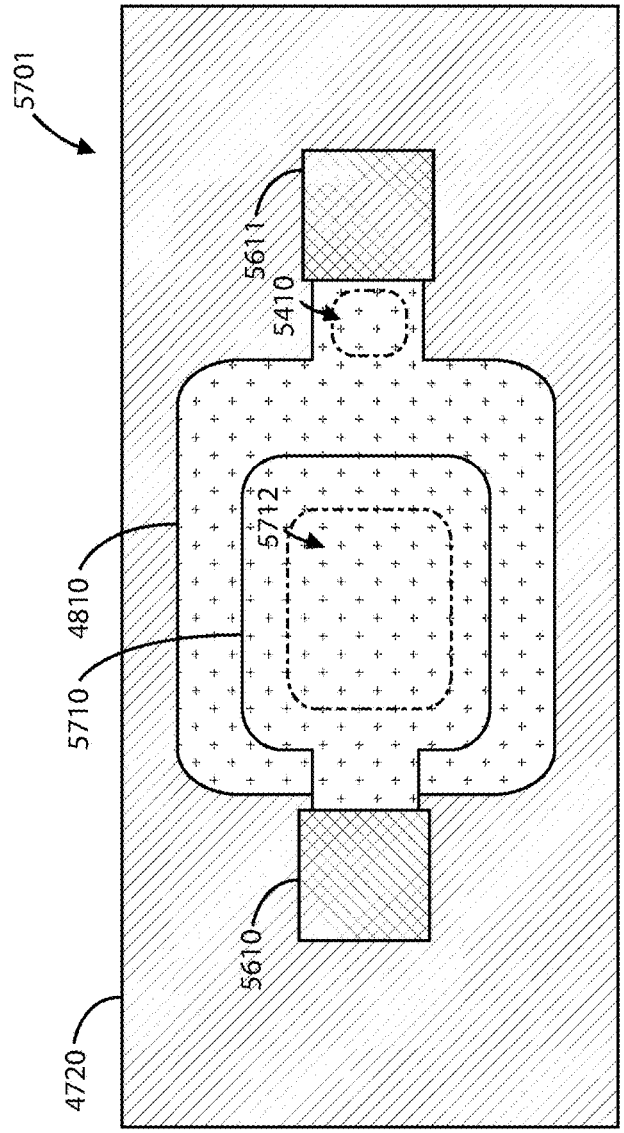
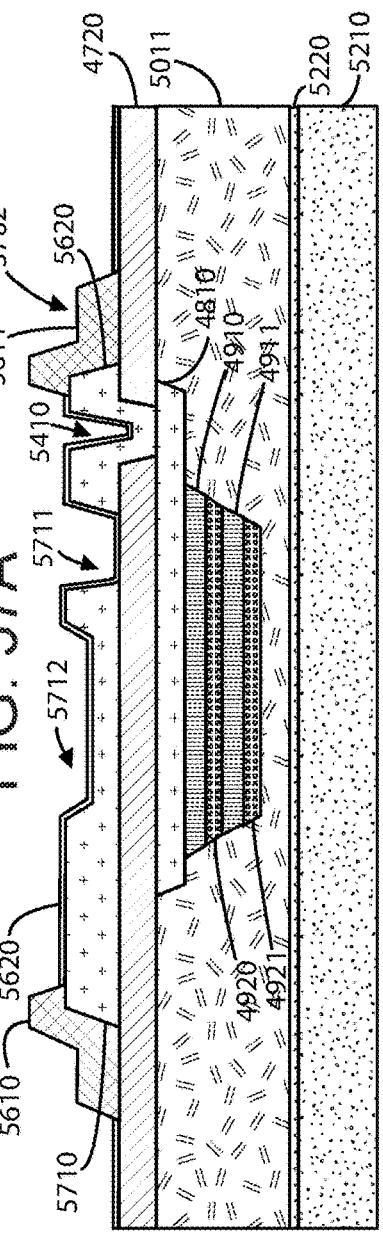

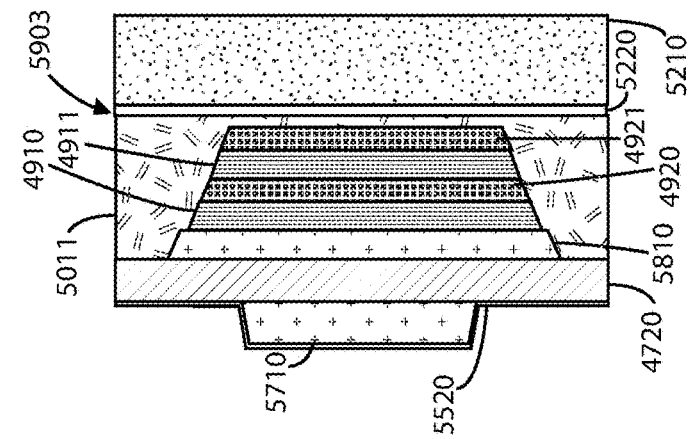
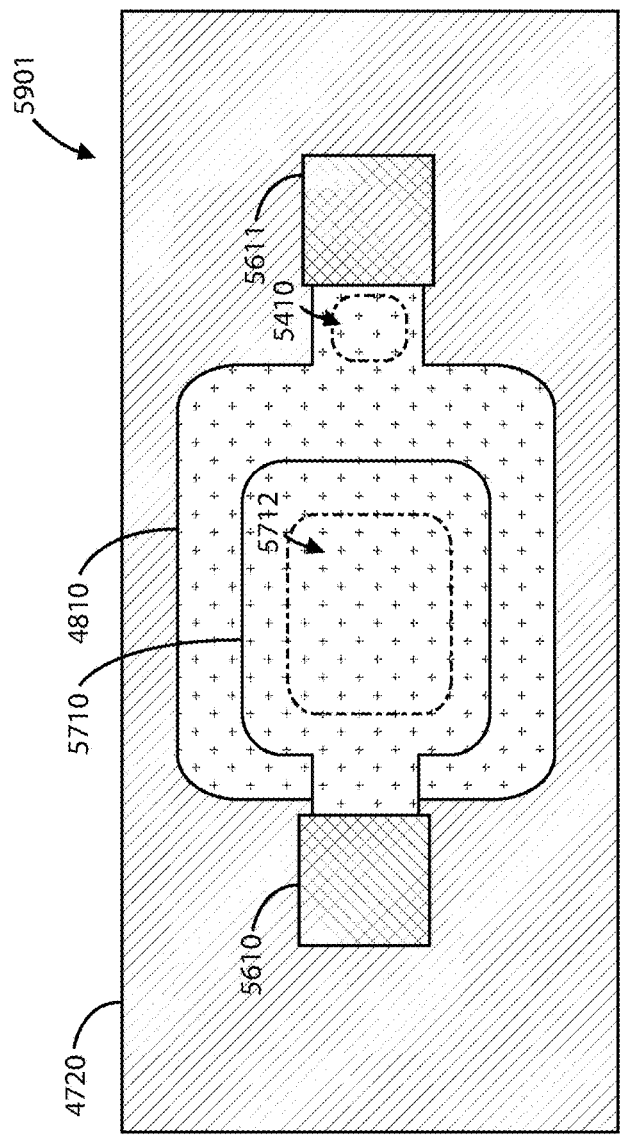
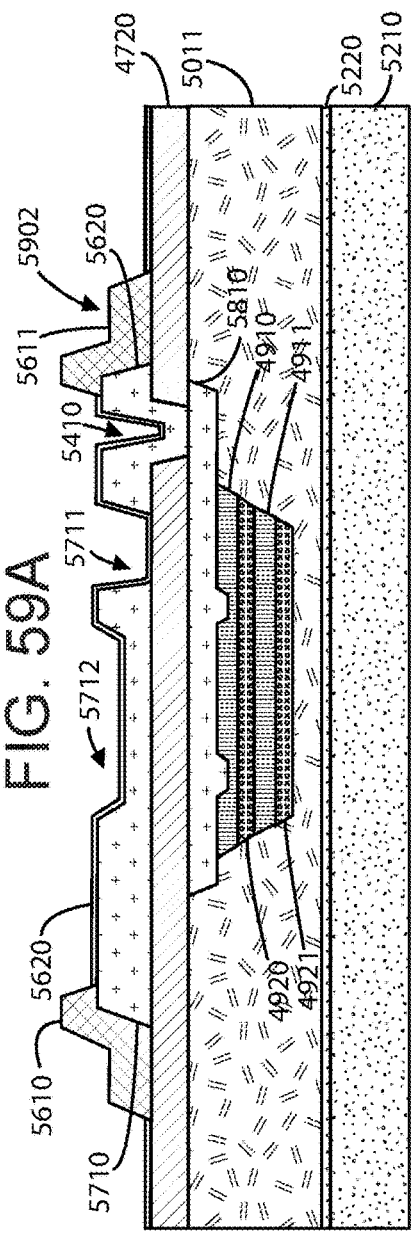

METHODS OF FORMING DOPED CRYSTALLINE PIEZOELECTRIC THIN FILMS VIA MOCVD AND RELATED DOPED CRYSTALLINE PIEZOELECTRIC THIN FILMS

CROSS-REFERENCE TO RELATED APPLICATIONS AND CLAIM FOR PRIORITY

The present, application claims priority to, and is a continuation-in-part application of, U.S. Non-provisional application Ser. No. 16/513,143, entitled "Methods of Forming Group III Piezoelectric Thin Films Via Sputtering" filed Jul. 16, 2019, which is a continuation-in-part application of, U.S. patent application Ser. No. 15/784,919, titled "PIEZOELECTRIC ACOUSTIC RESONATOR MANUFACTURED WITH PIEZOELECTRIC THIN FILM TRANSFER PROCESS," filed Oct. 16, 2017 (now U.S. Pat. No. 10,355,659 which, issued on Jul. 16, 2019) the entire disclosures of both of which are hereby incorporated herein by reference, the present application also claims priority to U.S. Provisional Patent Application Ser. No. 62/846,558, entitled "Increased Atomic Strain in AlN PZ Material using Lattice Doping," filed in the U.S.P.T.O. on May 10, 2019 and incorporated herein by reference in its entirety.

The present application also incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 6, 2014 (now U.S. Pat. No. 9,673,384 issued Jun. 6, 2017), U.S. patent application Ser. No. 14/298,076, titled "ACOUSTIC RESONATOR DEVICE WITH SINGLE CRYSTAL PIEZO MATERIAL AND CAPACITOR ON A BULK SUBSTRATE", filed Jun. 6, 2014 (now U.S. Pat. No. 9,537,465 issued Jan. 3, 2017), U.S. patent application Ser. No. 14/298,100, titled "INTEGRATED CIRCUIT CONFIGURED TWO OR MORE SINGLE CRYSTAL ACOUSTIC RESONATOR DEVICES", filed Jun. 6, 2014 (now U.S. Pat. No. 9,571,061 issued Feb. 14, 2017), U.S. patent application Ser. No. 14/341,314, titled "WAFER SCALE PACKAGING", filed Jul. 25, 2014, U.S. patent application Ser. No. 14/449,001, titled "MOBILE COMMUNICATION DEVICE CONFIGURED WITH A SINGLE CRYSTAL PIEZO RESONATOR STRUCTURE", filed Jul. 31, 2014 (now U.S. Pat. No. 9,716,581 issued Jul. 25, 2017), and U.S. patent application Ser. No. 14/469,503, titled "MEMBRANE SUBSTRATE STRUCTURE FOR SINGLE CRYSTAL ACOUSTIC RESONATOR DEVICE", filed Aug. 26, 2014.

BACKGROUND

The present invention relates generally to electronic devices. More particularly, the present invention provides techniques related to a method of manufacture and a structure for bulk acoustic wave resonator devices, simile crystal bulk acoustic wave resonator devices, single crystal filter and resonator devices, and the like. Merely by way of example, the invention has been applied to a single crystal resonator device for a communication device, mobile device, computing device, among others.

Wireless data communications can utilize RF filters operating at frequencies around 5 GHz and higher. It is known to use Bulk acoustic Wave Resonators (BAWR) incorporating polycrystalline piezoelectric thin films for some applications. While some polycrystalline based piezoelectric thin film BAWRs may be adequate for filters operating at frequencies from about 1 to 3 GHz, applications at frequencies around 5 GHz and above may present obstacles due to the reduced crystallinity associated with such thin poly-based films.

SUMMARY

Embodiments according to the present invention can provide methods of forming doped crystalline piezoelectric thin films via MOCVD and related doped crystalline piezoelectric thin films. Pursuant to these embodiments, a piezoelectric film can include an aluminum nitride material doped with a first element E1 selected from group II and doped with a second element E2 selected from group IVB to provide the aluminum nitride material with a doped concentration of E1 and E2 in a range between about 1 atom % and about 30 atom % where a number of atoms of E1 plus a number of atoms of E2 plus a number of atoms of aluminum is 100%.

In some embodiments, a piezoelectric film can include an aluminum nitride material doped with a first element E1 selected from group II and doped with a second element E2 selected from group IVB to provide the aluminum nitride material according to $(E1E2)_x Al_{1-x} N$ where $0.0001 < x < 0.5$.

In some embodiments, a method of forming a piezoelectric film can include providing a wafer in a CVD reaction chamber and forming an aluminum nitride material on the wafer, the aluminum nitride material doped with a first element E1 selected from group IIA or from group IIB and doped with a second element E2 selected from group IVB to provide the aluminum nitride material comprising a crystallinity of less than about 1.5 degree at Full Width Half Maximum (FWHM) to about 10 arcseconds at FWHM measured using X-ray diffraction (XRD).

BRIEF DESCRIPTION OF THE DRAWINGS

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an embodiment of the present invention.

FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.

FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.

FIGS. 59A-59C are simplified diagrams illustrating various cross-sectional views of a single crystal acoustic resonator device and of method steps for a solidly mounted transfer process for single crystal acoustic resonator devices according to an example of the present invention.

DETAILED DESCRIPTION OF EMBODIMENTS ACCORDING TO THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1A:
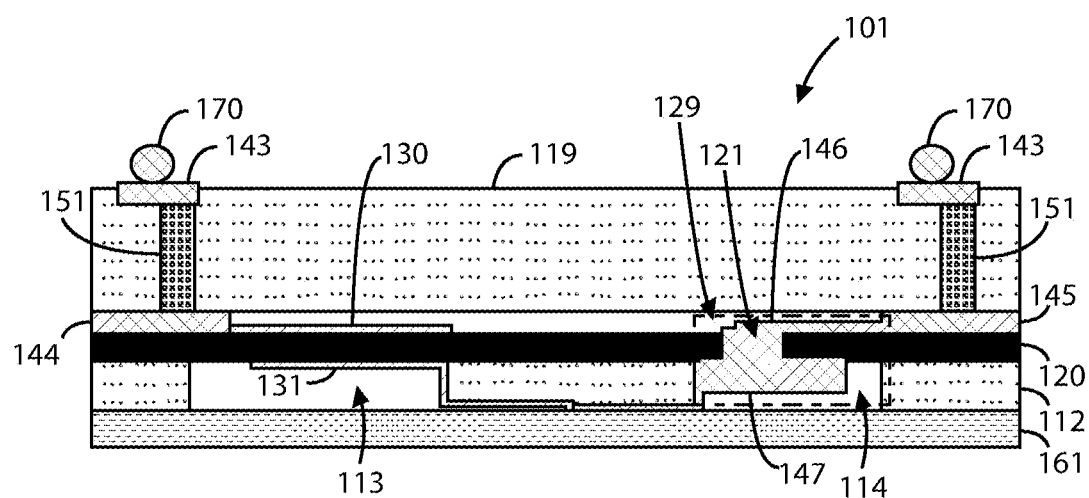
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 141, and topside metal 145 with topside metal plug 146. Solder balls 170 are electrically coupled to the one or more top bond, pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded, to the thinned seed substrate 112, underlying the first and second backside trenches 113, 114. Further details relating to the method of manufacture of this device will be discussed starting from FIG. 2.

Figure 1B:
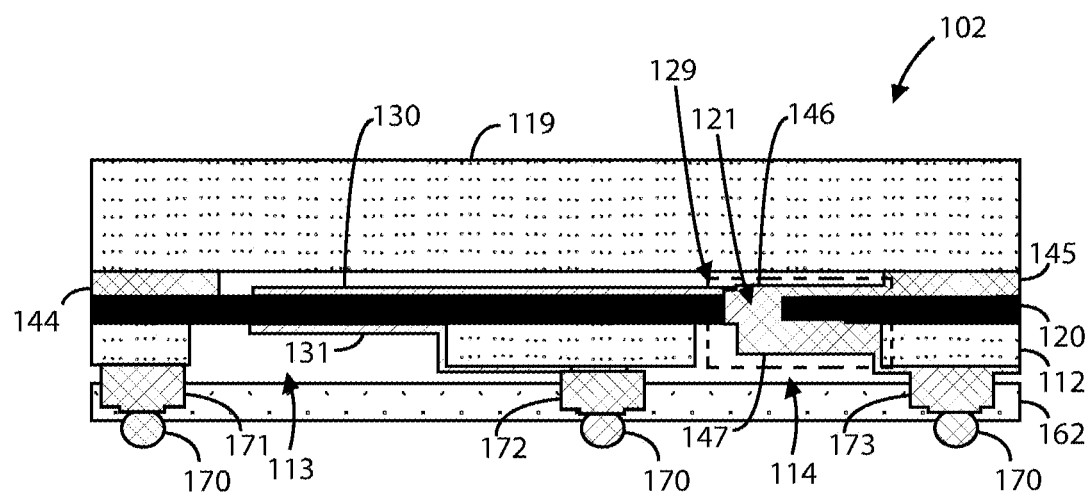
FIG. 1B is a simplified diagram illustrating an acoustic resonator device having bottom-side interconnections, according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 2 has the first and second, backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
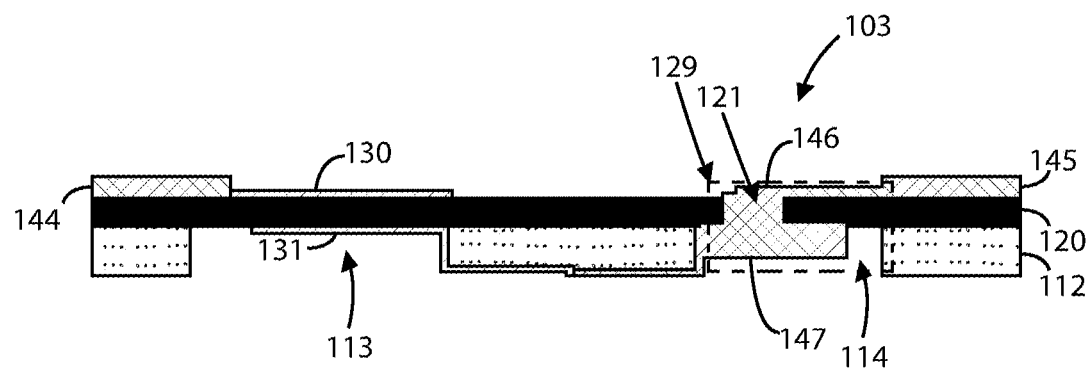
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
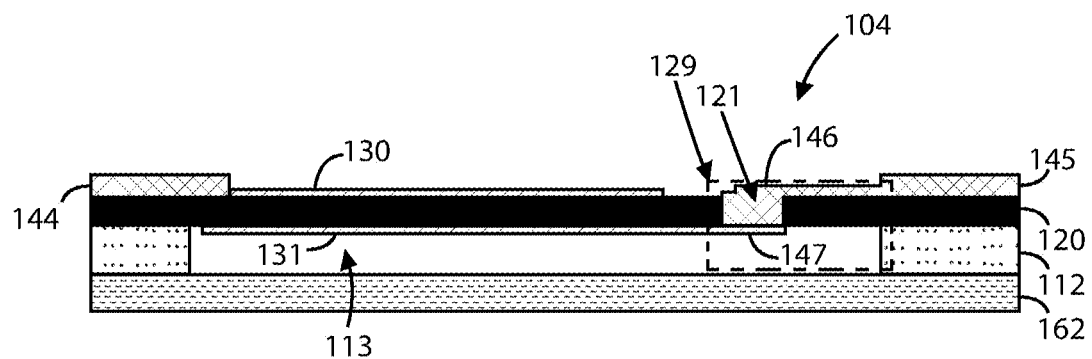
FIG. 1D is a simplified diagram illustrating an acoustic resonator device having interposer/cap-free structure interconnections with a shared backside trench according to an example of the present invention.

FIG. 1D is a simplified diagram illustrating, an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside, metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
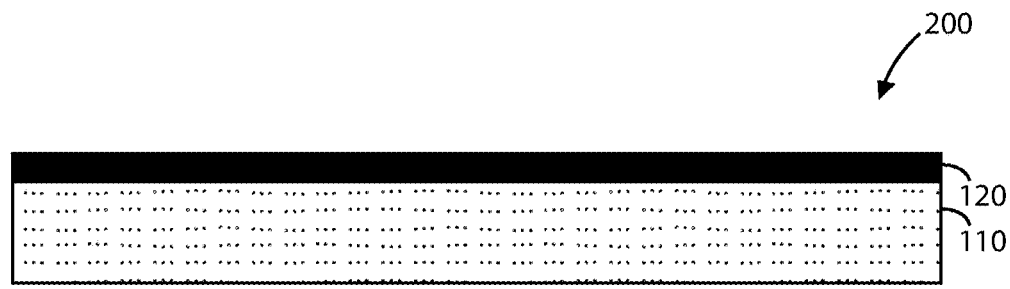
FIGS. 2 and 3 are simplified diagrams illustrating steps for a method of manufacture for an acoustic resonator device according to an example of the present invention.
Figure 3:
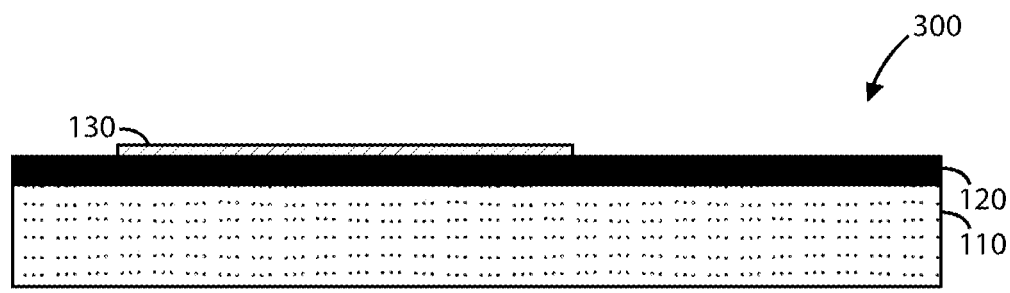

FIGS. 2 and 3 are simplified diagrams illustrating, steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

As appreciated by the present inventors, it can be difficult to dope AlN, with a Group IIIB element (such as Sc) using Metalorganic Chemical Vapor Deposition (MOCVD) to have sufficient crystallinity so that the AlN can operate as a piezoelectric at relatively high frequencies. In particular, the metalorganic precursors typically used to carry the dopant Sc) have relatively low vapor pressure, which can negatively affect the inclusion of the dopant into the AlN structure. Accordingly, sputtering is typically used to dope AlN with Sc to create competitive piezoelectric materials.

As further appreciated by the present inventors, a combination of co-dopants selected from Group II and Group IVA may be more compatible with a MOCVD process so as to form a sufficiently high crystallinity piezoelectric material in some embodiments. In particular, the combination of Group II and Group IVB co-dopant elements can be selected to both incorporate into the lattice structure of the Group III-N material and to maintain the charge neutrality of the resulting high crystallinity piezoelectric material. The charge neutrality of the Group II and Group IVA can improve the accuracy of, for example an acoustic resonator or filter, when an electric field is applied to the terminals of the device when operating.

Figure 60:
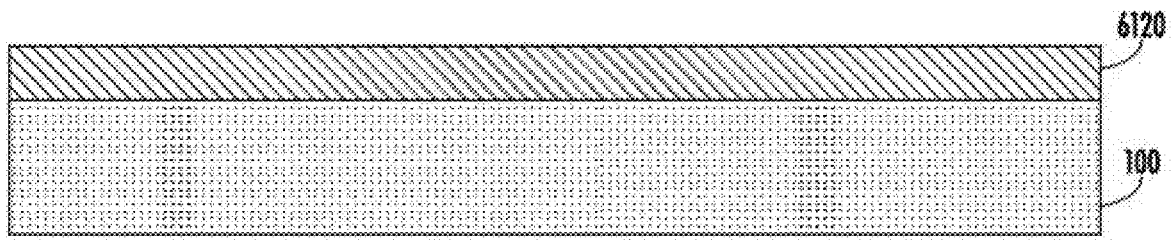
FIG. 60 is a cross-sectional view illustrating a high crystallinity piezoelectric thin film formed via MOCVD directly on a substrate in some embodiments according to the invention.

FIG. 60 is a cross-sectional view illustrating a high crystallinity piezoelectric thin film 6120 formed via MOCVD directly on a substrate 100 in some embodiments according to the invention. According to the FIG. 60, the high crystallinity piezoelectric thin film 6120 can be formed on a substrate 100 by co-doping a Group III-Nitride material with a Group II element selected from Group IIA or from Group IIB, along with the element selected from Group IVB to varyingly affect the device characteristics. Still further, the level (or concentrations) of doping with the selected Group II and Group IVB elements can be used to vary the coupling coefficient produced by the resulting doped Group III-N material. For example, in some embodiments, the Group III-N material can be AlN, the Group II material can be Mg (Group IIA) or Zn (Group IIB) whereas the Group IVB element can be Hf or Zr, which as described above are more amenable inclusion in the AlN material in a MOCVD process. It will be understood that the Group III-Nitride material can be GaN, InN, BN etc.

Still further, the range of impurity doping (including the Group II and Group IVB elements) can be from about 1E15 atoms/cm3 to about 1E21 atoms/cm3. In some embodiments, the doping can be performed to provide an alloy formation according to (Group II Group IVB)$_x$ Al$_{1-x}$N where $0.0001 < x < 0.5$. In some embodiments, in an AlN doped material, the doping can be in a range between about 1 atom % and about 30 atom % where a number of atoms of the Group II element phis a number of atoms of the Group IV element plus a number of atoms of aluminum is 100%.

Accordingly, in some embodiments according to the invention, the co-doped Group III-N piezoelectric material can be made with a crystallinity of less than about 1.5 degrees Full Width Half Maximum (FWHM) by x-ray diffraction. In some embodiments according to the invention, the co-doped Group III-N piezoelectric material can be made with a crystallinity of less than about 1.0 degree at Full Width Half Maximum (FWHM) to about 10 arcseconds at FWHM measured using X-ray diffraction (XRD). In some embodiments according to the invention, the co-doped Group III-N piezoelectric material can be made with a crystallinity in a range between about 1.0 degree at Full Width Half Maximum (FWHM) to about 0.5 degrees at FWHM measured using XRD.

Although piezoelectric devices (such as acoustic resonators and filters) are described herein, it will be understood that other types of devices can also be provided in some embodiments according to the invention. For example, in some embodiments the Group III-N material can be doped to provide power transistors (such as AlN on SiC), amplifiers, UV LEDs (ie., AlN for 280-100 nm wavelength), and the like.

In some embodiments according to the invention, the Group III-N material can be further doped with a third element, such as Si or Ga or In, so that the doped concentration of the third element is about 20% and a number of atoms of the third element plus the number of atoms of aluminum is 100%. In still further embodiments, the Group III-N material can be doped with only a second element selected from Group IIA or Group IIB.

Figure 61:
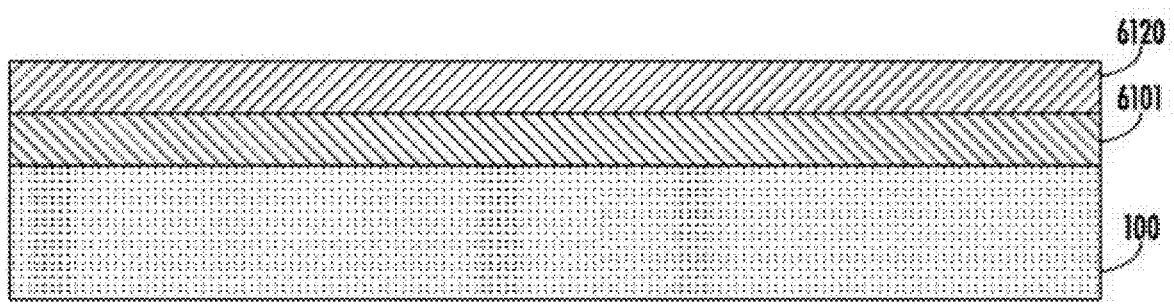
FIG. 61 is a cross-sectional view illustrating a high crystallinity piezoelectric thin film formed via MOCVD on a seed layer on the substrate in some embodiments according to the invention.

FIG. 61 is a cross-sectional view illustrating the high crystallinity piezoelectric thin film 6120 formed via MOCVD on a seed layer 6101 on the substrate 100 in some embodiments according to the invention. In some embodiments, a seed layer 6101 can be formed on the substrate 100 before forming the high crystallinity piezoelectric thin film 6120 so that the seed layer is located between the substrate 100 and the high crystallinity piezoelectric thin film 6120. In some embodiments, the seed layer 6101 includes one or more Group III elements that are also included in the piezoelectric thin film. For example, the seed layer can be formed to include Al if the piezoelectric thin film comprises AlN or to include Al and Mg if the high crystallinity piezoelectric thin film 6120 comprises MgTiAlN. Other Group III elements and seed layer components can also be used. In some embodiments, the seed layer 6101 can be followed using the same temperature used to form the high crystallinity piezoelectric thin film 6120.

In some embodiments, the seed layer 6101 can be formed at a temperature that is less than the temperature used to form the high crystallinity piezoelectric thin film 6120. In some embodiments, the seed layer 6101 may be formed at a temperature less than 400 degrees Centigrade whereas the temperature can be increased to more than 600 degrees Centigrade to about 800 Degrees centigrade when forming, the piezoelectric thin film via MOCVD. In some embodiments, the seed layer 6101 may be formed at a temperature less than 400 degrees Centigrade whereas the temperature can be increased to about 400 degrees Centigrade to about 600 Degrees centigrade when forming the piezoelectric thin film via sputtering. In some embodiments, the seed layer can include Al and the high crystallinity piezoelectric thin film 6120 can be formed of AlN.

Figure 62:
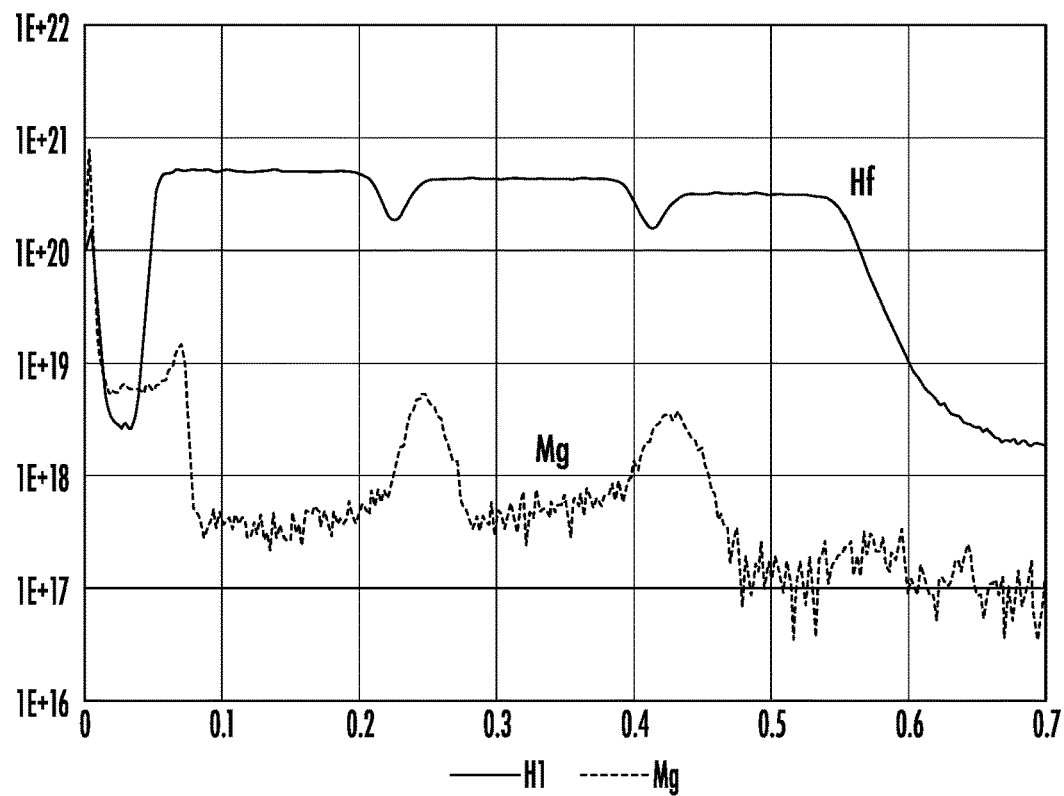
FIG. 62 is a graph illustrating relative amounts of illustrative co-dopants, Hf and Mg, formed via MOCVD on a surface when respective precursors carrying the co-dopants are introduced concurrently into a CVD reaction chamber.

FIG. 62 is a graph illustrating relative amounts of illustrative co-dopants, Hf and Mg, formed via MOCVD on a surface when respective precursors carrying the co-dopants are introduced concurrently into a CVD reaction chamber. According to FIG. 62, as appreciated by the present inventors, if the Hf and Mg precursors are introduced to the MOCVD reaction chamber concurrently, the Mg may remain on the surface and may only incorporate into the film when the introduction, of both the Hf and Mg into the MOCVD reaction chamber is interrupted whereas the precursors for the Al and the N flow continuously.

Figure 63:
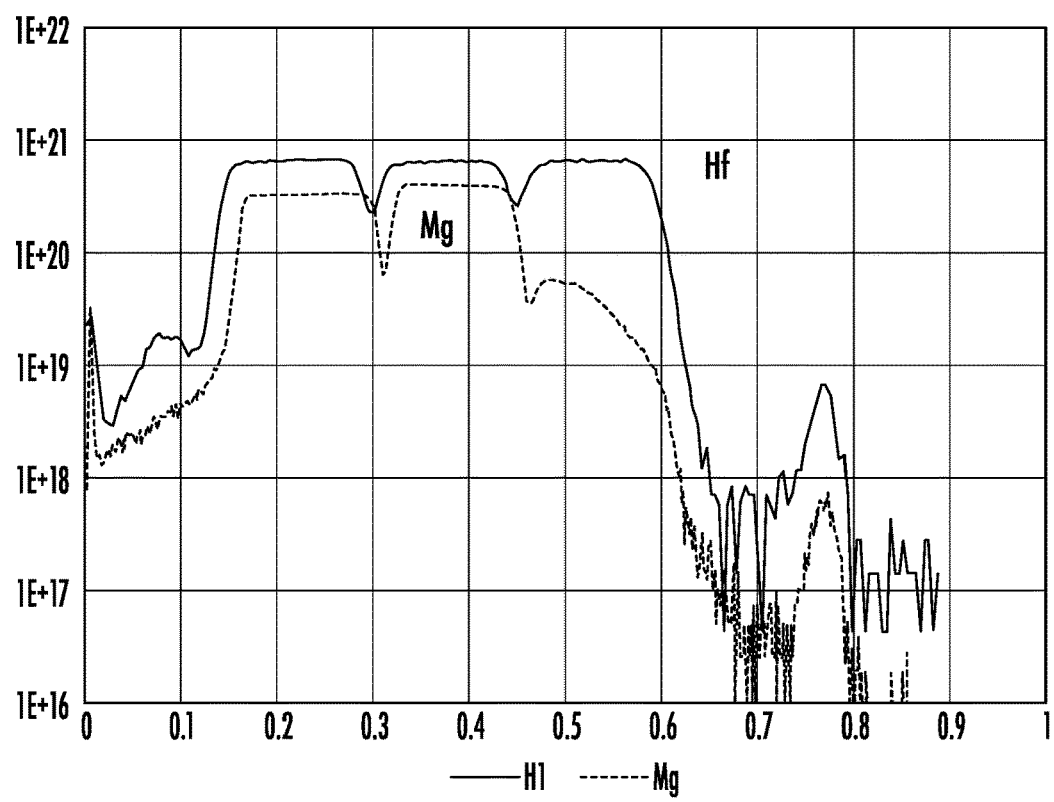
FIG. 63 is a graph illustrating relative amounts of illustrative co-dopants, Hf and Mg, formed via MOCVD on a surface when respective precursor carrying the co-dopants are introduced alternatingly into a CVD reaction chamber in some embodiments according to the invention.

FIG. 63 is a graph illustrating relative amounts of illustrative co-dopants, Hf and Mg, formed via MOCVD on a surface when respective precursors carrying the co-dopants are introduced alternatingly into a CVD reaction chamber in some embodiments according to the invention. In contrast to FIG. 62, in some embodiments according to FIG. 63, when the precursors of the Hf and Mg are introduced separately, into the MOCVD reaction chamber, both Hf and Mg are incorporated into the greater amounts compared to FIG. 62. In particular, in the arrangement illustrated in FIG. 63, the Hf precursor was introduced into the MOCVD reaction chamber for a time interval of 2 seconds and then stopped. The first interval was followed by a second time interval where the Mg precursor was introduced into the MOCVD reaction chamber followed. It will be understood that the precursors for the Al and the N can flow continuously during the first and second time intervals. In some embodiments, the precursors for the Al and the N can be pulsed in during either one of the time intervals. For example, Hf, Al, and N may be introduced during the first interval whereas Mg and N may be introduced during the second interval.

Figure 64:
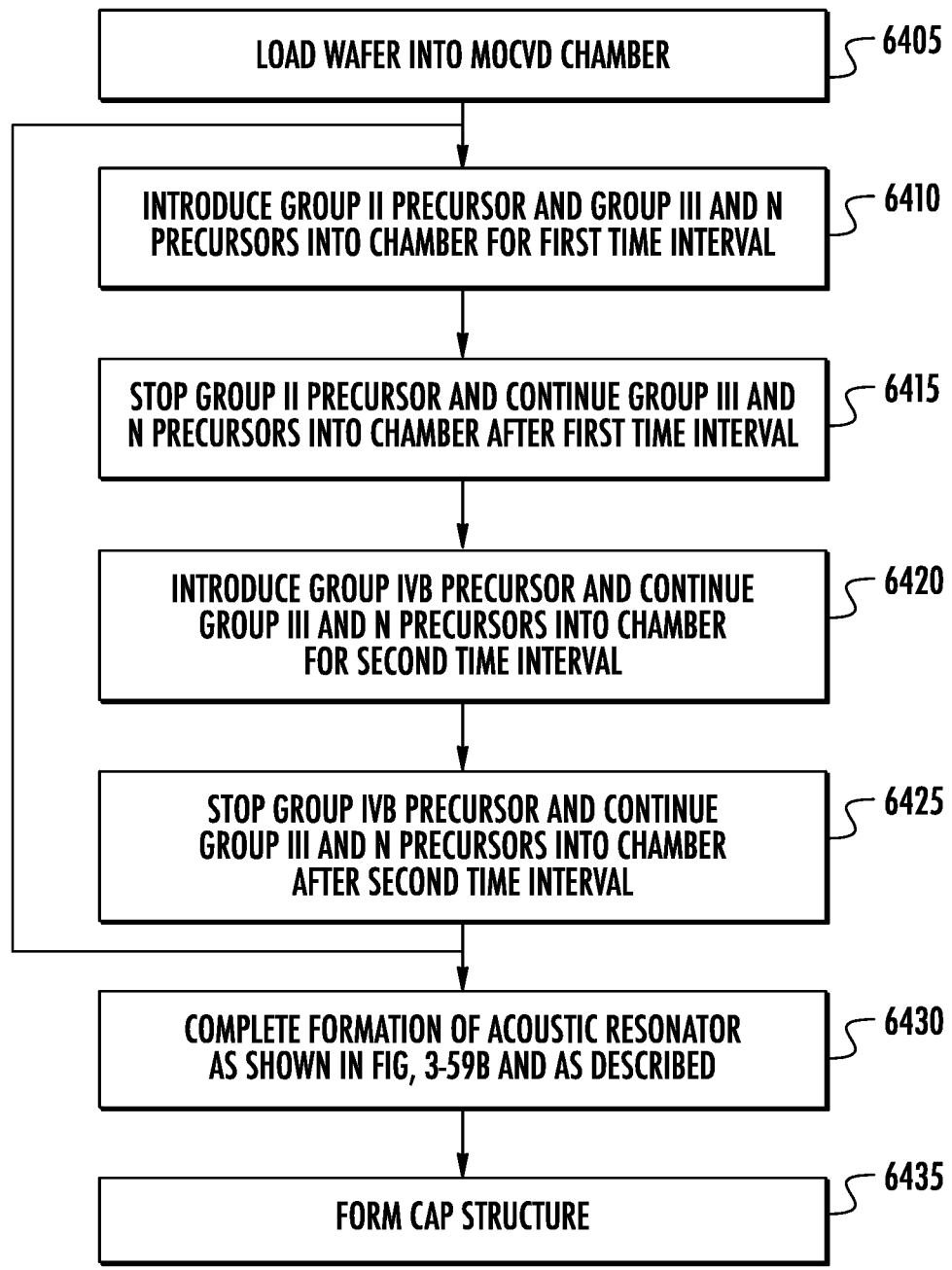
FIG. 64 is a flowchart illustrating methods of forming a high crystallinity piezoelectric thin film via MOCVD to provide the piezoelectric layer described herein in reference to, for example, FIG. 2 in some embodiments according to the invention.

FIG. 64 is a flowchart illustrating methods of forming a high crystallinity piezoelectric thin film 6120 via MOCVD to provide the piezoelectric layer described herein in reference to, for example, FIG. 2 in some embodiments according to the invention. According to FIG. 64, a wafer is loaded into the MOCVD reaction chamber (block 6405). The Group II element precursor is introduced into the MOCVD reaction chamber for a first time interval. The Group III and N precursors are also introduced into the MOCVD reaction chamber during the first time interval to allow the Group II element to be incorporated into the Group III-N material being formed in the chamber (block 6410). It will be understood that the Group II element can be selected from Group IIA or from Group IIB as described herein.

The introduction of the Group II element precursor into the MOCVD reaction chamber can be stopped after the first interval whereas the Group III and N precursors continue to flow into the MOCVD reaction chamber (block 6415). In some embodiments, the Group IVB element precursor is introduced into the MOCVD reaction chamber after the first time interval and continues for a second time interval to allow the Group IVB element to be incorporated into the Group III-N material along with the Group II element. The Group III and N precursors continue to be introduced into the MOCVD reaction chamber during the second, time interval (block 6420). In some embodiments, an intervening interval can be introduced between the first and second time intervals where neither the Group II element nor the Group IVB element flows into the reaction chamber during the intervening interval.

After the second time interval the introduction of the Group IVB element precursor into the MOCVD reaction chamber can be stopped whereas the Group III and N precursors continue to flow into the MOCVD reaction chamber (block 6425). The process can be repeated until the desired level of the Group II and Group IVB elements are provided in the Group III-N material so as the provide the desired level of crystallinity (block 6410). It will be understood that in some embodiments, the operations performed in blocks 6410 and 6425 can be reversed.

An acoustic resonator device can be formed to incorporate the high crystallinity piezoelectric film as described herein (block 6430) and an AlGaN cap structure can be formed overlying the co-doped Group III-N material (block 6435). In some embodiments, the AlGaN cap structure can be $Al_{0.2}Ga_{0.8}N$.

In still other embodiments according to the invention, the introduction of the Group II precursor is not completely stopped after the first time interval and may continue to flow into the MOCVD reaction chamber when the Group IV precursor flows during the second time interval. Still further, the Group IV precursor may continue to flow into the MOCVD reaction chamber after the end of the second time interval and during the first time interval. It will be understood that the level of the Group II precursor that flows into the MOCVD reaction chamber during the second time interval is such that the Group IVB precursor dominates the Group II precursor to allow the incorporation of the Group IVB element into the Group III-N material in a sufficient amount despite the presence of the Group II precursor. Similarly, it will be understood that the level of the Group IVB precursor that flows into the MOCVD reaction chamber during the first time interval is such the Group II precursor dominates the Group IVB precursor to allow the incorporation of the Group II element into the Group III-N material in a sufficient amount despite the presence of the Group IVB precursor.

In some embodiments, the Group II precursor comprises Cp2Mg so that Mg is incorporated into the AlN material and the Group IVB precursor comprises TDMAHf so that Hf is incorporated into the AlN material (along with the Mg). Still further, the MOCVD reaction chamber is maintained at a temperature in a range between about 800 C and about 1200 C, and at a pressure of about 60 mbar, in an H2 ambient environment.

Figure 65:
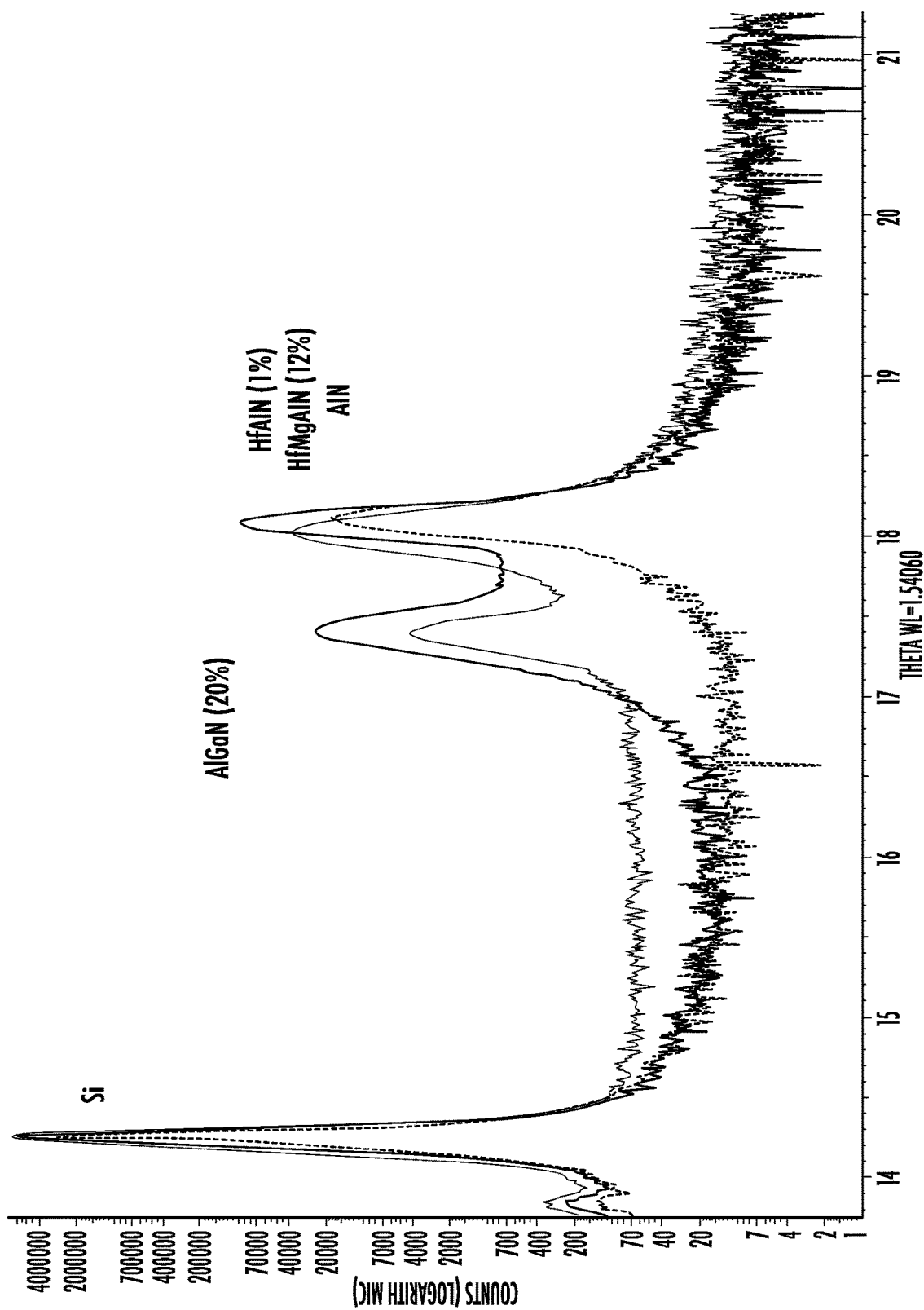
FIG. 65 is a graph illustrating experimental XRD measurements of different piezoelectric thin film materials formed using MOCVD to include different percentages of non-Al (Hf and Mg) dopants in some embodiments according to the invention.

FIG. 65 is a graph illustrating experimental XRD measurements of different fabricated piezoelectric thin film materials formed using MOCVD to include different percentages of non-Al (Hf and Mg) dopants in some embodiments according to the invention. According to FIG. 65, $(Hf_{0.5}Mg_{0.5})_{0.12}Al_{0.88}N$ was formed as described herein and subjected to XRD. As shown, the $(Hf_{0.5}Mg_{0.5})_{0.12}Al_{0.88}N$ was measured at about 1.1 degrees at FWHM using XRD.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
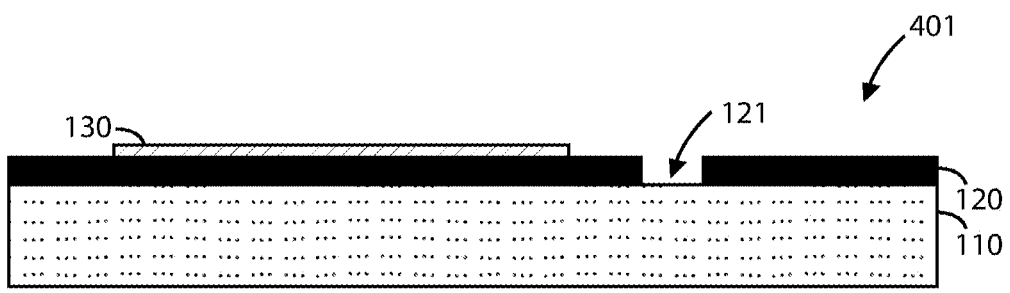
FIG. 4A is a simplified diagram illustrating a step for a method creating a topside micro-trench according to an example of the present invention.
Figure 4B:
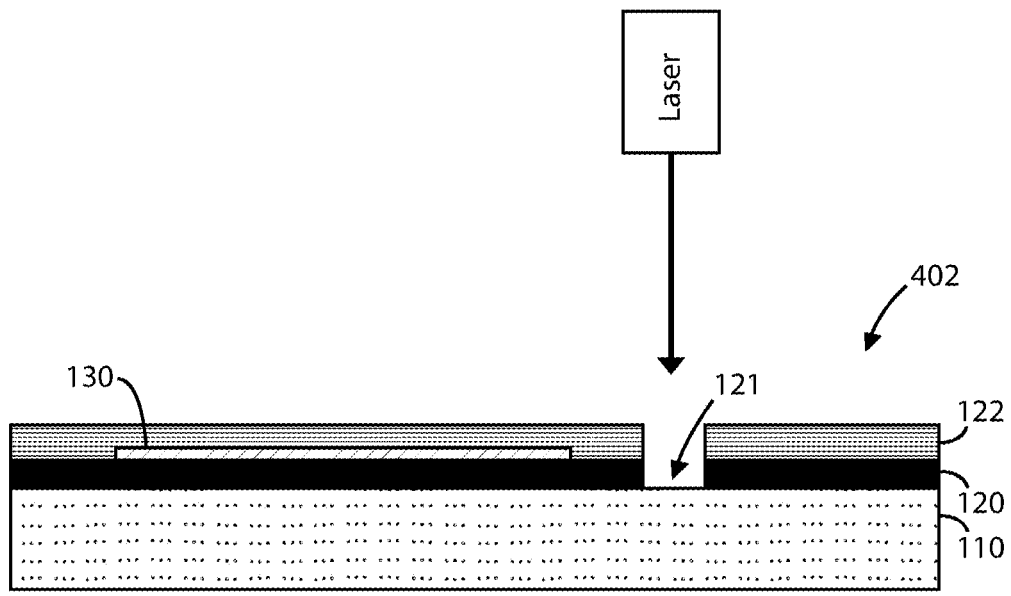
FIGS. 4B and 4C are simplified diagrams illustrating alternative methods for conducting the method step of forming a topside micro-trench as described in FIG. 4A.
Figure 4C:
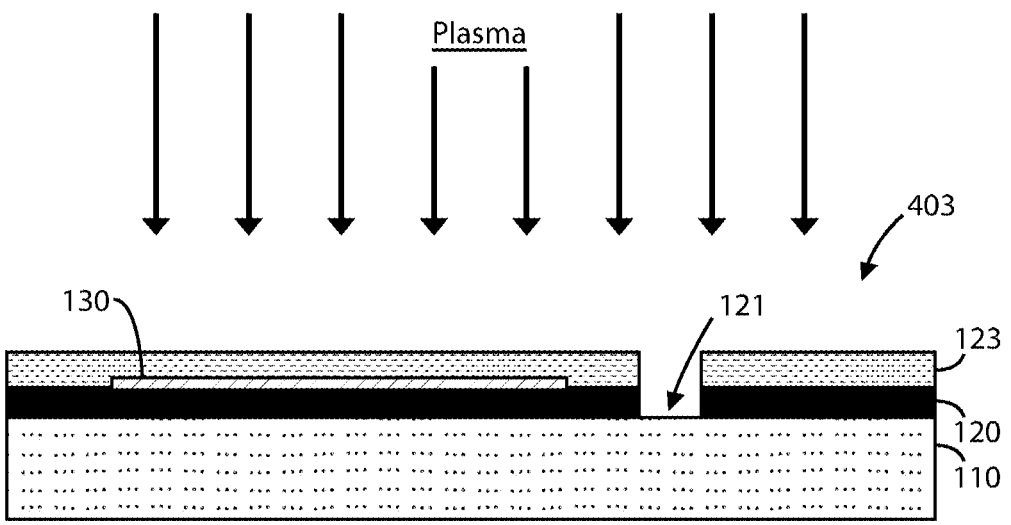

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
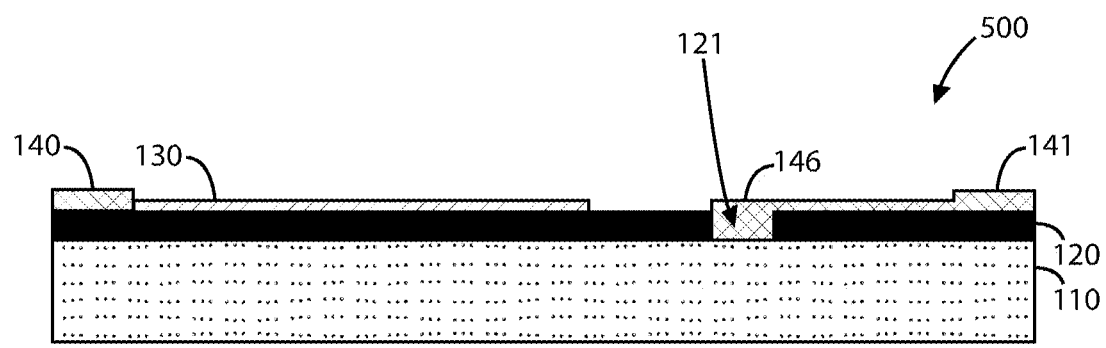
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lilt-off process, a wet etching process, a dry etching process, a screen-printing process, an electroplating process, a metal printing process, or the like. In a specific example, the deposited metal materials can also serve as bond pads for a cap structure, which will be described below.

Figure 6:
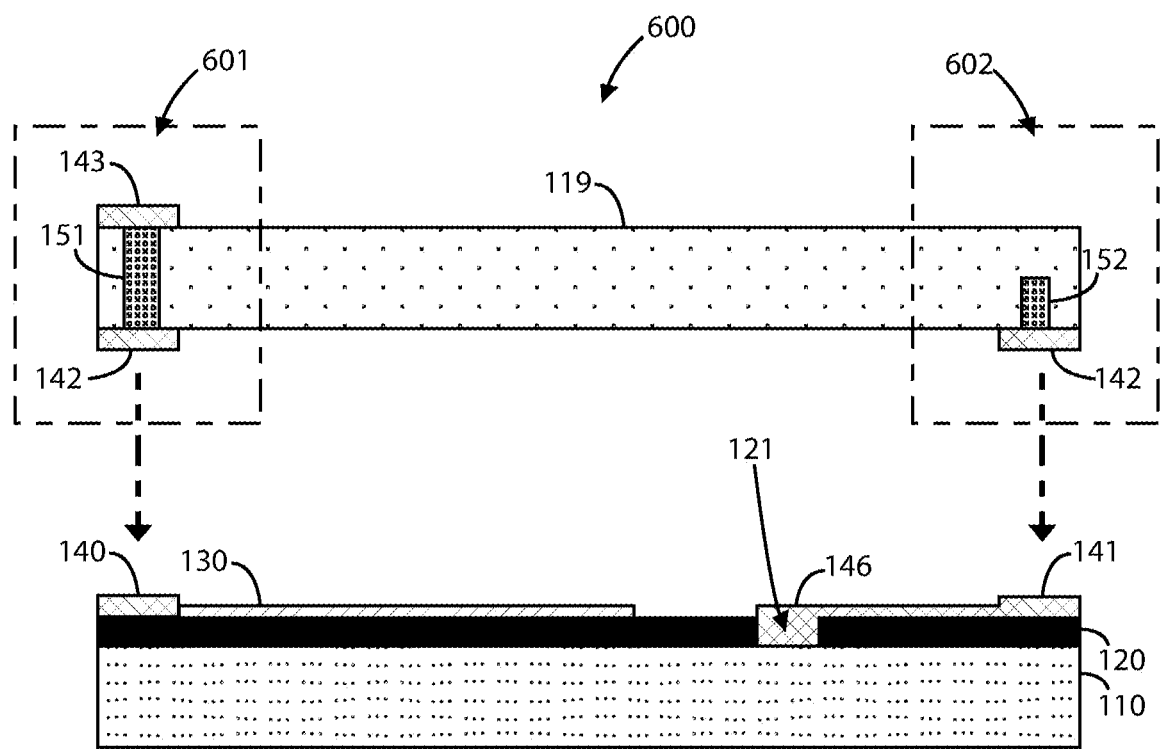

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
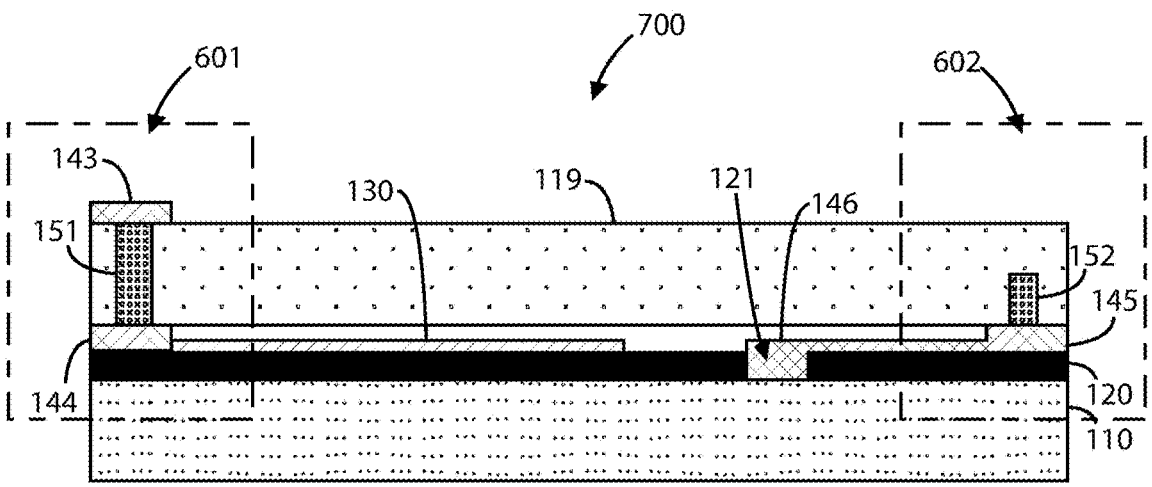
Figure 8:
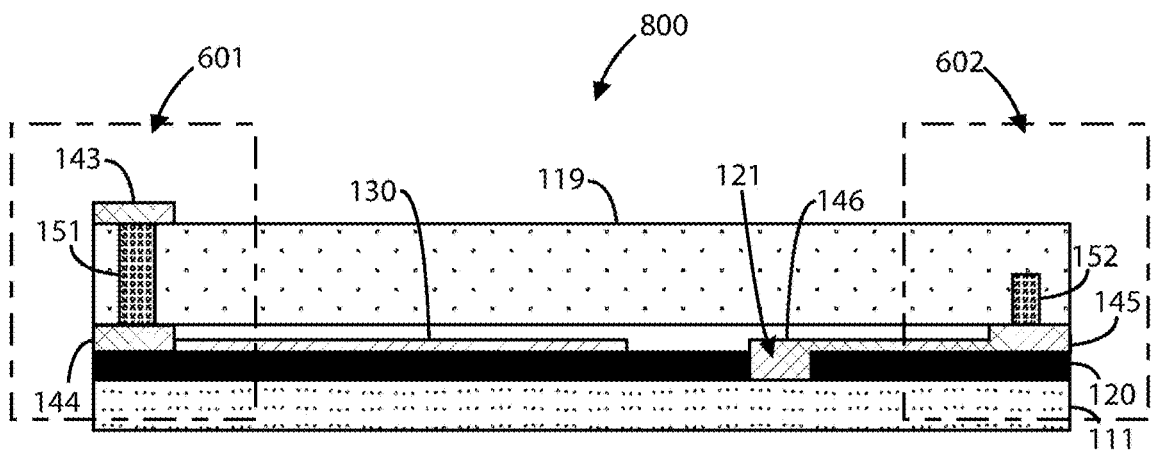

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or, the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
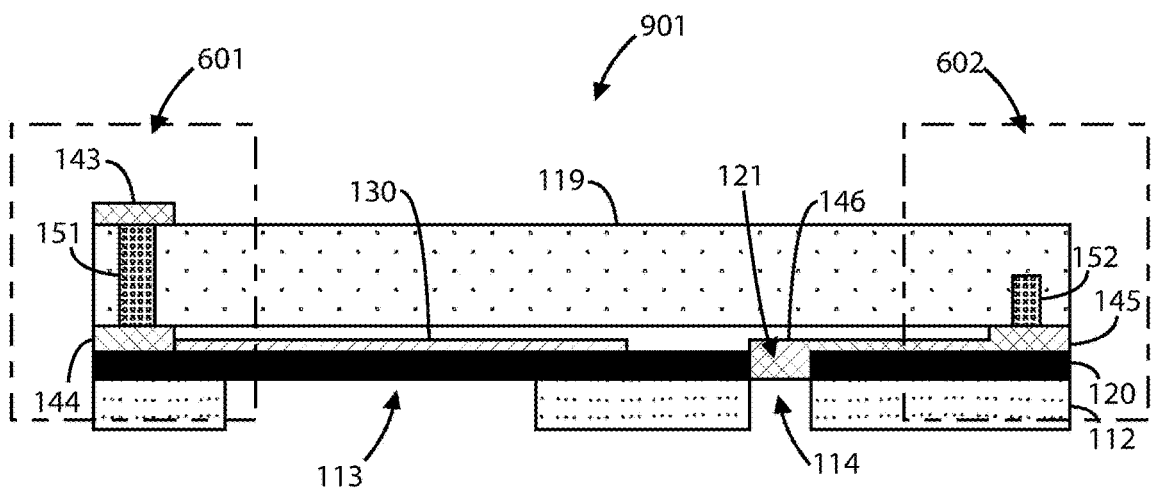
FIG. 9A is a simplified diagram illustrating, a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to cingulate the backside wafer 112.

Figure 10:
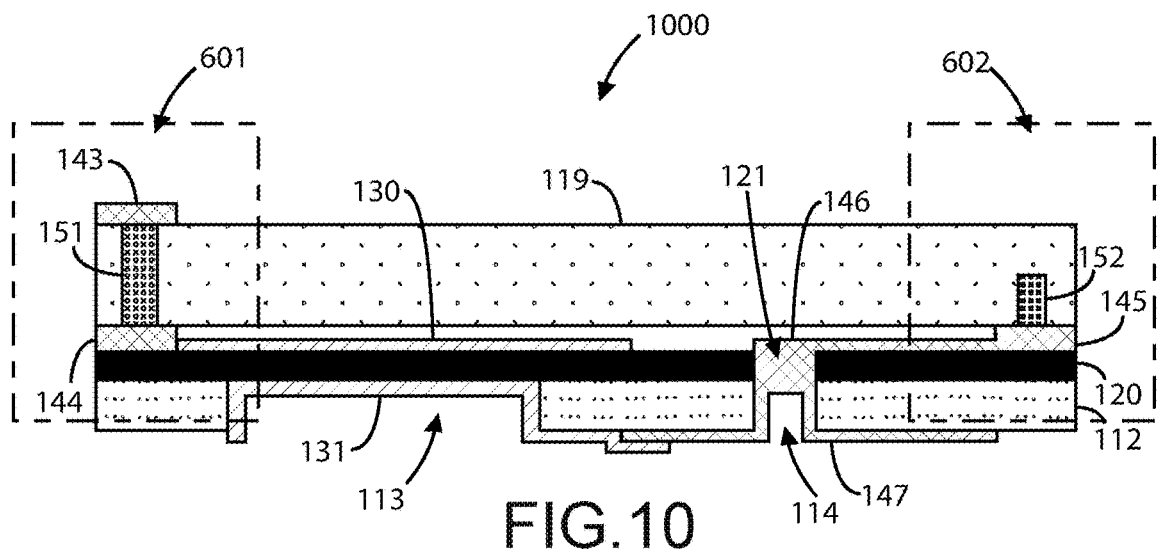
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
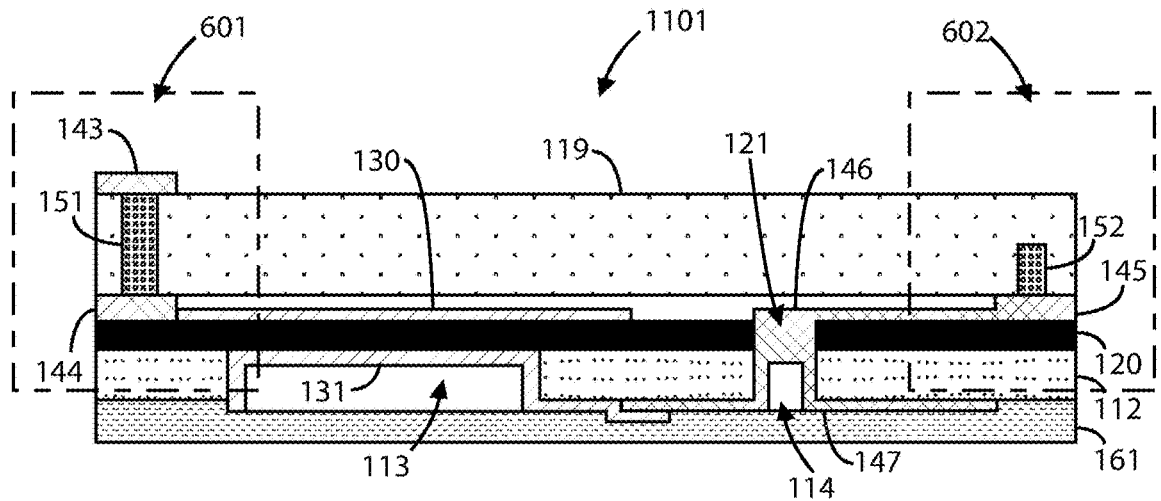
FIGS. 11A and 11B are simplified diagrams illustrating alternative steps for a method of manufacture for an acoustic resonator device according to an example of the present invention.
Figure 11B:
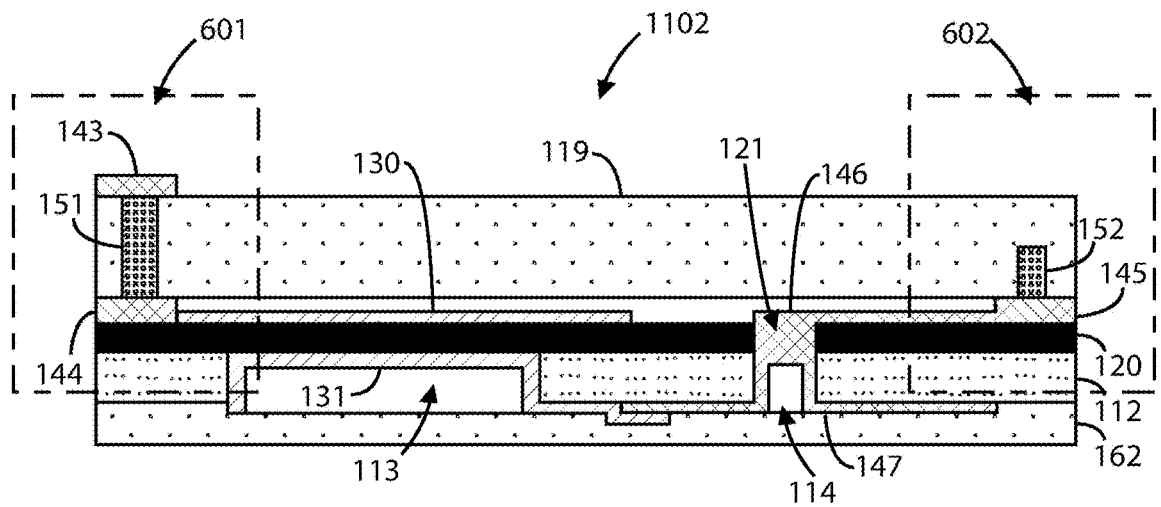

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder, mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
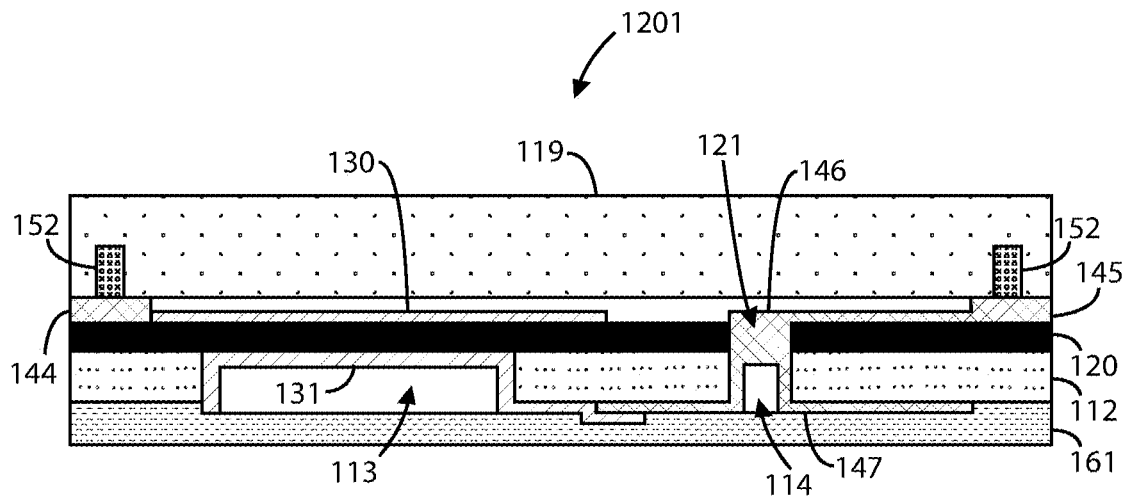
FIGS. 12A to 12E are simplified diagrams illustrating steps for a method of manufacture for an acoustic resonator device using a blind via interposer according to an example of the present invention.
Figure 12B:
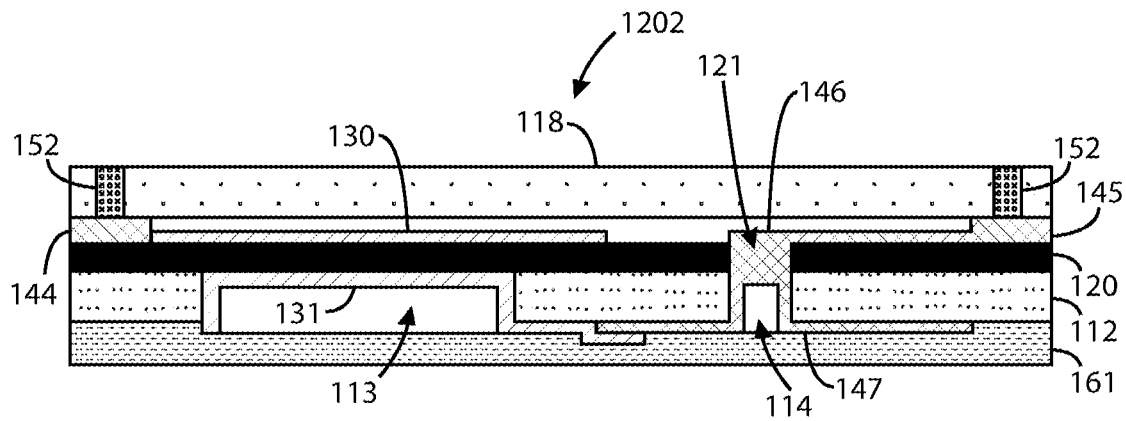
Figure 12C:
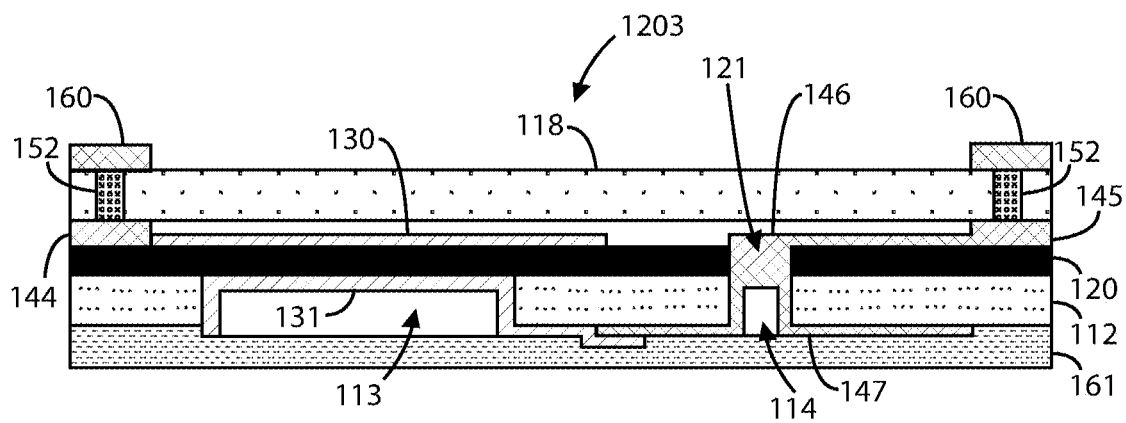
Figure 12D:
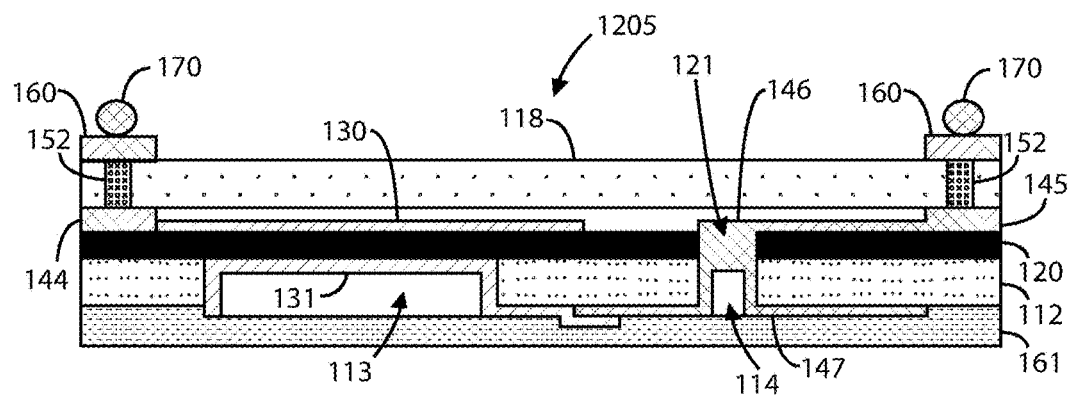
Figure 12E:
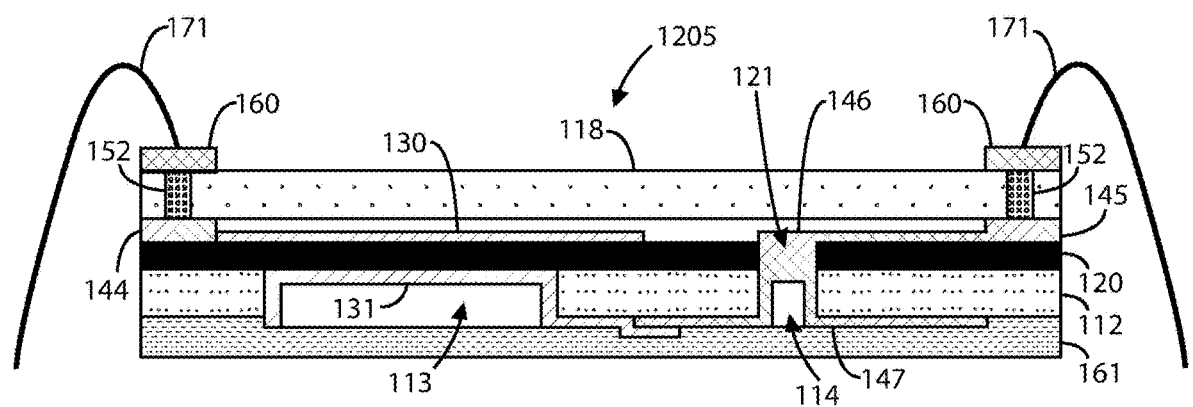

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process, and metallization process can be, applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
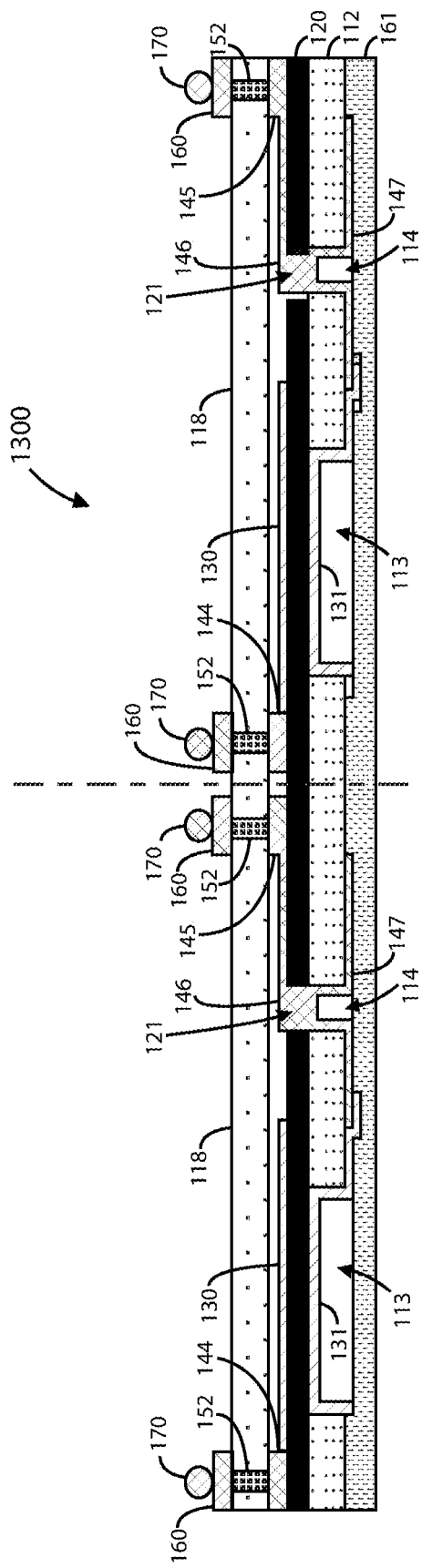
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
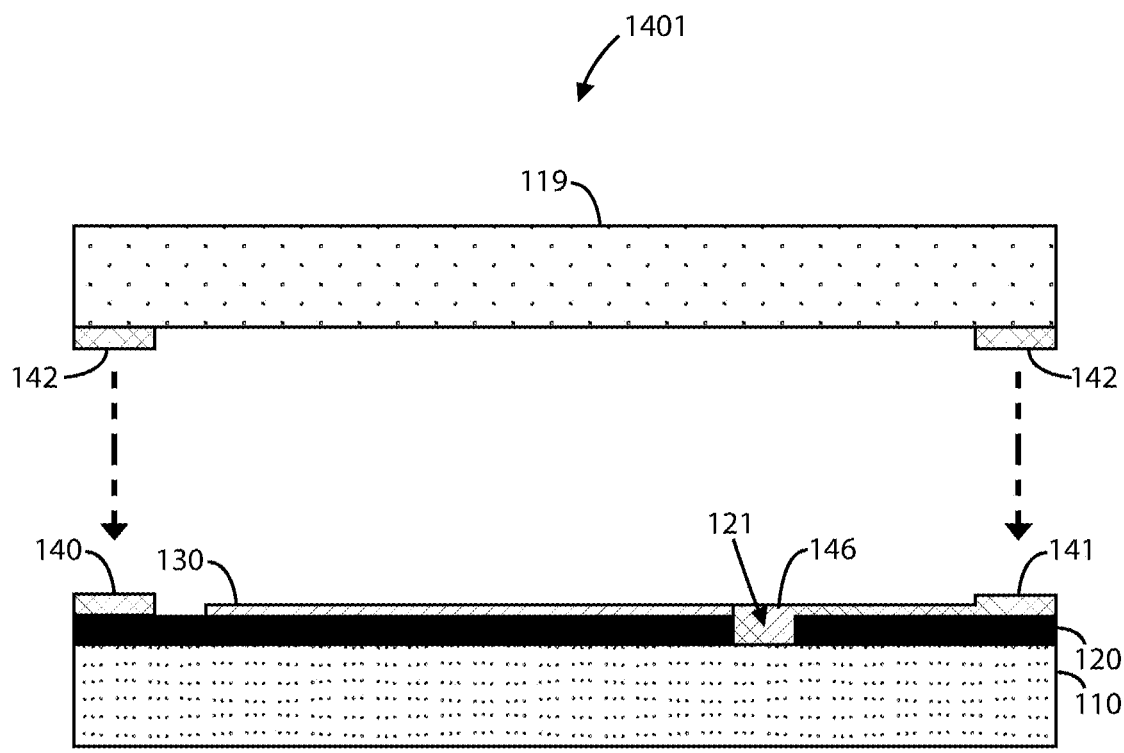
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap, structure substrate 119 and only includes one layer of metallization with one or more bottom bond pads 142. Compared FIG. 6 there are no via structures in the top cap structure because the interconnections will be formed on the bottom side of the acoustic resonator device.

Figure 14B:
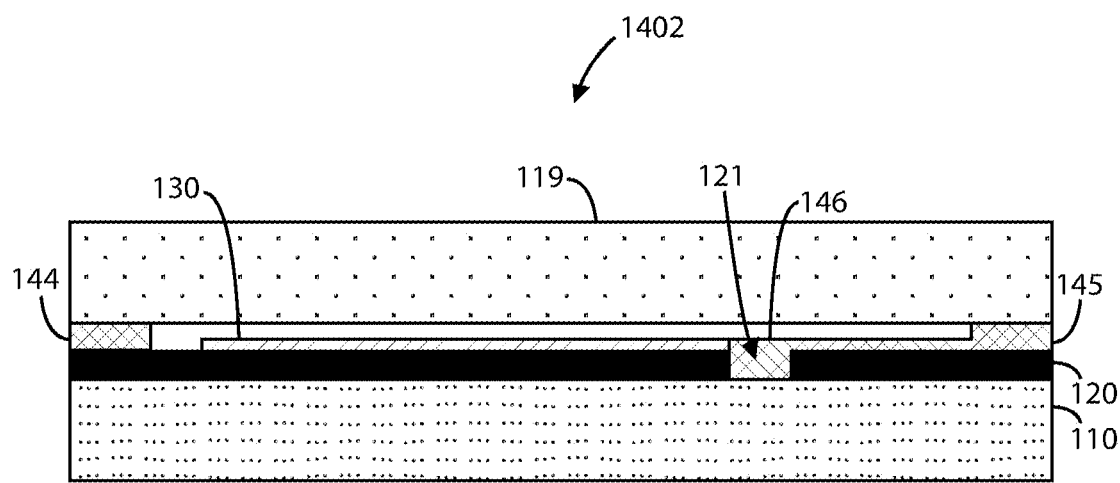
Figure 14C:
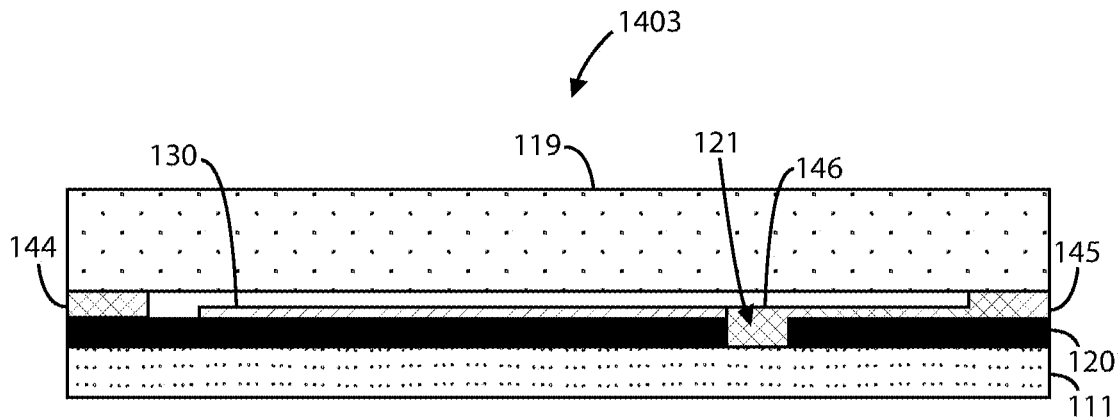
Figure 14D:
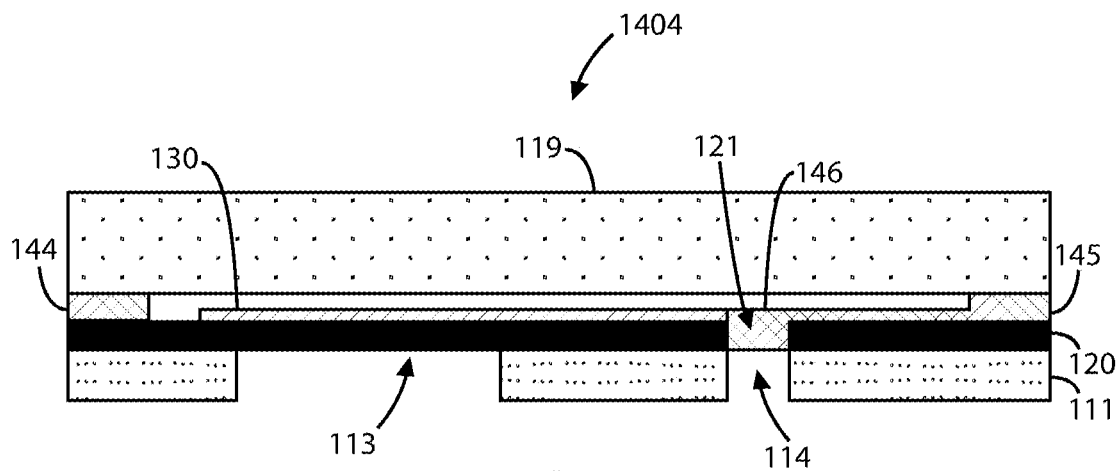
Figure 14E:
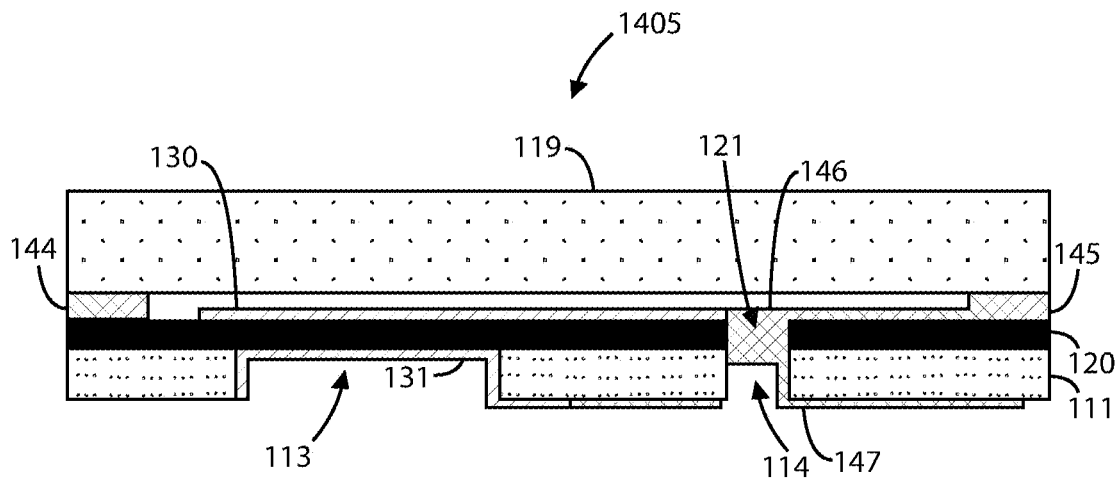
Figure 14F:
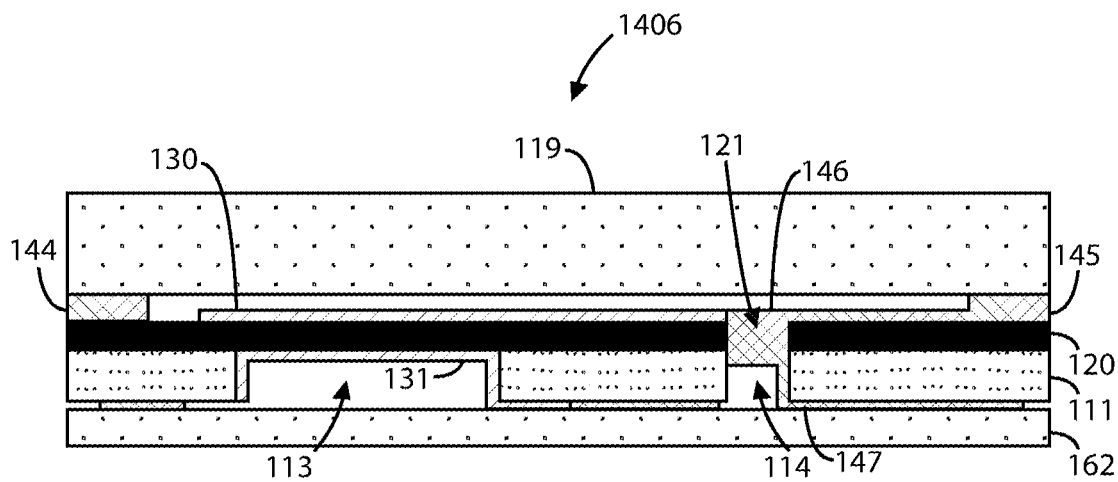

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
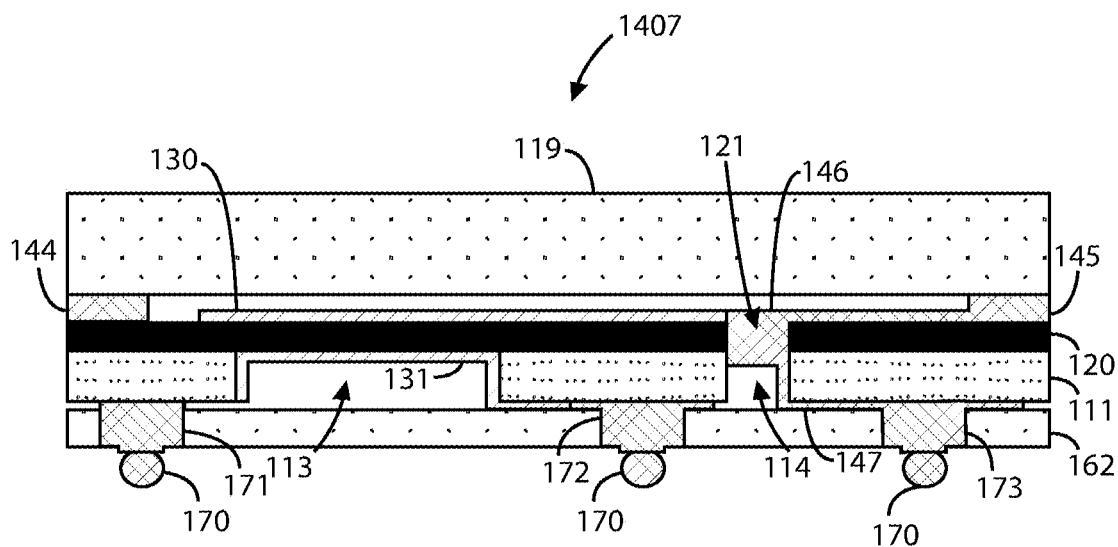

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
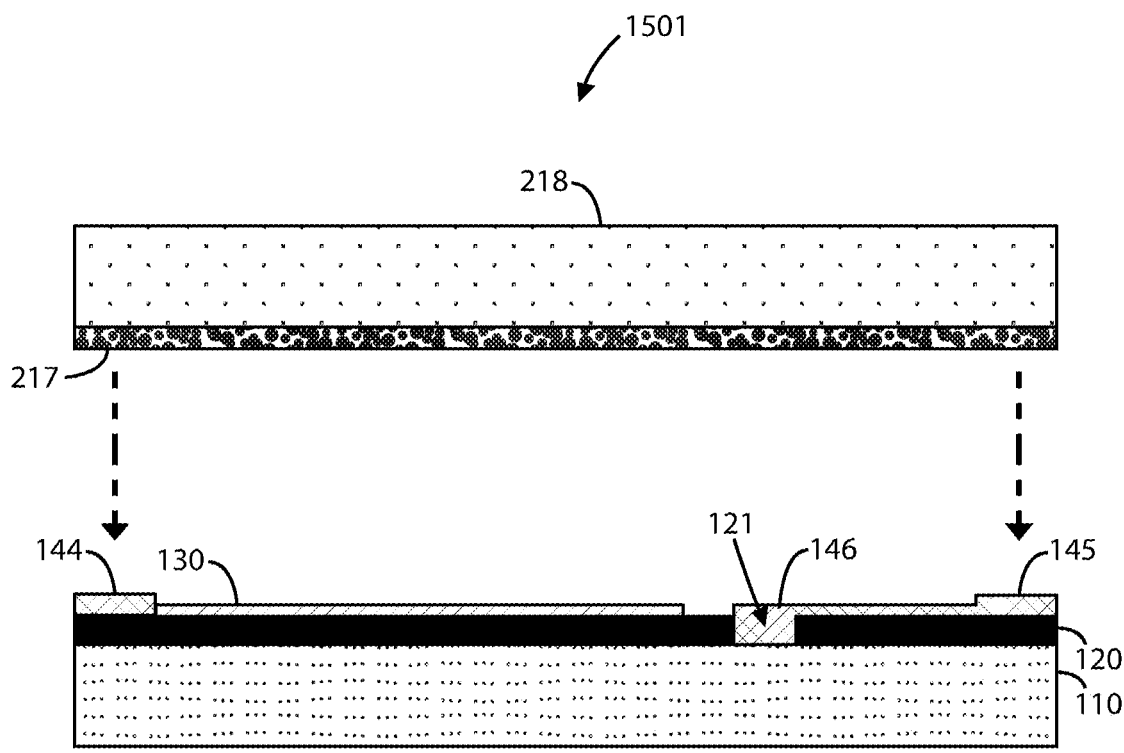
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
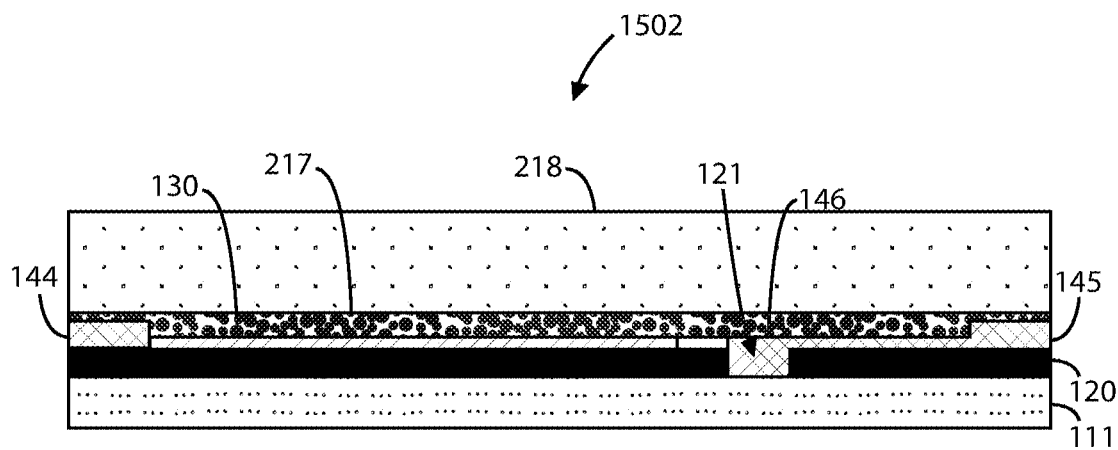

FIGS. 15B to 15F depict method steps similar to those described in the first, process flow. FIG. 15B can represent a method step of thinning the seed substrate 110, which forms a formed substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
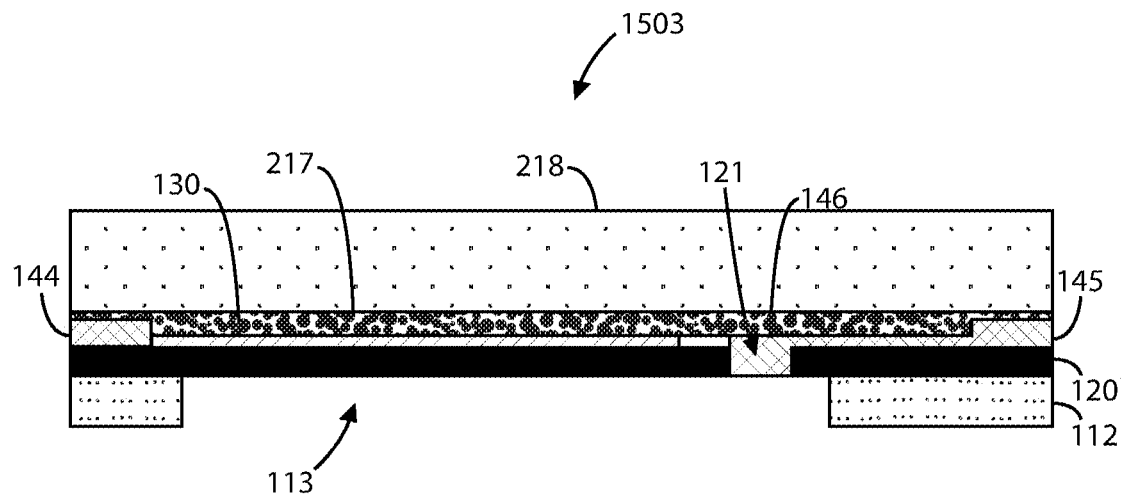

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
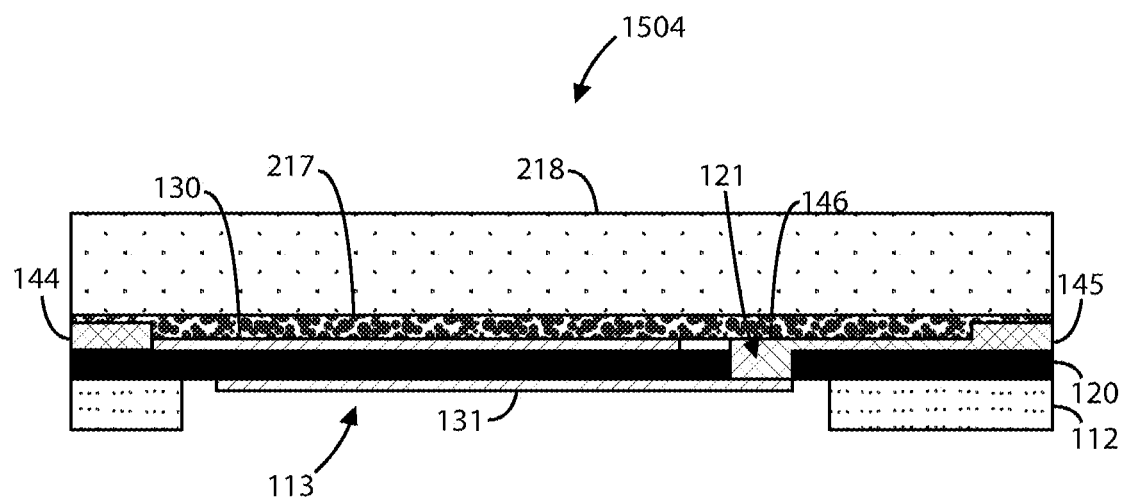

FIG. 15D can represent, a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
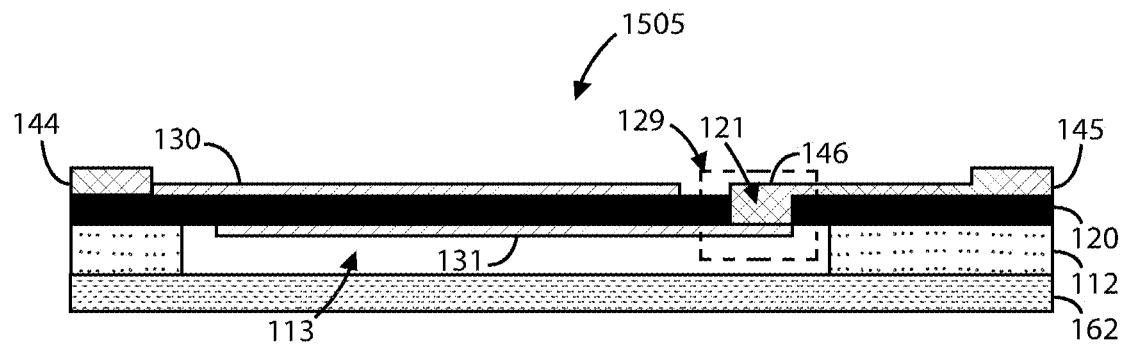

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave resonators (BAWR), widely used in such filters operating at frequencies around 3 GHz and lower, are leading candidates for meeting such demands. Current bulk acoustic wave resonators use polycrystalline piezoelectric AlN thin films where each grain's c-axis is aligned perpendicular to the film's surface to allow high piezoelectric performance whereas the grains a- or b-axis are randomly distributed. This peculiar grain distribution works well when the piezoelectric film's thickness is around 1 um and above, which is the perfect thickness for bulk acoustic wave (BAW) filters operating at frequencies ranging from 1 to 3 GHz. However, the quality of the polycrystalline piezoelectric films degrades quickly as the thicknesses decrease below around 0.5 um, which is required for resonators and filters operating at frequencies around 5 GHz and above.

Single crystalline or epitaxial piezoelectric, thin films grown on compatible crystalline substrates exhibit good crystalline quality and high piezoelectric performance even down to very thin thicknesses, e.g., 0.4 um. The present invention provides manufacturing processes and structures for high quality hulk acoustic wave resonators with single crystalline or epitaxial piezoelectric thin films for high frequency BAW filter applications.

BAWRs require a piezoelectric material, e.g., AlN, in crystalline form, i.e., polycrystalline or single crystalline. The quality of the film heavy depends on the chemical, crystalline, or topographical quality of the layer on which the film is grown. In conventional BAWR processes (including film bulk acoustic resonator (FBAR) or solidly mounted resonator (SMR) geometry), the piezoelectric film is grown on a patterned bottom electrode, which is usually made of molybdenum (Mo), tungsten (W), or ruthenium (Ru). The surface geometry of the patterned bottom electrode significantly influences the crystalline orientation and crystalline quality of the piezoelectric film, requiring complicated modification of the structure.

Thus, the present invention uses single crystalline piezoelectric films and thin film transfer processes to produce a BAWR with enhanced ultimate quality factor and electromechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers, limit Q in high frequency. Also, growing epitaxial piezoelectric layers on patterned electrodes affects the crystalline orientation of the piezoelectric layer, which limits the ability to have tight boundary control of the resulting resonators. Embodiments of the present invention, as further described below, can overcome these limitations and exhibit improved performance and cost-efficiency.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating, widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 16C:
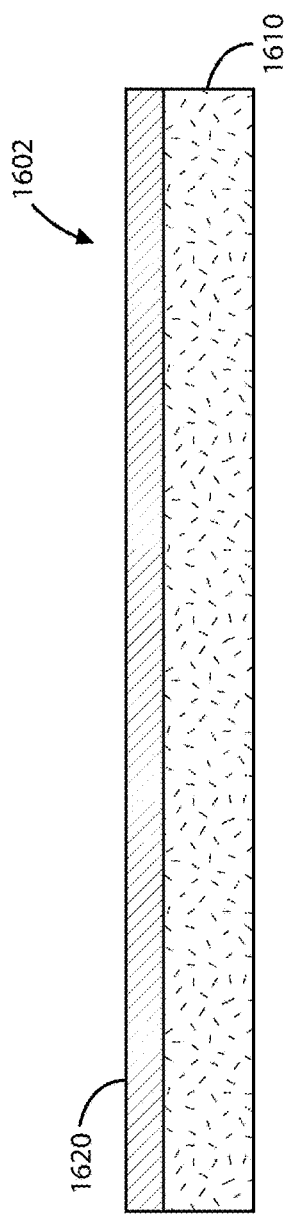
Figure 16A:
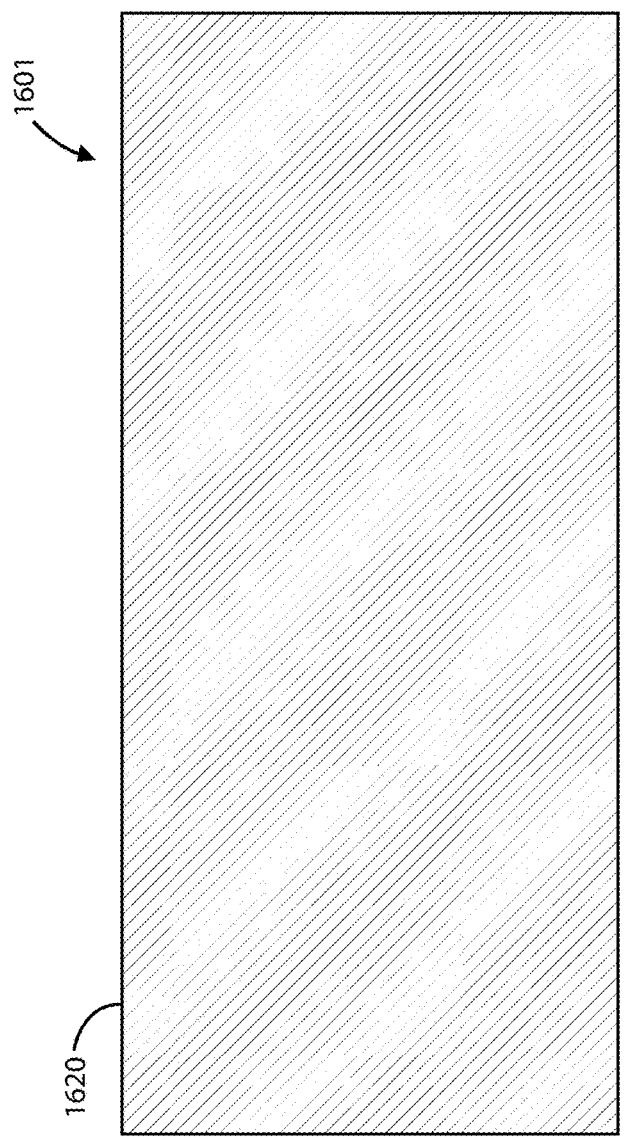
Figure 16B:
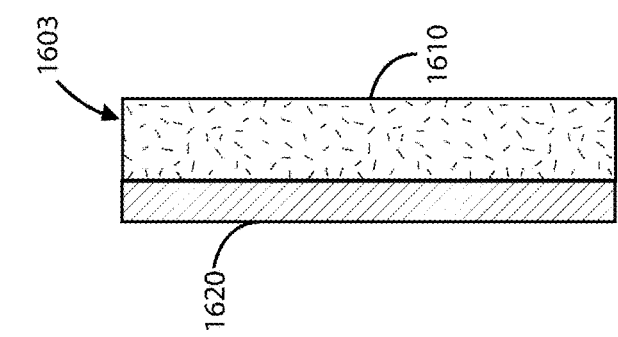

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric film 1620 overlying a growth substrate 1610. In an example, the growth substrate 1610 can include silicon (S), silicon carbide (SiC), or other like materials. The piezoelectric film 1620 can be an epitaxial film including aluminum nitride (AlN), gallium nitride (GaN), or other like materials. Additionally, this piezoelectric substrate can be subjected to a thickness trim.

Figure 17C:
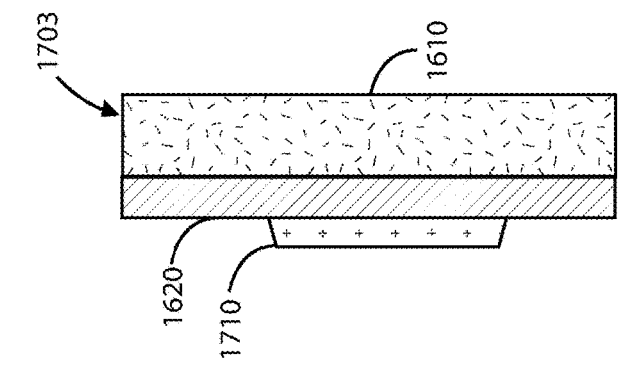
Figure 17A:
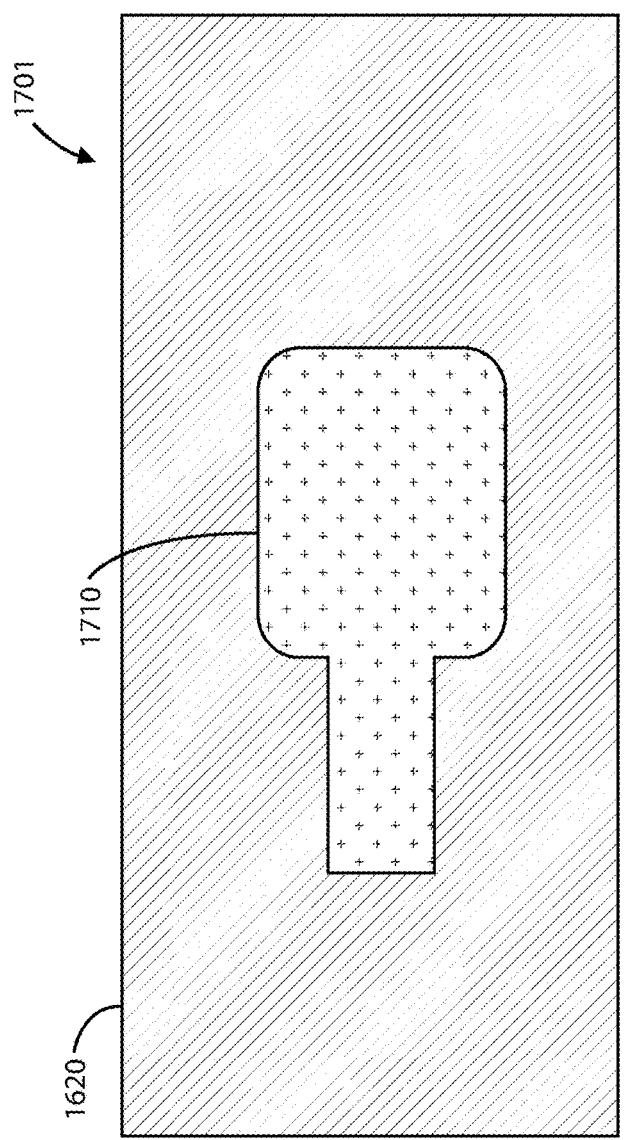
Figure 17B:
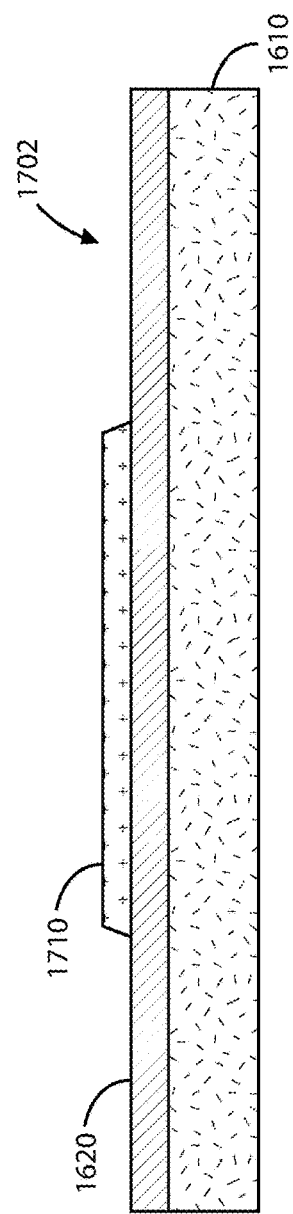

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

Figure 18C:
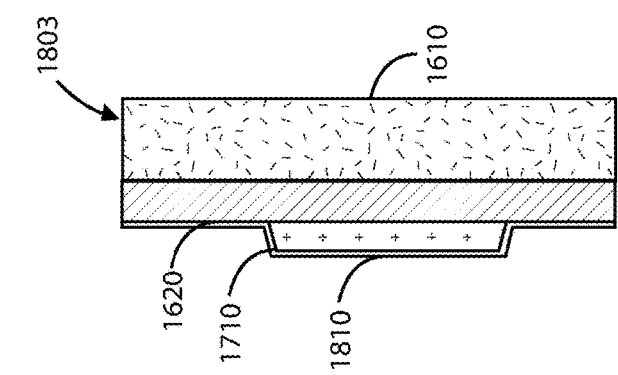
Figure 18A:
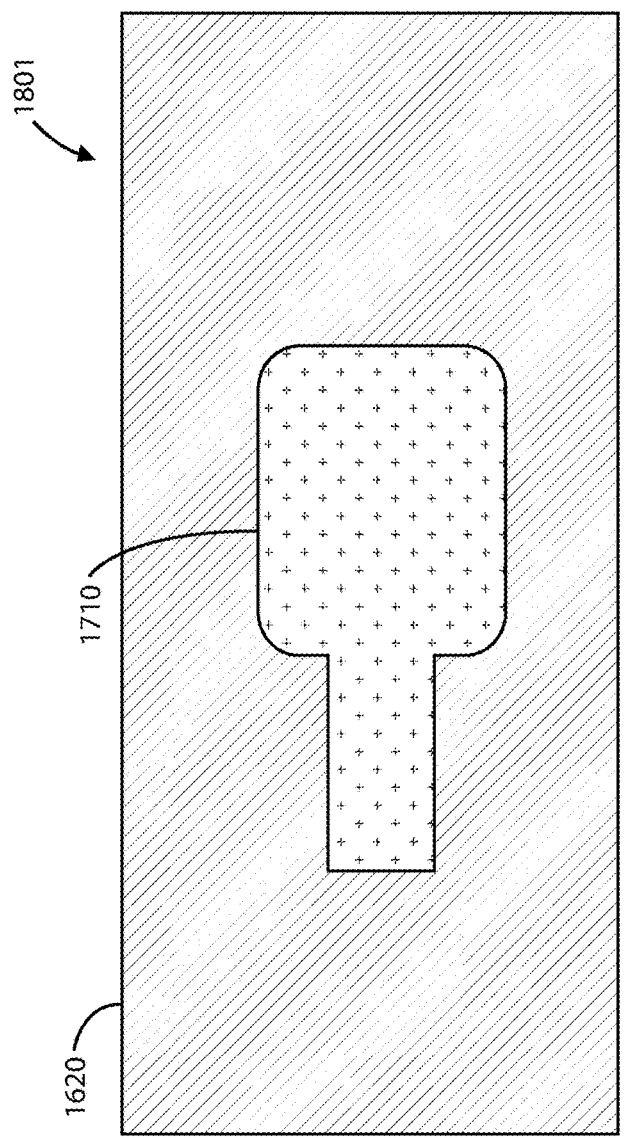
Figure 18B:
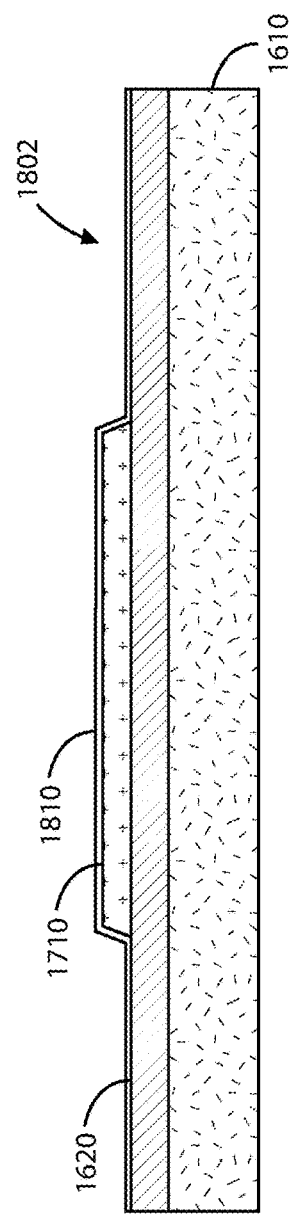

FIGS. 18A-18C are simplified diagrams illustrating various cross-sectional, views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric film 1620. In an example, the first passivation layer 1810 can include silicon nitride (SiN), silicon oxide (SiOx), or other like materials. In a specific example, the first passivation layer 1810 can have a thickness ranging from about 50 nm to about 100 nm.

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch, with a slope and be deposited with a thickness of about 1 um. Further, phosphorous doped $SiO_2$ (PSG) can be used as the sacrificial layer with different combinations of support layer (e.g., SiNx).

Figure 20C:
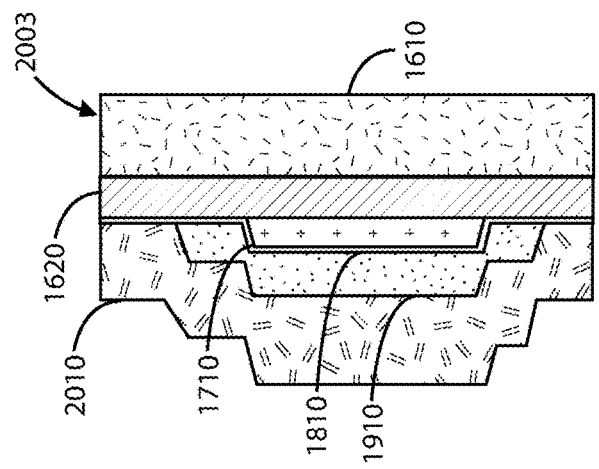
Figure 20A:
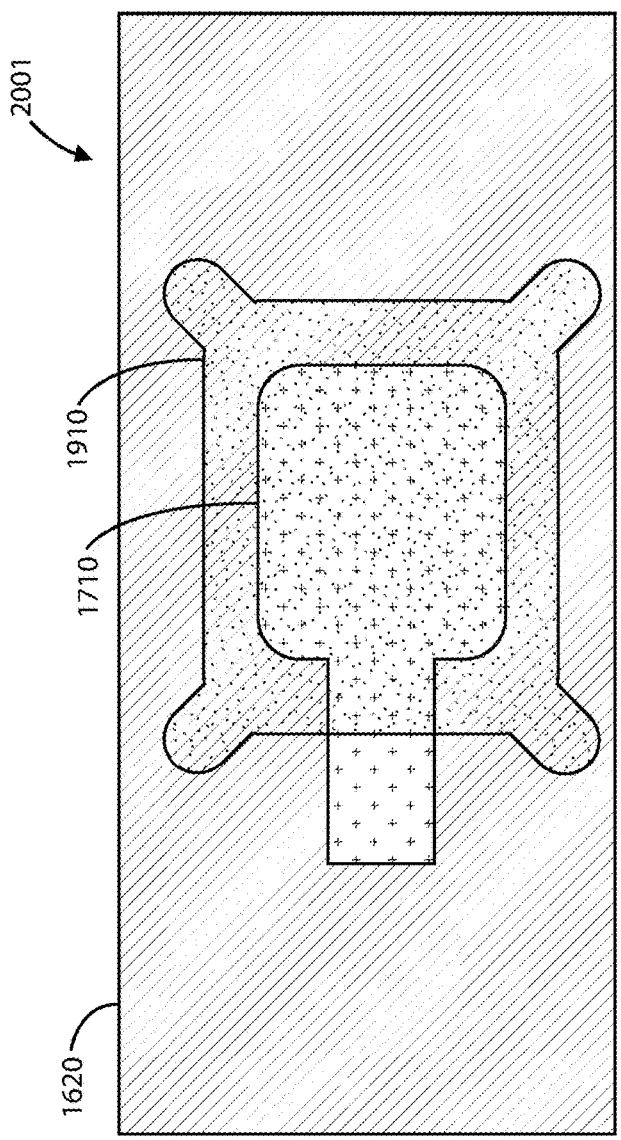
Figure 20B:
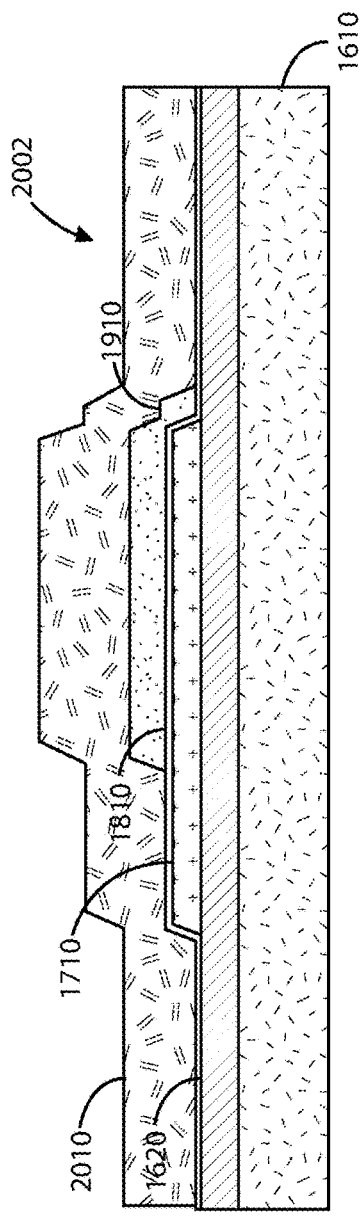

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric film 1620. In an example, the support layer 2010 can include silicon dioxide ($SiO_2$), silicon nitride (SiN), or, other like materials. In a specific example, this support layer 2010 can be deposited with a thickness of about 2-3 um. As described above, other support layers (e.g., SiNx) can be used in the case of a PSG sacrificial layer.

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

FIGS. 22A-22C are simplified diagrams illustrating various cross-sectional views of a single crystal acoustic resonator device and of method steps for a transfer process using a sacrificial, layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 2220 of the bond substrate 2210 is physically coupled to the polished support layer 2011. Further, the physical coupling process can include a room temperature bonding process following by a 300 degree Celsius annealing process.

Figure 23C:
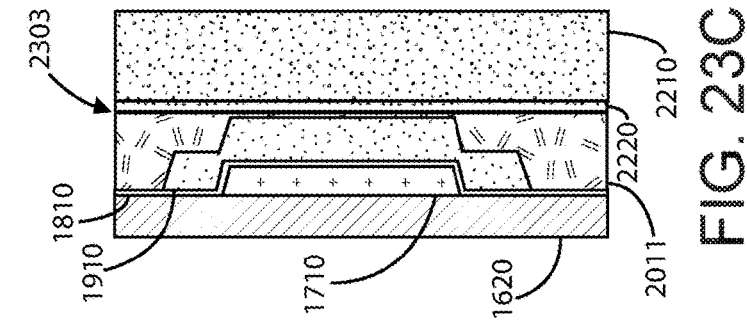
Figure 23A:
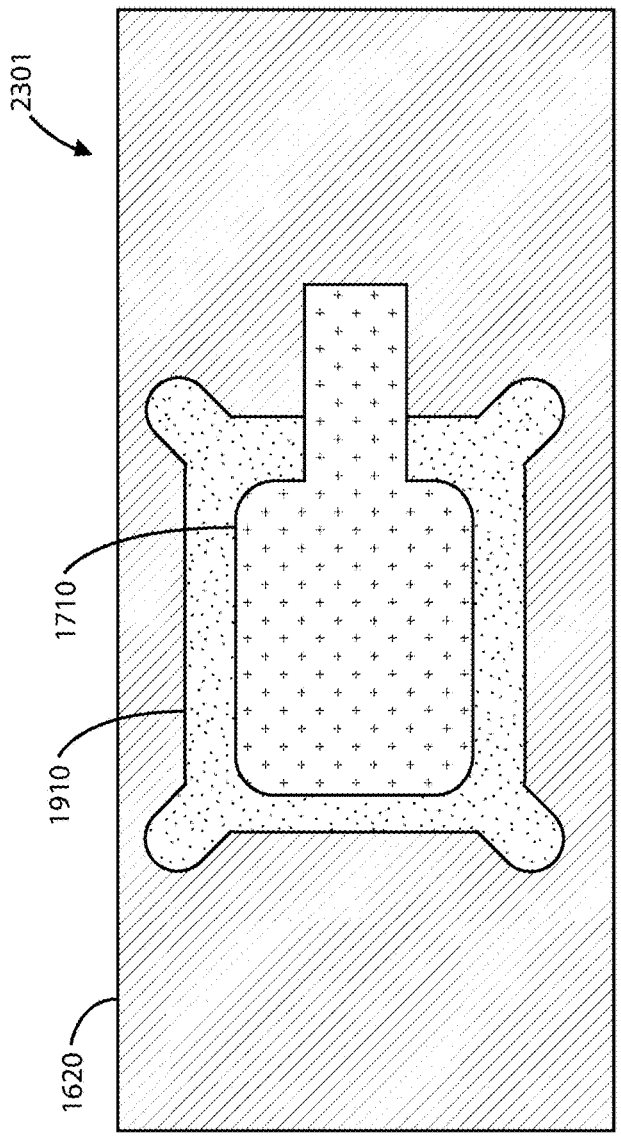
Figure 23B:
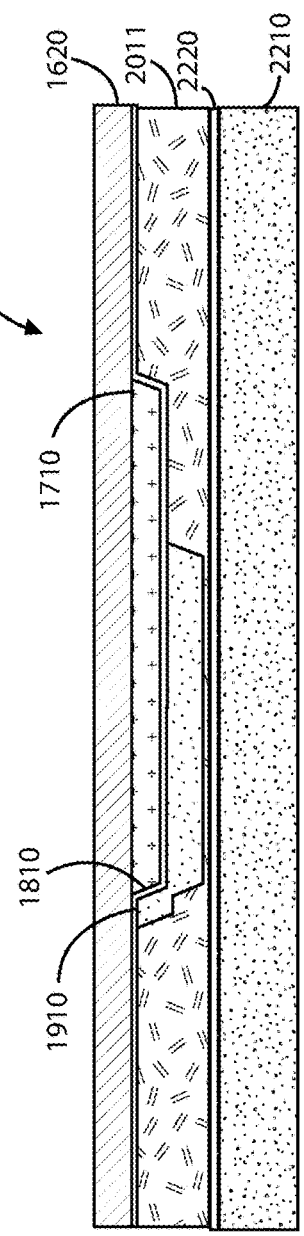

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric film 1620. In an example, the removal process can include a grinding process, a blanket etching process, a film transfer process, an ion implantation transfer process, a laser crack transfer process, or the like and combinations thereof.

Figure 24C:
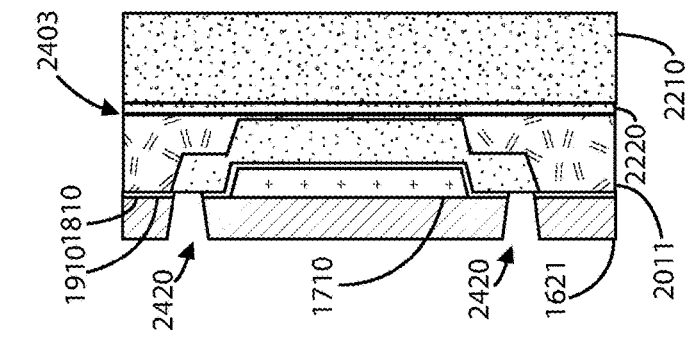
Figure 24A:
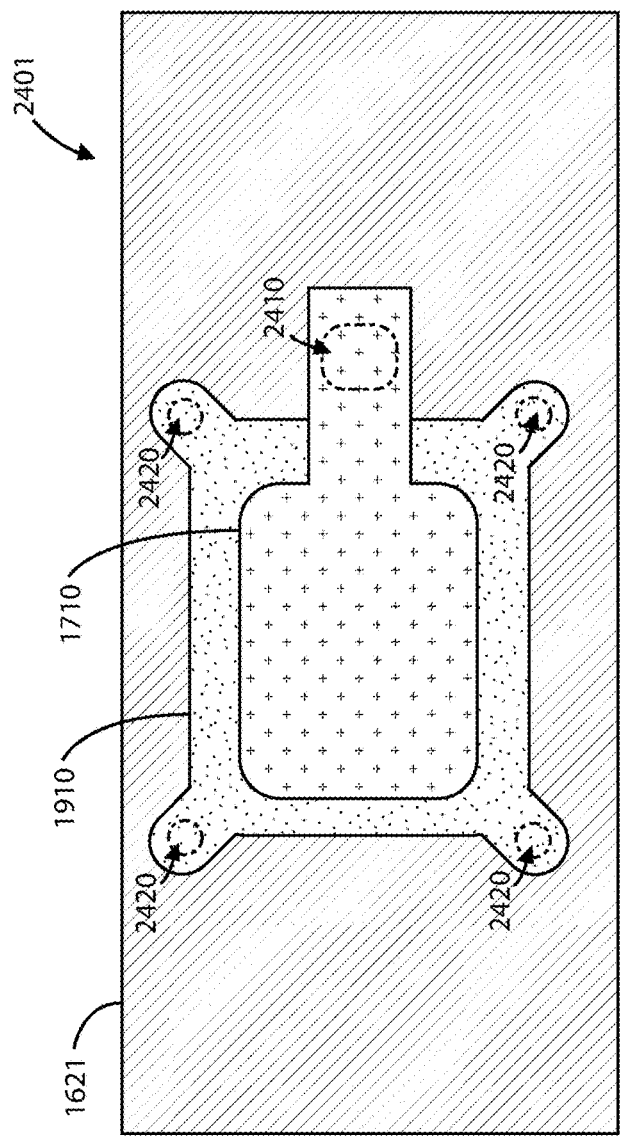
Figure 24B:
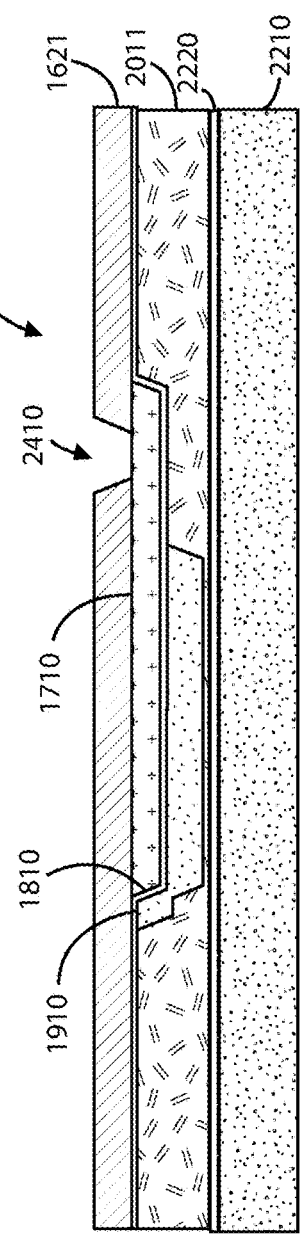

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types, of etching processes.

Figure 25C:
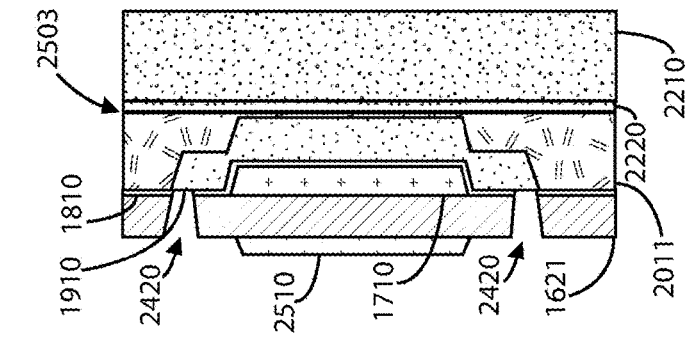
Figure 25A:
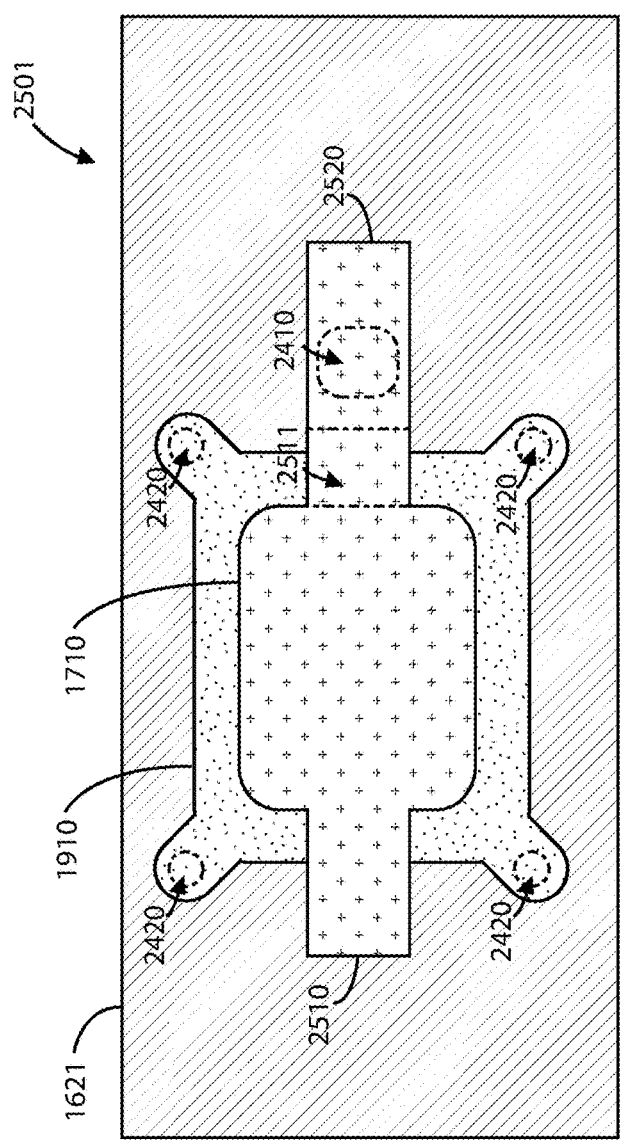
Figure 25B:
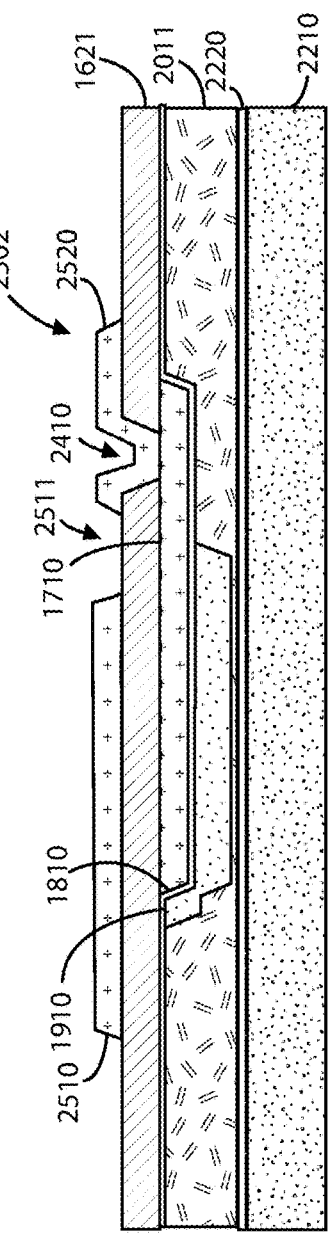

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

FIGS. 26A-26C are simplified diagrams illustrating various cross-sectional, views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide (SiOx), or other like materials. In a specific example, the second passivation layer 2710 can have a thickness ranging from about 50 nm to about 100 nm.

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials and then etching (e.g., dry etch or the like) this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will, recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
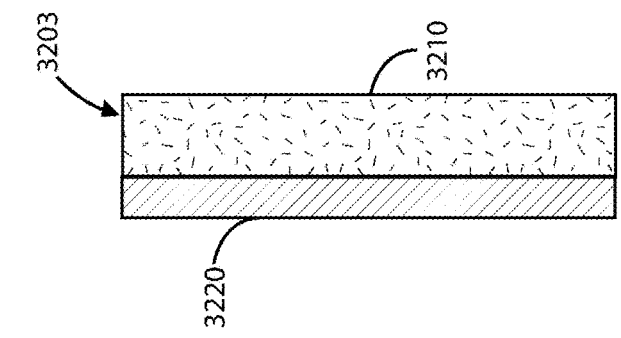
Figure 32A:
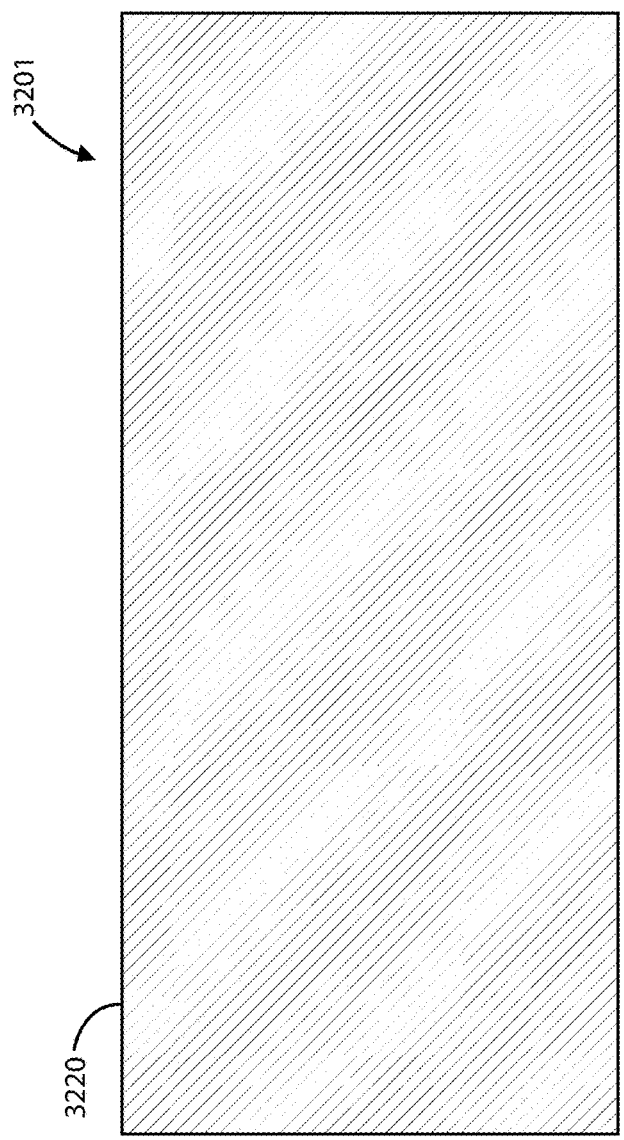
Figure 32B:
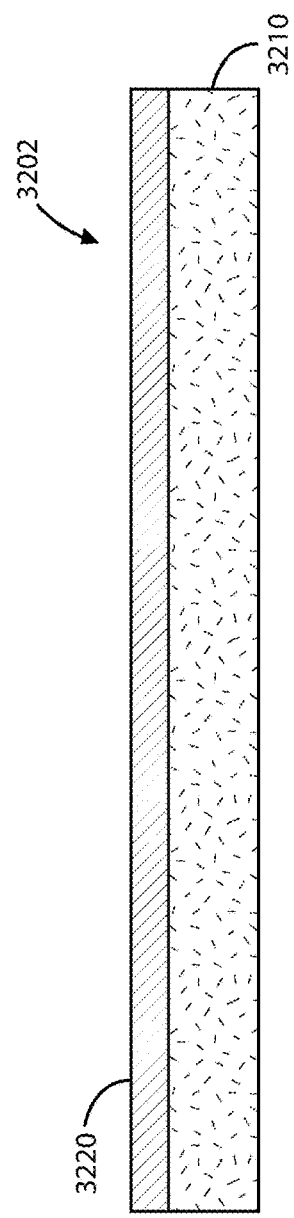

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials. The piezoelectric film 3220 can be an epitaxial film including aluminum nitride (AlN), gallium nitride (GaN), or other like materials. Additionally, this piezoelectric substrate can be subjected to a thickness trim.

Figure 33C:
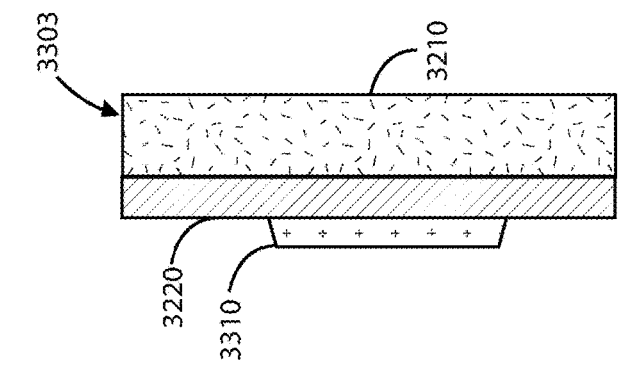
Figure 33A:
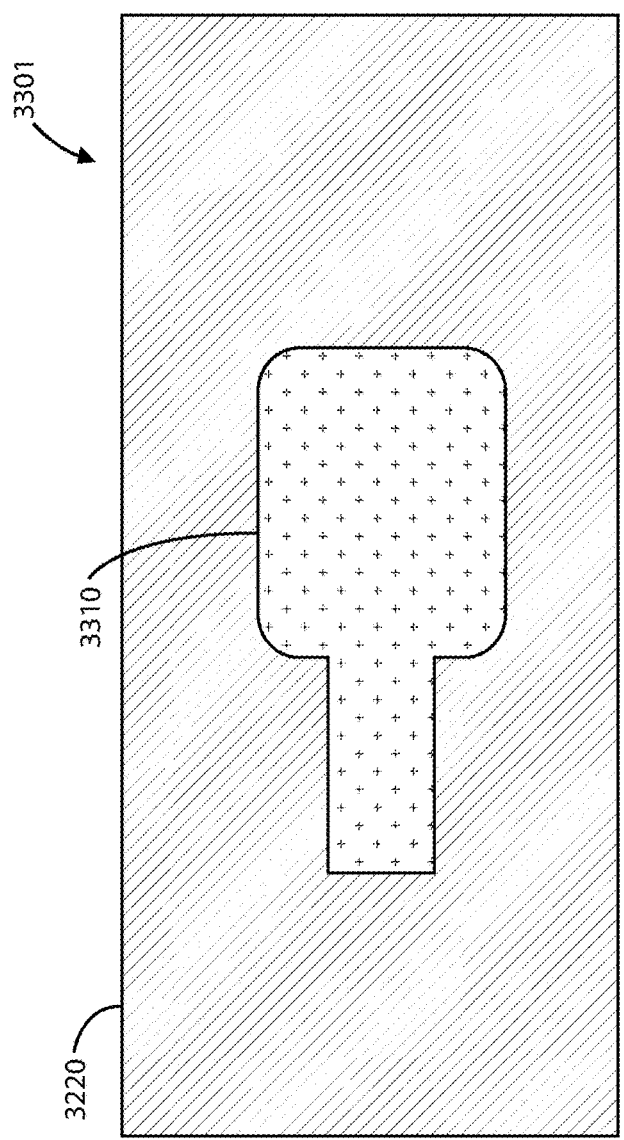
Figure 33B:
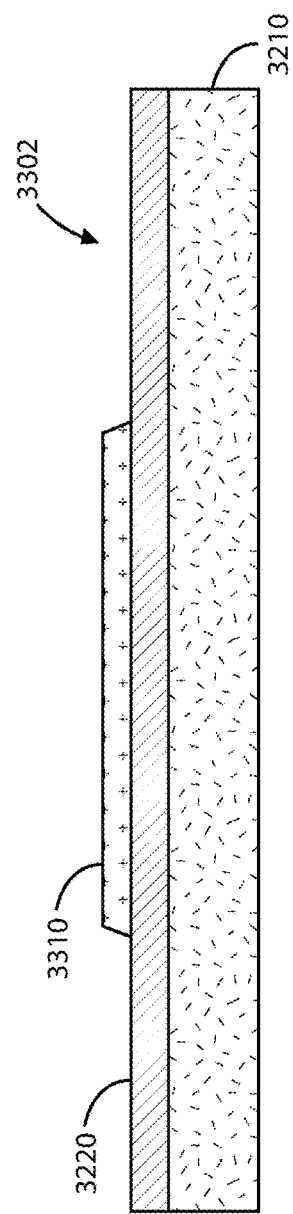

FIGS. 33A-33C are simplified, diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide (SiOx), or other like materials. In a specific example, the first passivation layer 3410 can have a thickness ranging from about 50 nm to about 100 nm.

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide (SiO.sub.2), silicon nitride (SiN), or other like materials. In a specific example, this support layer 3510 can be deposited with a thickness of about 2-3 um. As described above, other support layers (e.g., SiNx) can be used in the case of a PSG sacrificial layer.

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

Figure 37C:
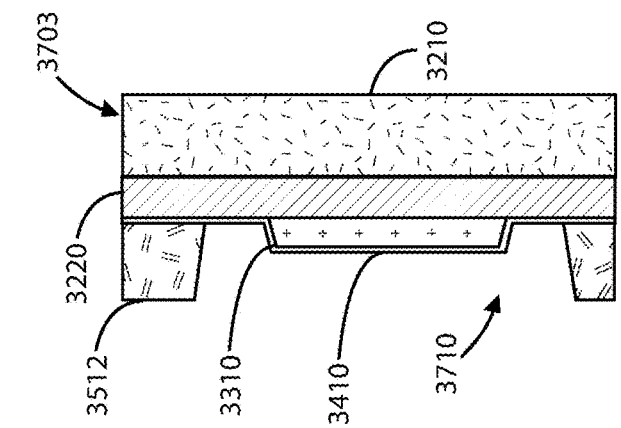
Figure 37A:
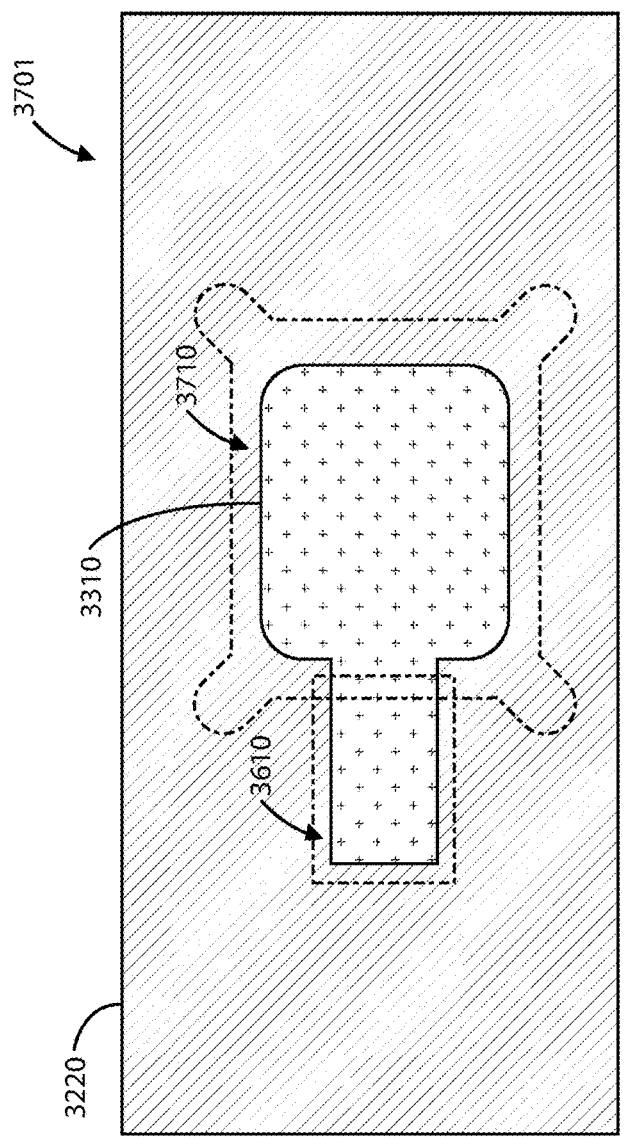
Figure 37B:
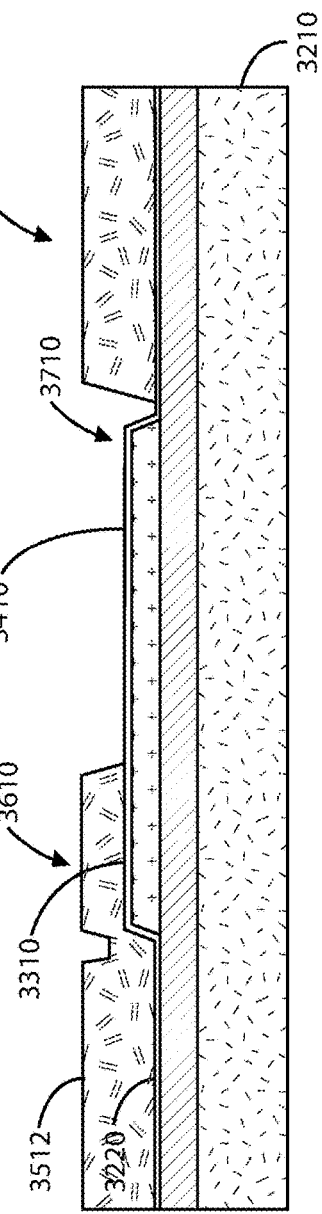

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 (SiO.sub.2 or like material) overlying a substrate having silicon (Si), sapphire (Al.sub.2O.sub.3), silicon dioxide (SiO.sub.2), silicon carbide (SiC), or other like materials. In a specific embodiment, the bonding support layer 3920 of the bond substrate 3910 is physically coupled to the polished support layer 3512. Further, the physical coupling process can include a room temperature bonding process following by a 300 degree Celsius annealing process.

Figure 40C:
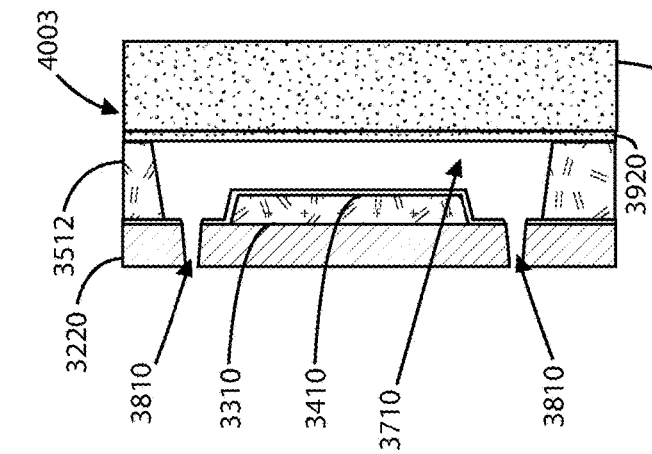
Figure 40A:
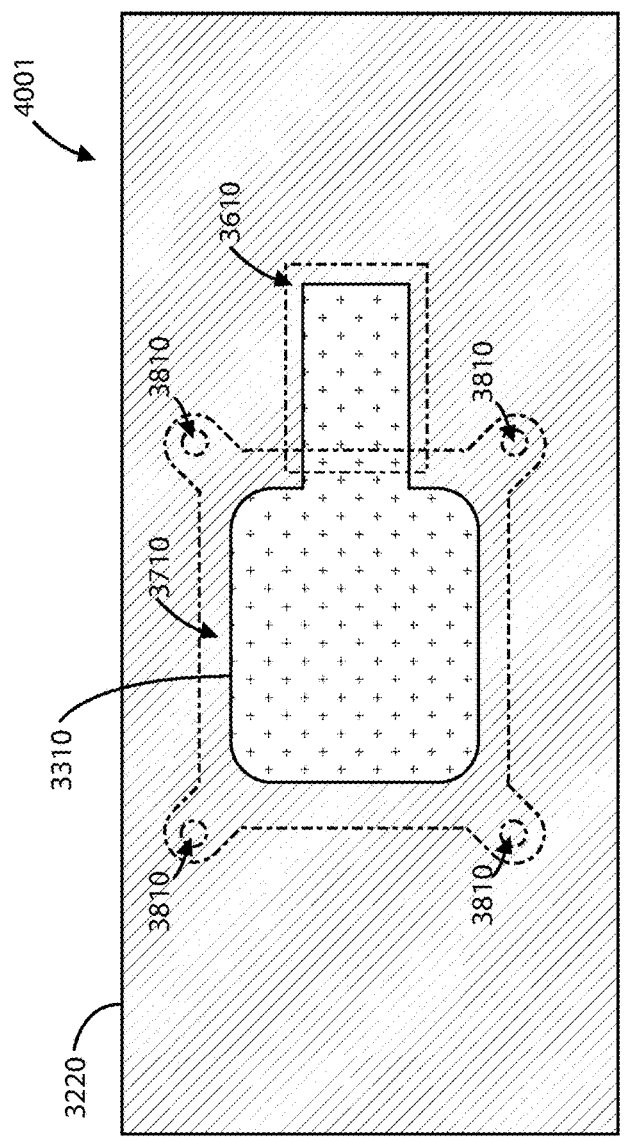
Figure 40B:
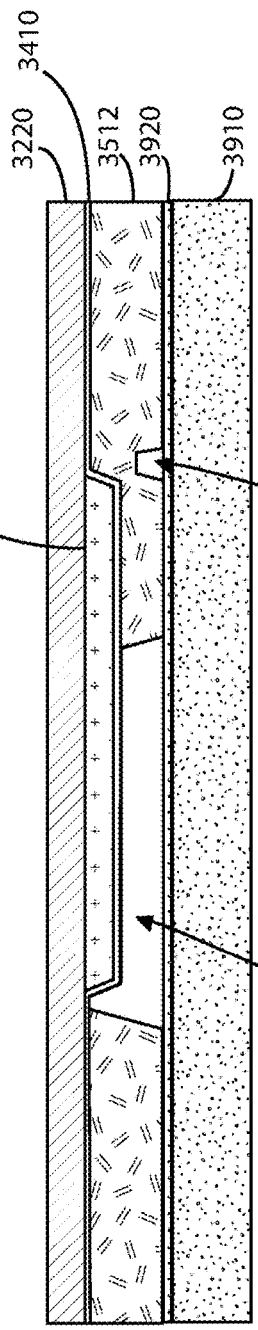

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

Figure 42C:
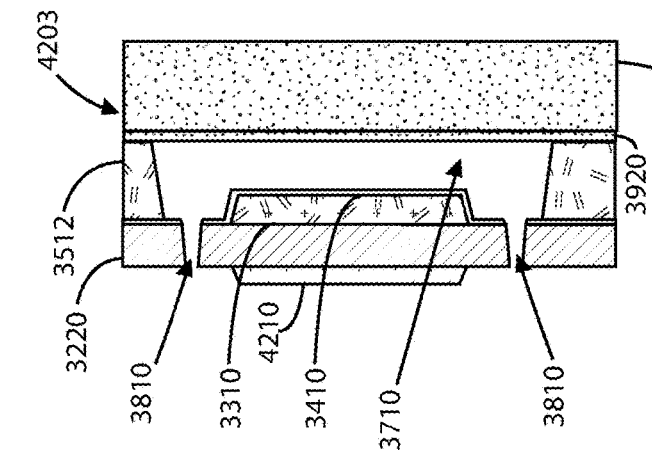
Figure 42A:
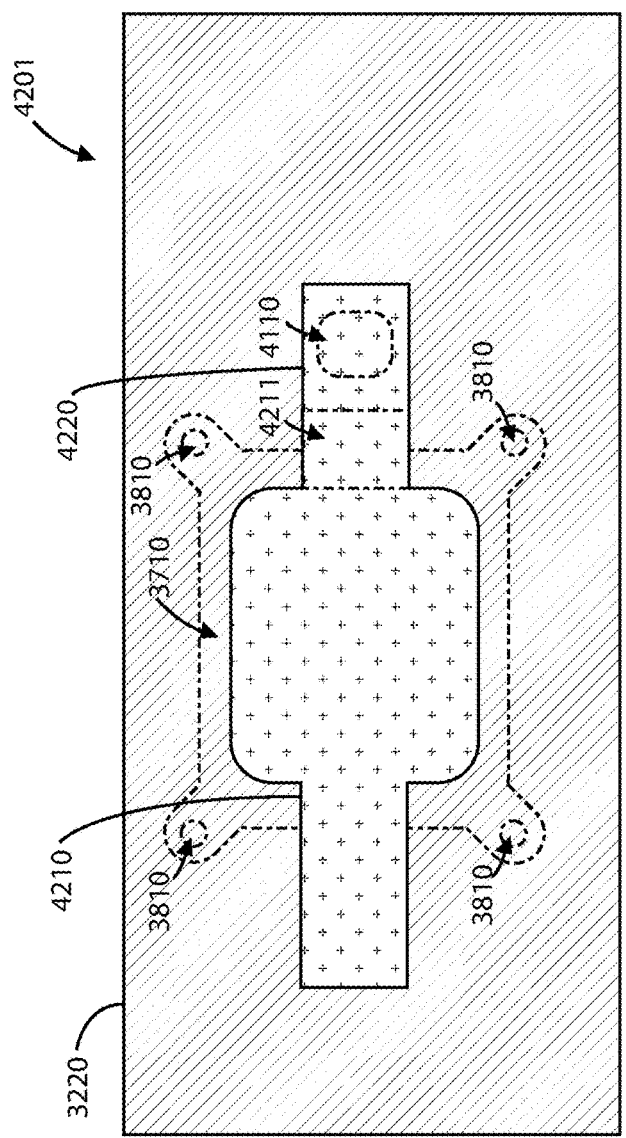
Figure 42B:
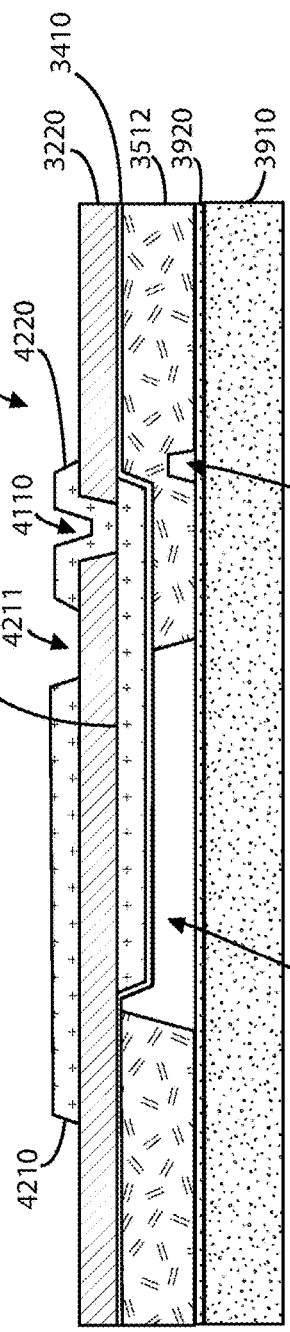

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

Figure 43C:
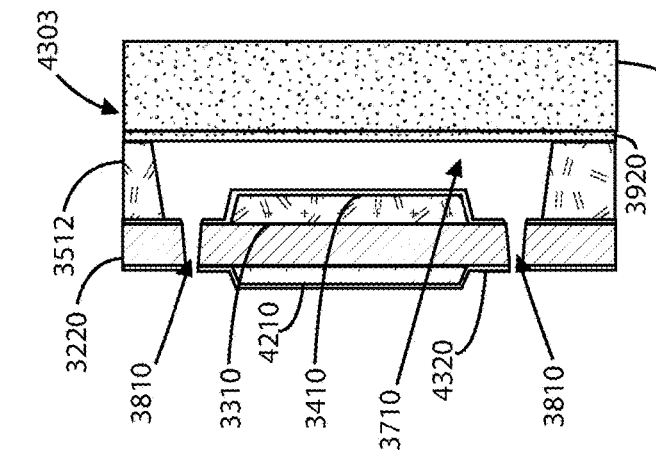
Figure 43A:
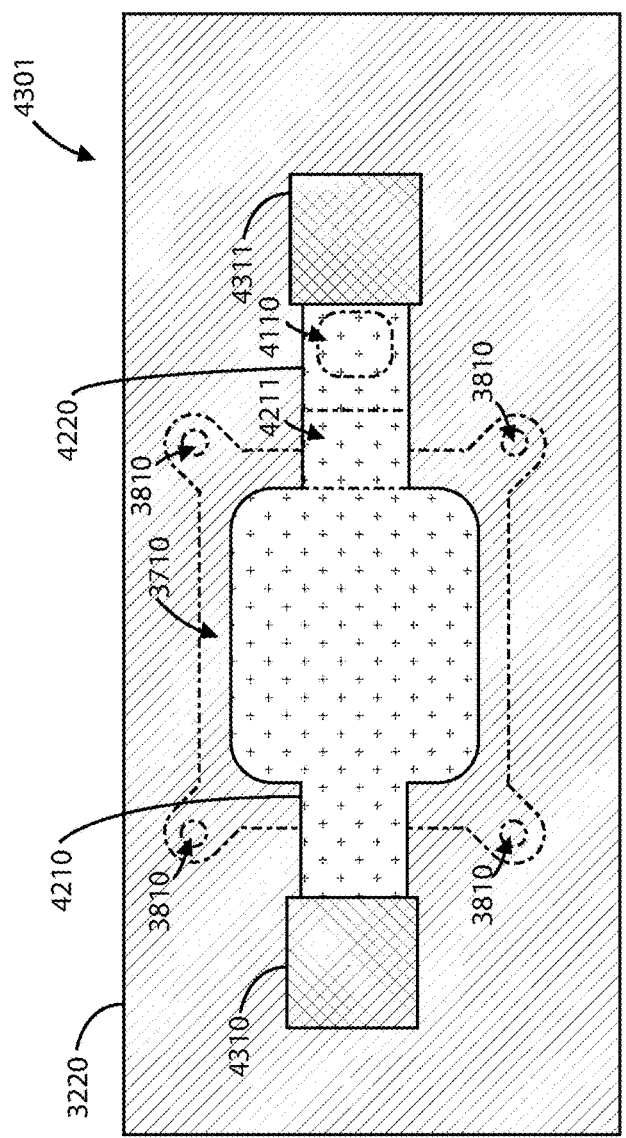
Figure 43B:
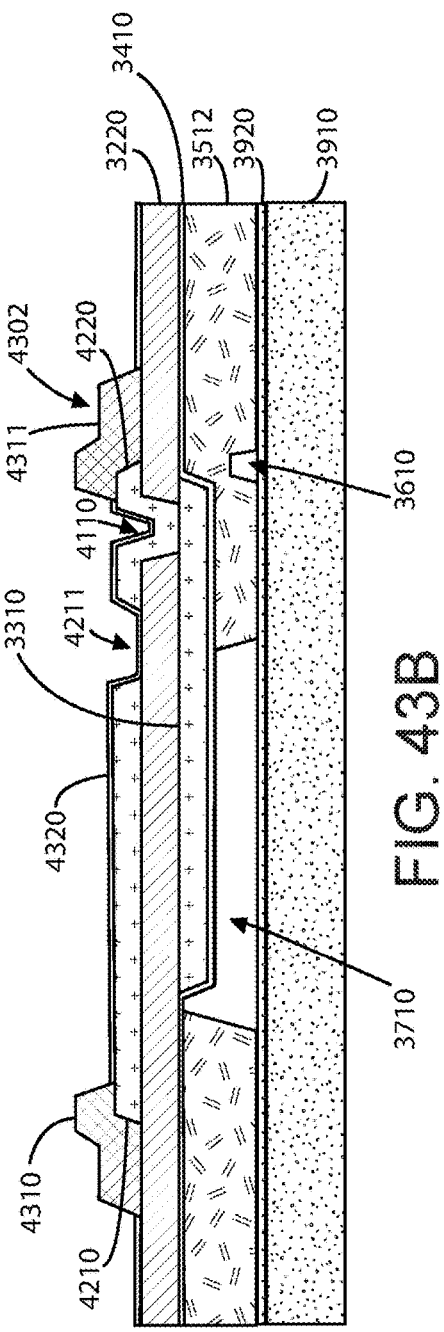

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying, a portion of the second electrode 4210 and a portion of the piezoelectric film 3220 and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide (SiOx), or other like materials. In a specific example, the second passivation layer 4320 can have a thickness ranging from about 50 nm to about 100 nm.

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

Figure 45C:
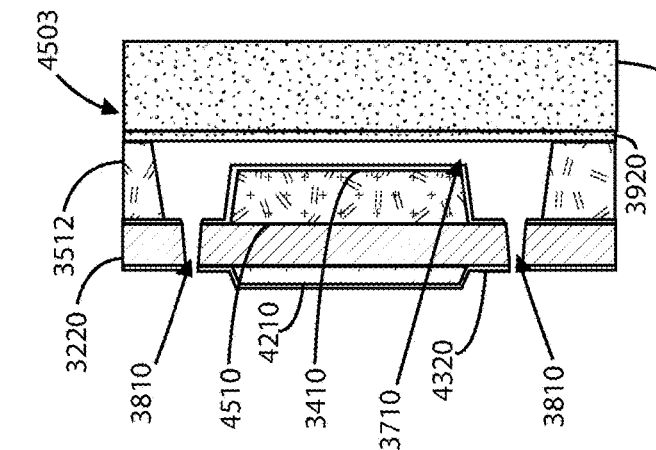
Figure 45A:
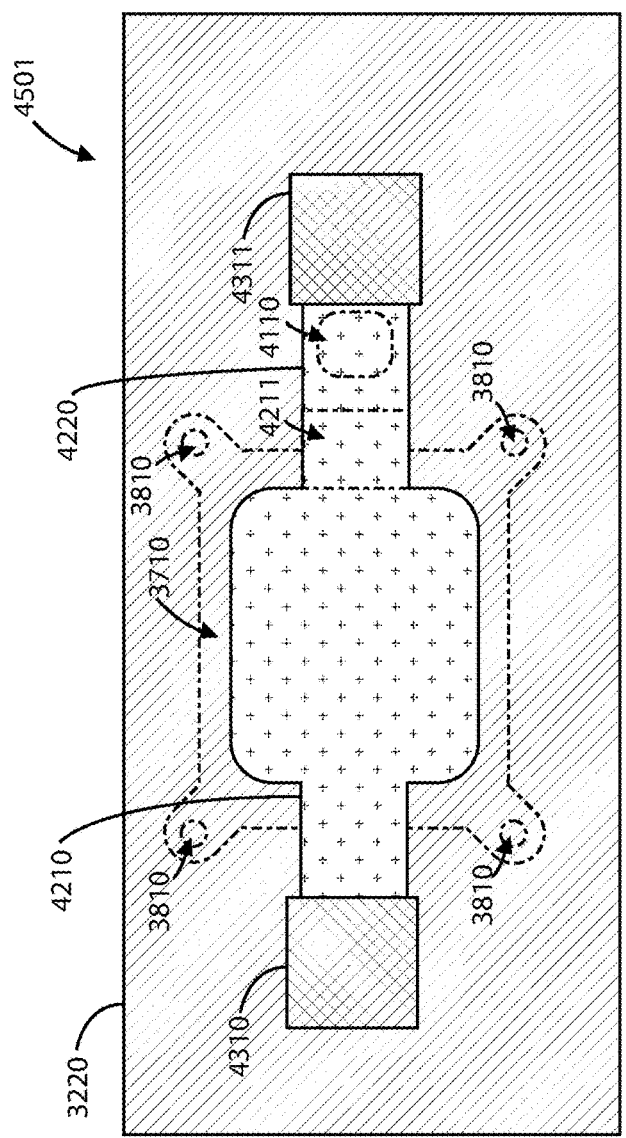
Figure 45B:
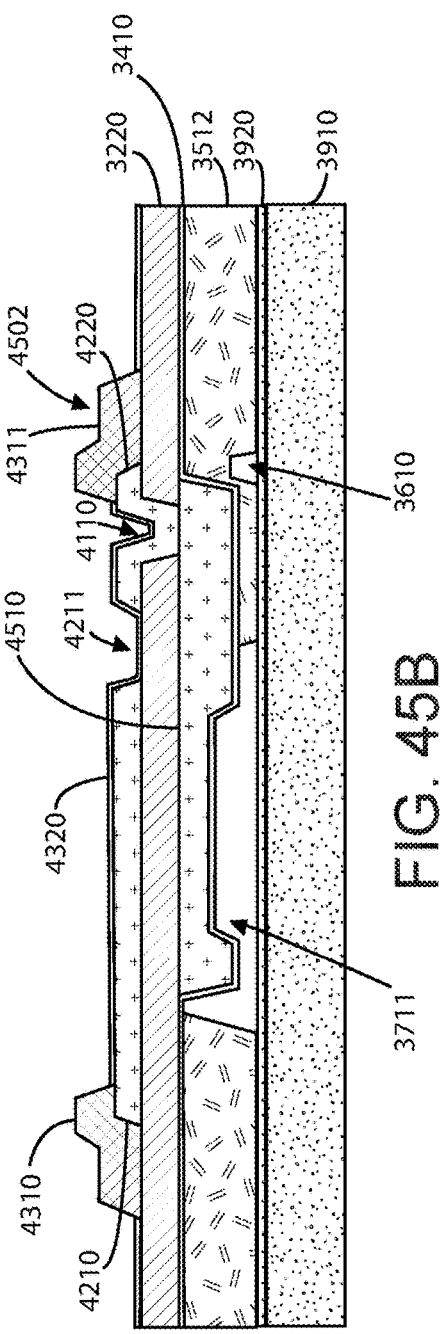

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed, first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps, can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
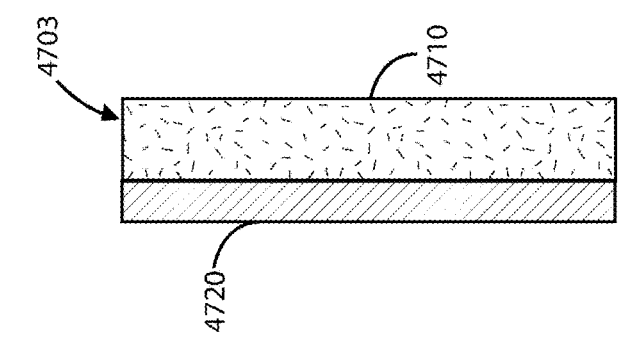
FIGS. 47A-47C though
Figure 47A:
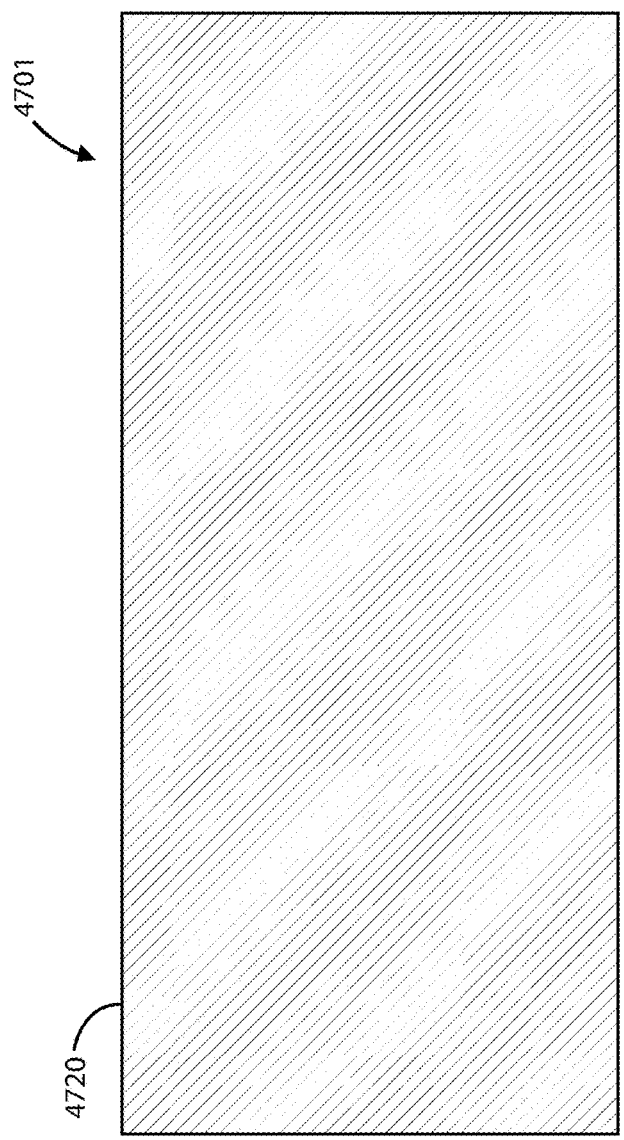
Figure 47B:
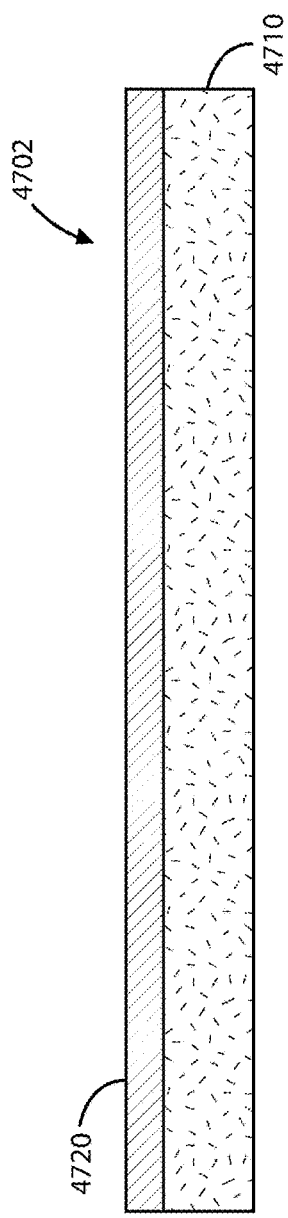

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC) or other like, materials. The piezoelectric film 4720 can be an epitaxial film including aluminum nitride (AlN), gallium nitride (GaN), or other like materials. Additionally, this piezoelectric substrate can be subjected to a thickness trim.

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

Figure 49C:
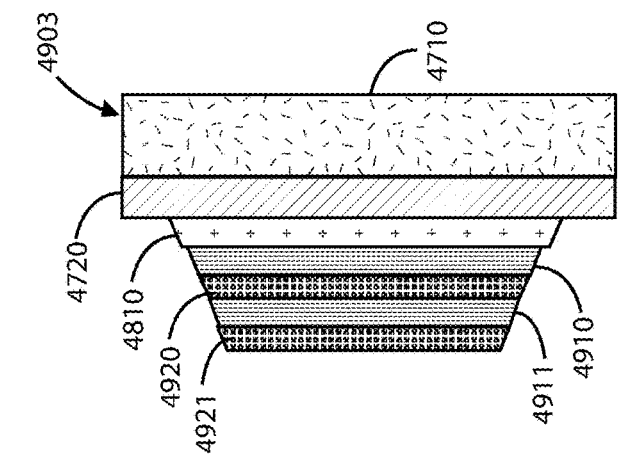
Figure 49A:
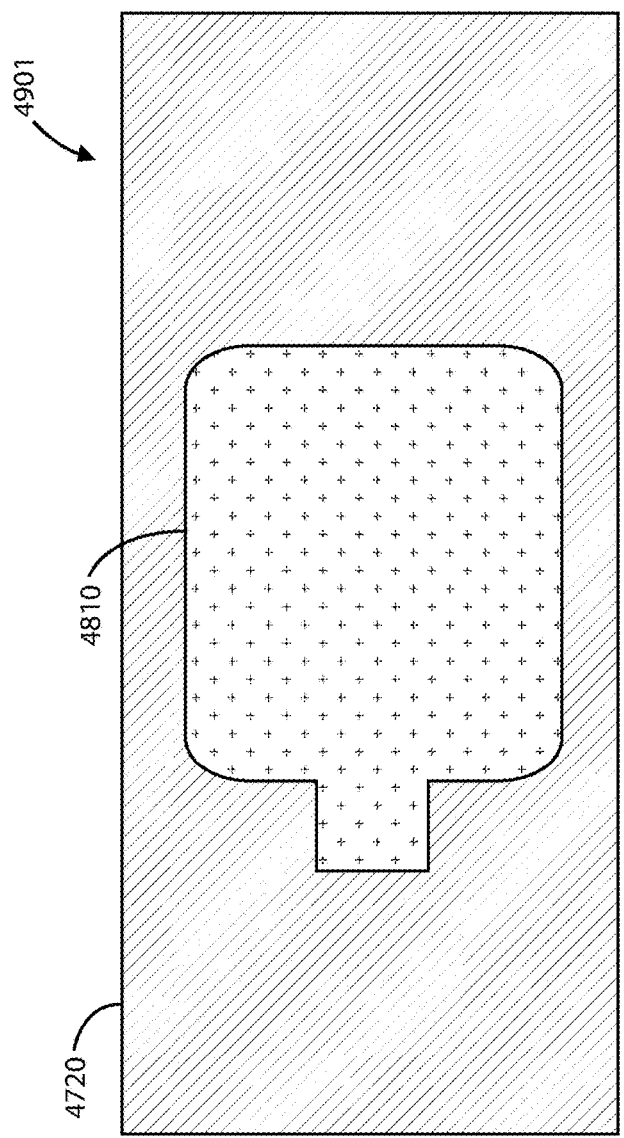
Figure 49B:
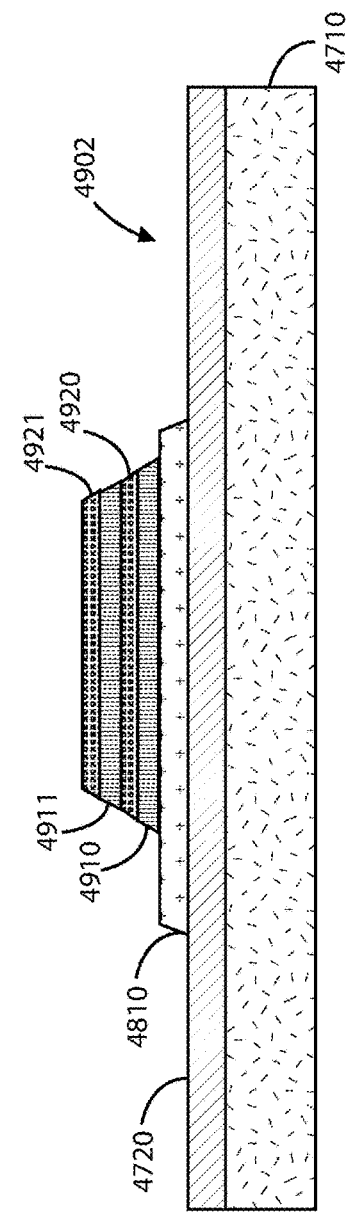

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide (SiO.sub.2), silicon nitride (SiN), or other like materials. In a specific example, this support layer 5010 can be deposited with a thickness of about 2-3 um. As described above, other support layers (e.g., SiNx) can be used.

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support, layer 5010 to form a polished support layer 5011. In an example, the polishing process can include a chemical-mechanical planarization process or the like.

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 (SiO.sub.2 or like material) overlying a substrate having silicon (Si), sapphire (Al.sub.2O.sub.3) silicon dioxide (SiO.sub.2), silicons carbide (SiC), or other like materials. In a specific embodiment, the bonding support layer 5220 of the bond substrate 5210 is physically coupled to the polished support layer 5011. Further, the physical coupling process can include a room temperature bonding process following by a 300 degree Celsius annealing process.

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric film 4720. In an example, the removal process can include a grinding process, a blanket etching process, a film transfer process, an ion implantation transfer process, a laser crack transfer process, or the like and combinations thereof.

Figure 54C:
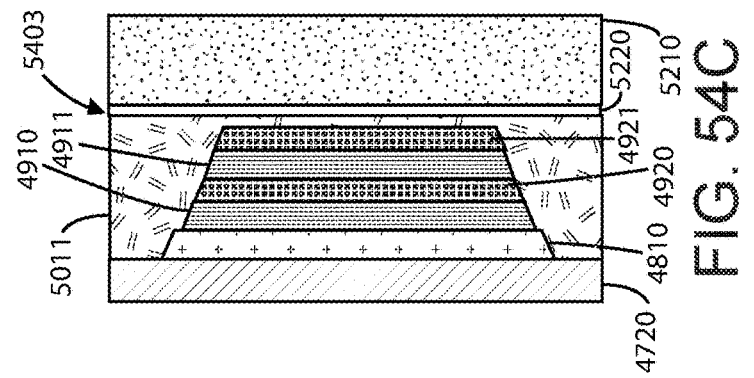
Figure 54A:
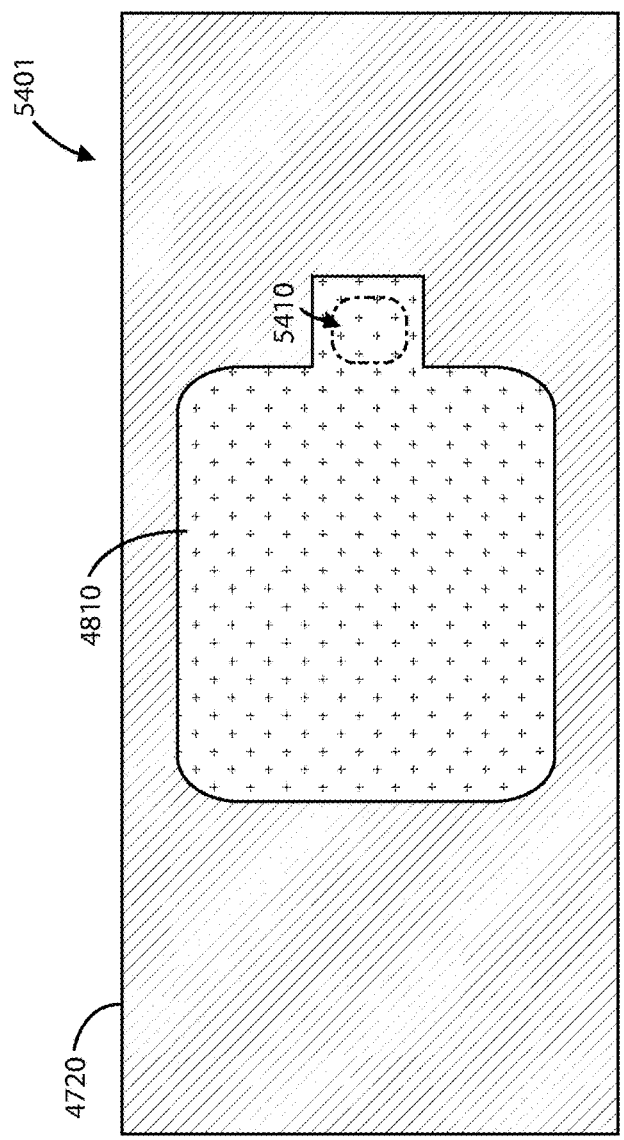
Figure 54B:
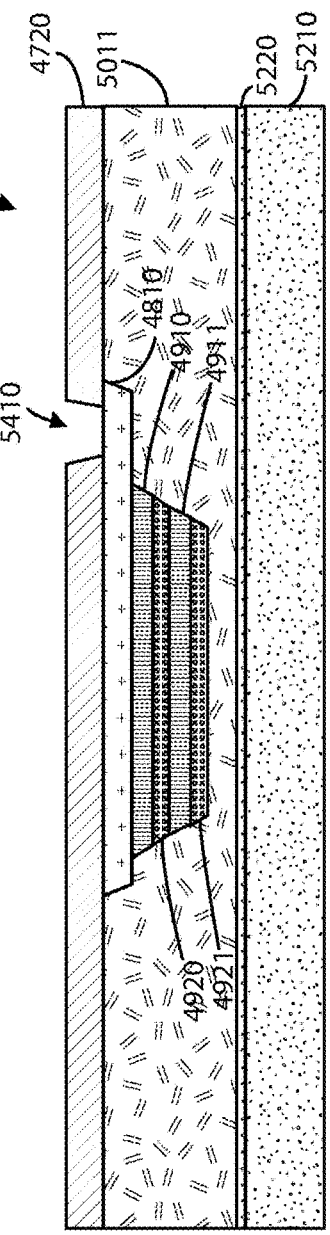

FIGS. 54A-54C am simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching, processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

Figure 56C:
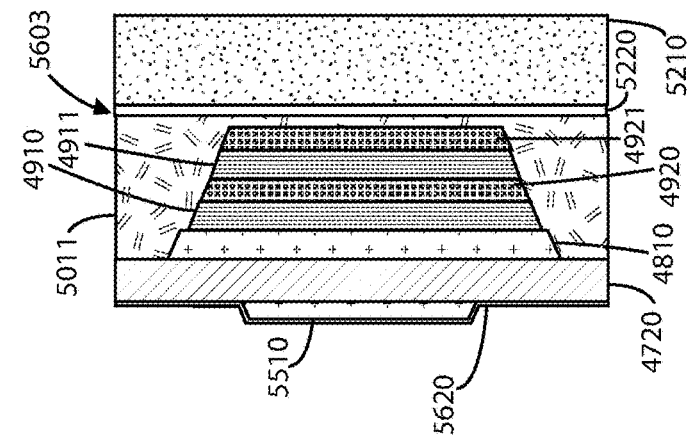
Figure 56A:
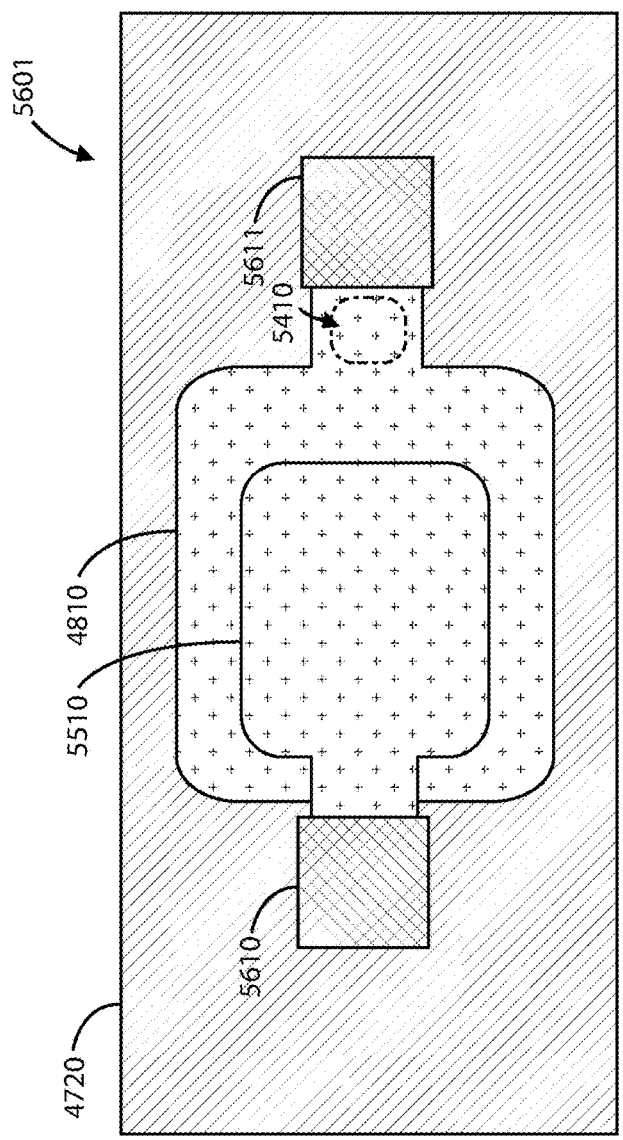
Figure 56B:
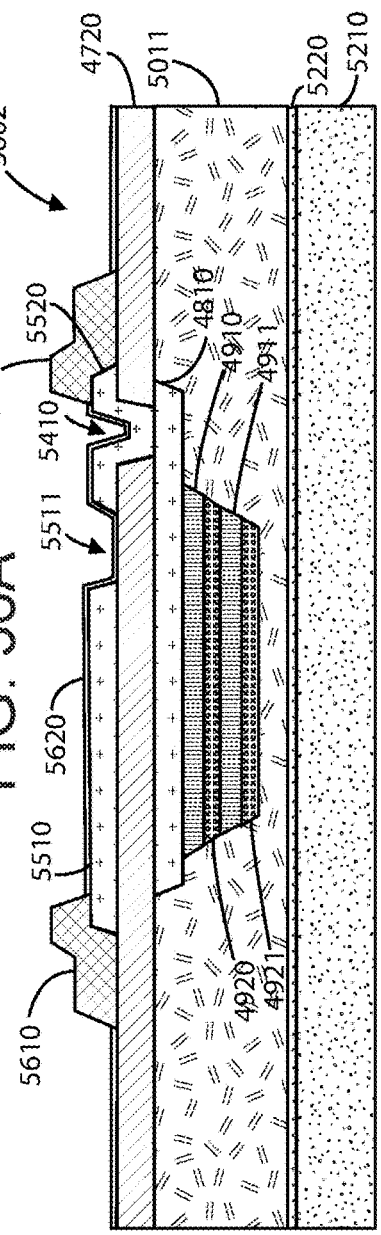

FIGS. 56A-56C are simplified diagrams illustrating various cross-sectional views of a single crystal acoustic resonator device and of method steps for a transfer process with a multilayer mirror for single crystal, acoustic resonator devices, according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal. 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), oxide (SiOx), or other like materials. In a specific example, the second passivation layer 5620 can have a thickness ranging from about 50 nm to about 100 nm.

FIGS. 57A-57C are simplified diagrams illustrating various cross-sectional views of a single crystal acoustic resonator device and of method steps for a transfer process with, a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second, electrode 5710 and top metal 5720. In an example, the processing of these two components includes depositing molybdenum (Mo), ruthenium (Ru), tungsten (W), or other like materials; and then etching dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

Figure 58C:
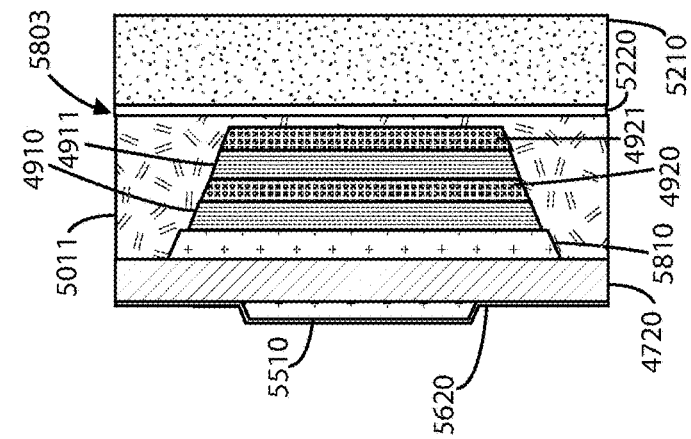
Figure 58A:
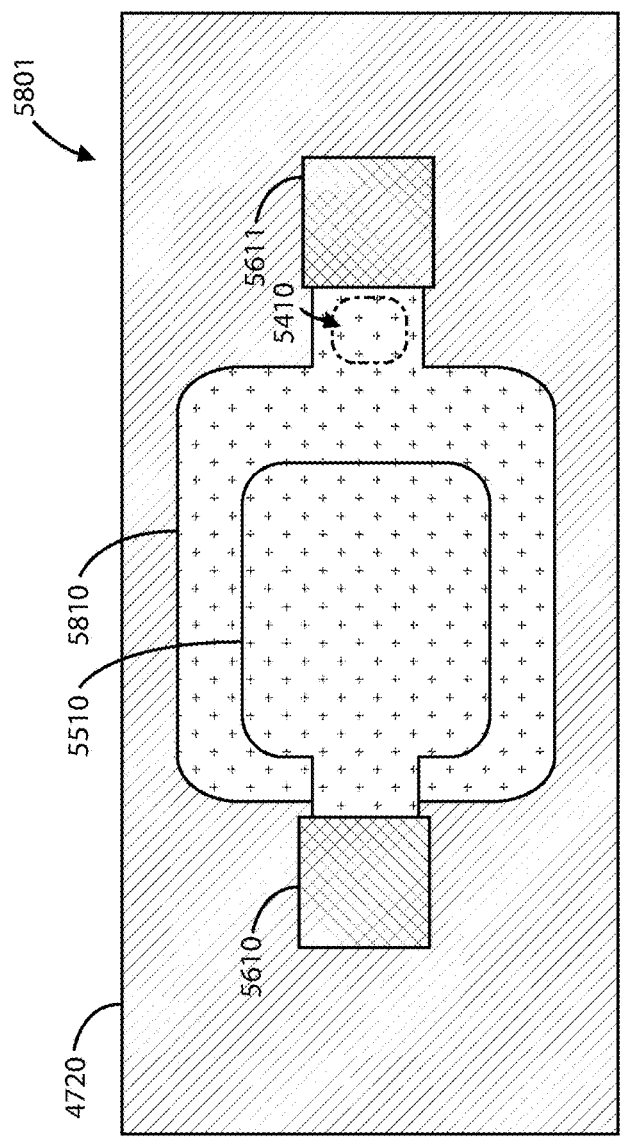
Figure 58B:
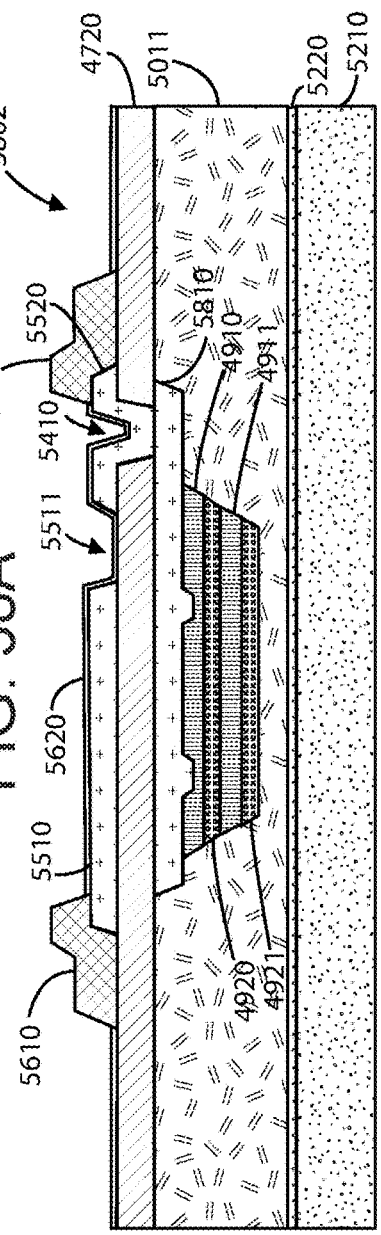

FIGS. 58A-58C are simplified diagrams illustrating various cross-sectional views of a single crystal acoustic resonator device and of method steps, for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown these figures illustrate the method step of processing the first electrode 4810, to form a processed first, electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance, frequency in, which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during the growth substrate removal process. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed:

1. A piezoelectric film comprising:
   an aluminum nitride material doped with a first element E1 selected from group II, a second element E2 selected from group IVB, and a third element E3 selected from a group consisting of Si, Ga, and In to provide the aluminum nitride material with a doped concentration of E1 and E2 in a range between about 1 atom % and about 30 atom % and a doped concentration of E3 of about 20 atom %,
   wherein a number of atoms of E1 plus a number of atoms of E2 plus a number of atoms of aluminum plus a number of atoms of E3 is 100%, and
   wherein the aluminum nitride material has a crystallinity of less than about 1.5 degrees Full Width Half Maximum (FWHM) by x-ray diffraction.

2. The piezoelectric film of claim 1 further comprising:
   a silicon substrate underlying the aluminum nitride material.

3. The piezoelectric film of claim 2 wherein the aluminum nitride material is directly on the silicon substrate.

4. The piezoelectric film of claim 1 wherein the aluminum nitride material has a crystallinity of less than about 1.0 degree at Full Width Half Maximum (FWHM) to about 10 arcseconds at FWHM measured using X-ray diffraction (XRD).

5. The piezoelectric film of claim 1 wherein the aluminum nitride material has a crystallinity in a range between about 1.0 degree at Full Width Half Maximum (FWHM) to about 0.5 degrees at FWHM measured using XRD.

6. A semiconductor film comprising:
   a group III nitride material doped with a first element E1 selected from the group consisting of Mg and Zn, a second element E2 selected from the group consisting of Hf, Zr, and Ti, and a third element E3 comprising Ga to provide a doped concentration of E1 and E2 in a range between about 1E15 atoms/cm3 and about 1E21 atoms/cm3,
   wherein a number of atoms of E3 plus a number of atoms of aluminum in the group III nitride material is 100%, and
   wherein the group III nitride material has a crystallinity of less than about 1.5 degrees Full Width Half Maximum (FWHM) by x-ray diffraction.

7. The semiconductor film of claim 6 further comprising:
a silicon substrate underlying the group III nitride material.

8. The semiconductor film of claim 7 wherein the group III nitride material is directly on a substrate.

9. The semiconductor film of claim 8 wherein the substrate comprises Si, SiC, or $Al_2O_3$.

10. A piezoelectric film comprising:
an aluminum nitride material doped with a first element E1 selected from group II and doped with a second element E2 selected from group IVB to provide the aluminum nitride material according to $(E1E2)_x Al_{1-x}N$ where $0.0001<x<0.5$,
wherein the aluminum nitride material has a doping concentration of E1 and E2 in a range between about 1E15 atoms/cm3 and about 1E21 atoms/cm3, and
wherein the aluminum nitride material has a crystallinity of less than about 1.5 degrees Full Width Half Maximum (FWHM) by x-ray diffraction.

11. The piezoelectric film of claim 10 wherein the first element E1 comprises Mg and the second element E2 comprises Ti, Zr, or Hf.

12. The piezoelectric film of claim 10 further comprising:
a AlGaN cap structure overlying the aluminum nitride material, the AlGaN cap structure comprising $Al_{0.2}Ga_{0.8}N$.

13. The piezoelectric film of claim 10, wherein the aluminum nitride material comprises $Hf_{0.02}Mg_{0.02}Al_{0.96}N$.

14. The piezoelectric film of claim 10, wherein forming the aluminum nitride material comprises alternating introduction of a first precursor of E1 and introduction of a second precursor of E2 into a reaction chamber that contains a wafer during first and second time intervals, respectively.

* * * * *